United States Patent
Eguchi et al.

(10) Patent No.: US 9,972,713 B2
(45) Date of Patent: May 15, 2018

(54) SEMICONDUCTOR DEVICE AND METHOD OF MANUFACTURING SAME

(71) Applicant: Renesas Electronics Corporation, Kanagawa (JP)

(72) Inventors: Satoshi Eguchi, Kanagawa (JP); Tetsuya Iida, Kanagawa (JP); Akio Ichimura, Kanagawa (JP); Yuya Abiko, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 14/705,057

(22) Filed: May 6, 2015

(65) Prior Publication Data
US 2015/0333118 A1 Nov. 19, 2015

(30) Foreign Application Priority Data

May 19, 2014 (JP) .................................. 2014-103471

(51) Int. Cl.
*H01L 29/78* (2006.01)
*H01L 29/06* (2006.01)
(Continued)

(52) U.S. Cl.
CPC ........ *H01L 29/7811* (2013.01); *H01L 21/265* (2013.01); *H01L 29/0634* (2013.01);
(Continued)

(58) Field of Classification Search
CPC ............. H01L 29/0611; H01L 29/0634; H01L 29/0623; H01L 29/063
See application file for complete search history.

(56) References Cited

U.S. PATENT DOCUMENTS 6,611,021 B1 * 8/2003 Onishi ................ H01L 29/0634
257/213
6,674,126 B2 1/2004 Iwamoto et al.
(Continued)

FOREIGN PATENT DOCUMENTS

JP 2001-298190 A 10/2001
JP 2001-298191 A 10/2001
(Continued)

OTHER PUBLICATIONS

Japanese Office Action received in corresponding Japanese Application No. 2014-103471 dated Aug. 8, 2017.

*Primary Examiner* — Yu Chen
*Assistant Examiner* — Vincent Wall
(74) *Attorney, Agent, or Firm* — Mattingly & Malur, PC

(57) ABSTRACT

To provide a semiconductor device including a power semiconductor element having improved reliability. The semiconductor device has a cell region and a peripheral region formed outside the cell region. The n type impurity concentration of n type column regions in the cell region is made higher than that of n type column regions comprised of an epitaxial layer in the peripheral region. Further, a charge balance is kept in each of the cell region and the peripheral region and each total electric charge is set so that a total electric charge of first p type column regions and a total electric charge of n type column regions in the cell region become larger than a total electric charge of third p type column regions and n type column regions comprised of an epitaxial layer in the peripheral region, respectively.

13 Claims, 36 Drawing Sheets

(51) Int. Cl.
  *H01L 21/265* (2006.01)
  *H01L 29/66* (2006.01)
  *H01L 29/40* (2006.01)
  *H01L 29/10* (2006.01)
  *H01L 29/423* (2006.01)

(52) U.S. Cl.
  CPC ........ *H01L 29/1095* (2013.01); *H01L 29/404* (2013.01); *H01L 29/66477* (2013.01); *H01L 29/66712* (2013.01); *H01L 29/0638* (2013.01); *H01L 29/42372* (2013.01)

(56) References Cited

U.S. PATENT DOCUMENTS

| | | | |
|---|---|---|---|
| 6,724,042 B2 | 4/2004 | Onishi et al. | |
| 6,888,195 B2 | 5/2005 | Saito et al. | |
| 6,903,418 B2* | 6/2005 | Iwamoto | H01L 29/7802 257/339 |
| 7,262,459 B2 | 8/2007 | Takahashi et al. | |
| 7,301,203 B2* | 11/2007 | Lee | H01L 29/7802 257/339 |
| 7,576,393 B2* | 8/2009 | Ono | H01L 29/0634 257/135 |
| 7,759,732 B2 | 7/2010 | Saito et al. | |
| 8,716,811 B2* | 5/2014 | Mori | H01L 29/1095 257/328 |
| 8,928,077 B2 | 1/2015 | Lee et al. | |
| 9,142,664 B2* | 9/2015 | Onishi | H01L 29/7811 |
| 2005/0280086 A1* | 12/2005 | Saito | H01L 29/0634 257/341 |
| 2006/0194391 A1* | 8/2006 | Saggio | H01L 29/0634 438/268 |
| 2007/0181927 A1* | 8/2007 | Yedinak | H01L 29/0634 257/302 |
| 2008/0135926 A1* | 6/2008 | Ono | H01L 29/0615 257/328 |
| 2008/0246079 A1* | 10/2008 | Saito | H01L 29/0634 257/328 |
| 2011/0278650 A1* | 11/2011 | Tamaki | H01L 29/0634 257/288 |
| 2012/0098064 A1* | 4/2012 | Onishi | H01L 29/0619 257/341 |
| 2012/0276701 A1* | 11/2012 | Yedinak | H01L 29/872 438/270 |
| 2013/0026560 A1* | 1/2013 | Onishi | H01L 29/0634 257/329 |
| 2013/0200499 A1* | 8/2013 | Liaw | H01L 29/0688 257/618 |
| 2014/0374819 A1* | 12/2014 | Niimura | H01L 29/7827 257/329 |
| 2016/0225847 A1* | 8/2016 | Sakata | H01L 29/0634 |
| 2017/0271442 A1* | 9/2017 | Uehara | H01L 29/0634 |

FOREIGN PATENT DOCUMENTS

| | | |
|---|---|---|
| JP | 2004-72068 A | 3/2004 |
| JP | 2004-119611 A | 4/2004 |
| JP | 2005-260199 A | 9/2005 |
| JP | 2007-266505 A | 10/2007 |
| JP | 2010-541212 A | 12/2010 |

* cited by examiner

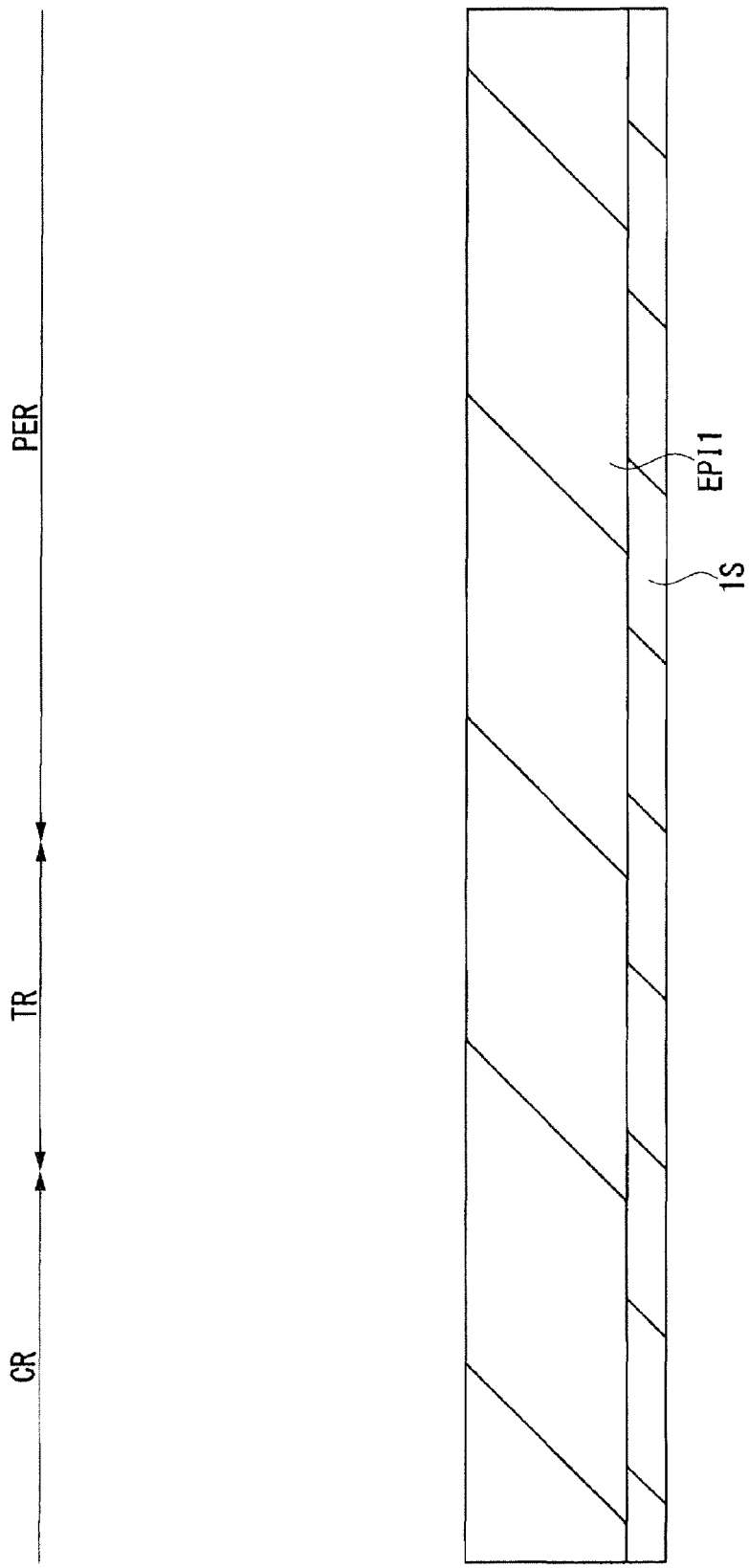

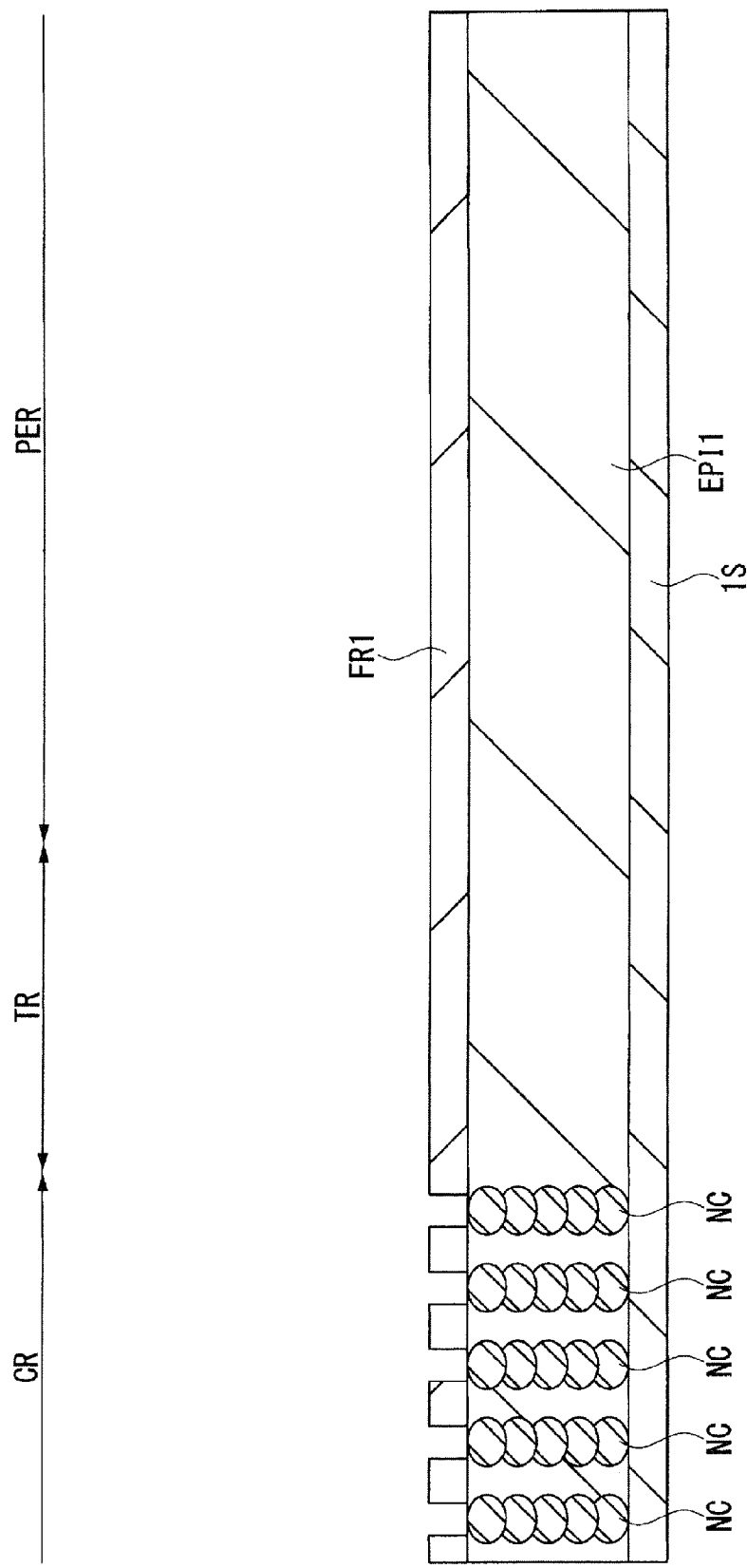

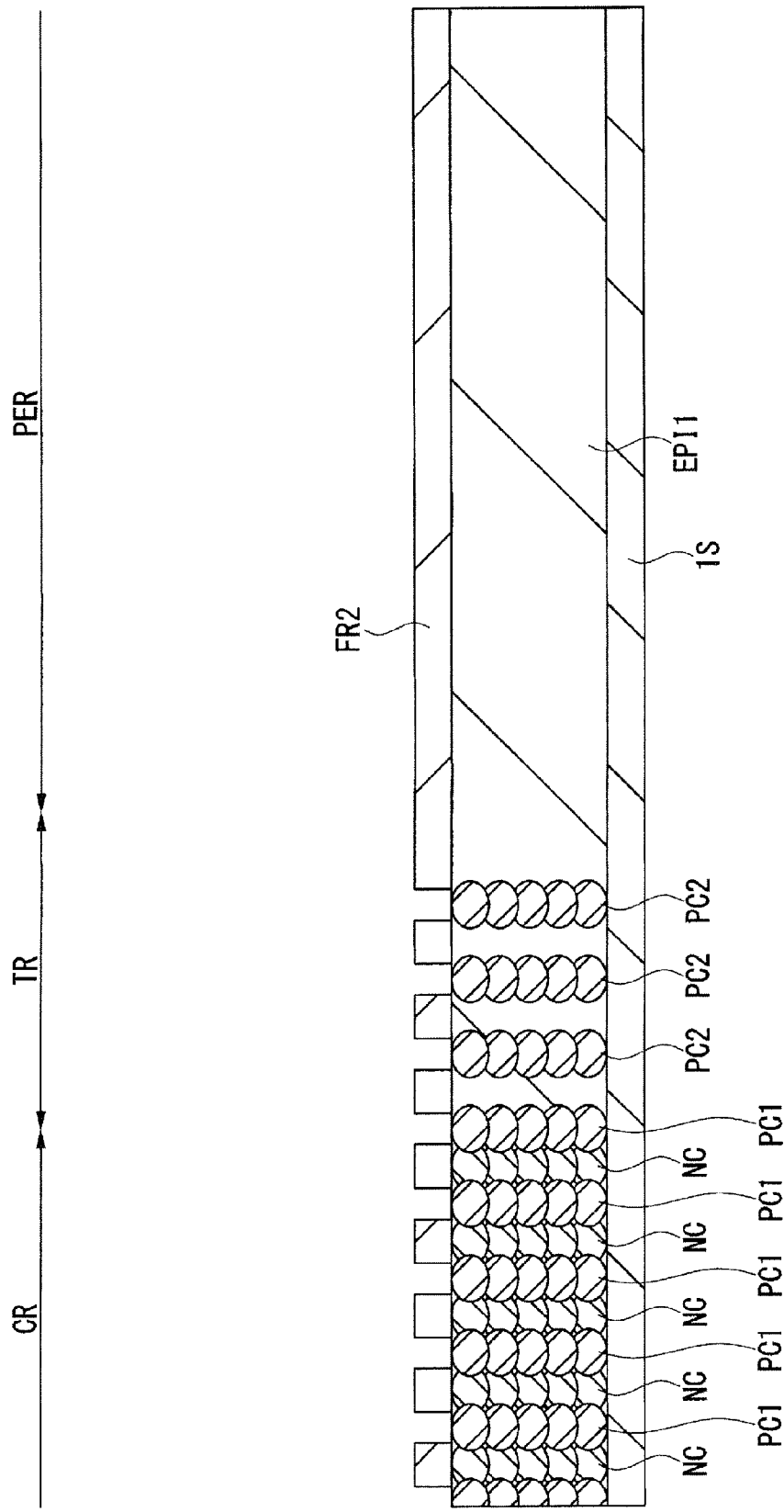

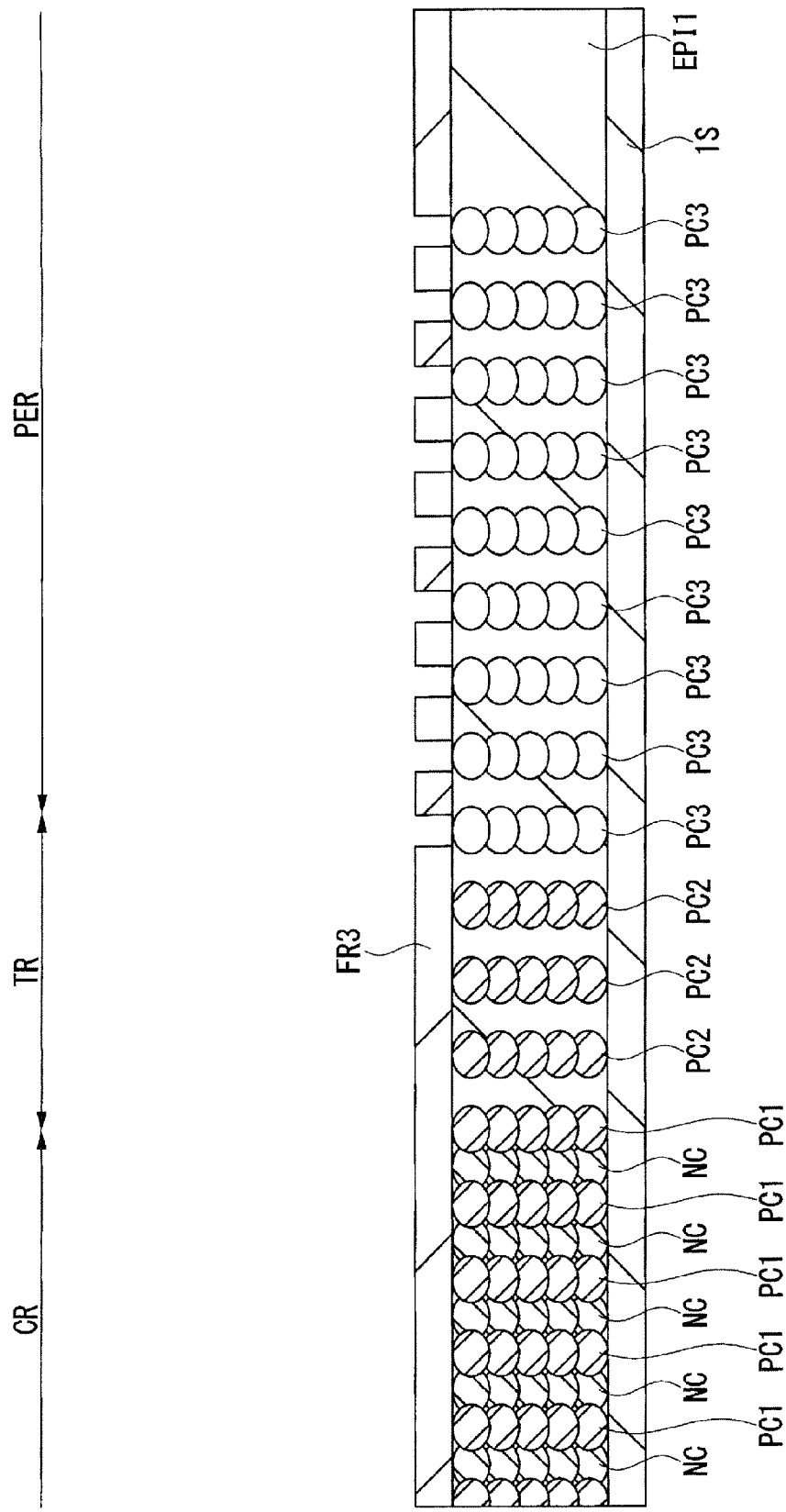

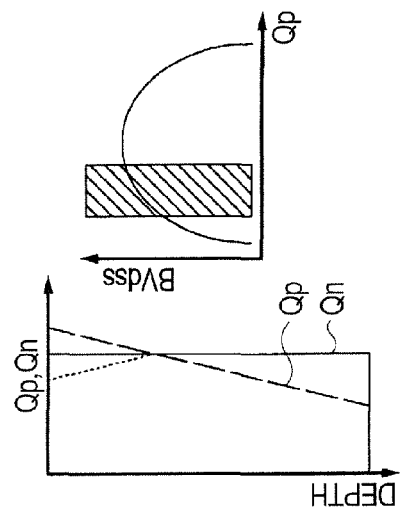
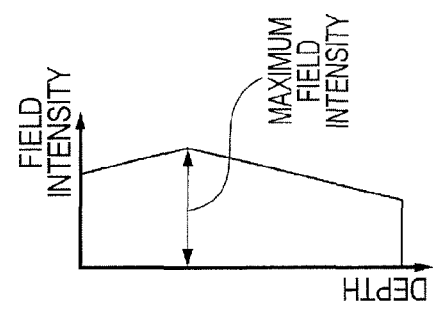
FIG. 33A  Qp ≅ Qn
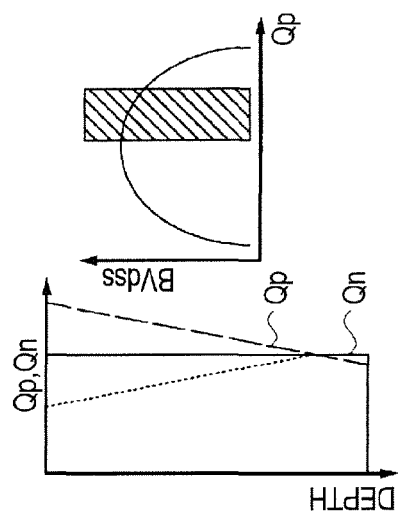
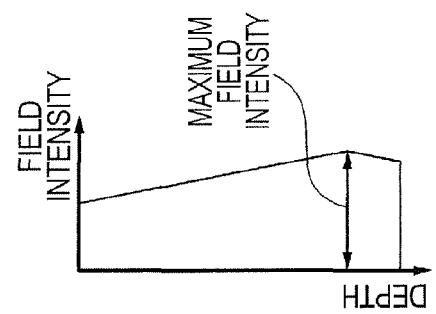
FIG. 33B  Qp > Qn
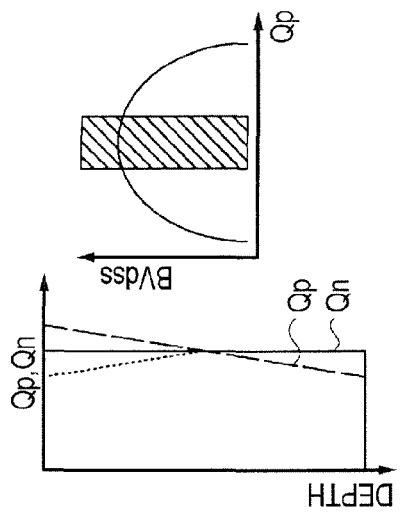
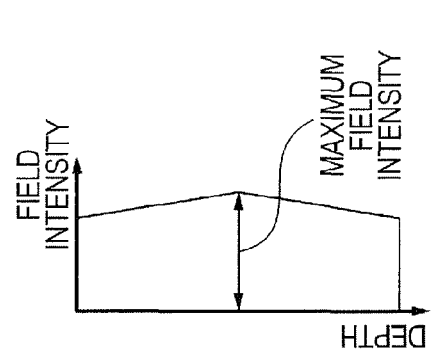
FIG. 33C  Qp < Qn

SEMICONDUCTOR DEVICE AND METHOD OF MANUFACTURING SAME

CROSS-REFERENCE TO RELATED APPLICATIONS

The disclosure of Japanese Patent Application No. 2014-103471 filed on May 19, 2014 including the specification, drawings, and abstract is incorporated herein by reference in its entirety.

BACKGROUND

The present invention relates to a semiconductor device and a technology of manufacturing same, for example, those preferably applicable to a semiconductor device including a power semiconductor element typified by a power MOSFET (metal oxide semiconductor field effect transistor) and manufacture of the semiconductor device.

International Patent Publication No. 2010-541212 (Patent Document 1) describes an electric power device including a plurality of first conductivity type pillars and a plurality of second conductivity type pillars alternately arranged in each of an active region and a terminal region. In this electric power device, the first conductivity type pillars in the active region and those in the terminal region have substantially the same width and the second conductivity type pillars in the active region have a width smaller than that of the second conductivity type pillars in the terminal region so that a breakdown voltage in the terminal region becomes higher than that in the active region.

Patent Documents

[Patent Document 1] International Patent Publication No. 2010-541212

SUMMARY

A power MOSFET having a superjunction structure has an advantage that it has a low on-resistance while securing a high breakdown voltage. In a semiconductor chip having this power MOSFET, however, an avalanche breakdown phenomenon is likely to occur, compared with in a cell region (active region) having the power MOSFET, in a peripheral region (termination region, terminal region) surrounding the outside of the cell region. This therefore leads to the problem that an avalanche current concentrates on the peripheral portion of the cell region and destroys the power MOSFET.

Another problem and novel features will be apparent from the description herein and accompanying drawings.

A semiconductor device according to one embodiment has a cell region and a peripheral region formed outside the cell region. The cell region and the peripheral region each have therein alternately arranged n type column regions and p type column regions. The n type impurity concentration of the n type column regions in the cell region is higher than that of the n type column regions in the peripheral region. Further, a charge balance is kept in each of the cell region and the peripheral region so that a difference between the total electric charge of the p type column regions and the total electric charge of the n type column regions falls within ±10% of the total electric charge of the p type column regions or the total electric charge of the p type column regions exceeds that of the n type column regions.

A method of manufacturing a semiconductor device according to one embodiment includes a step of forming a plurality of n type column regions in an n type epitaxial layer in a cell region while separating them from each other; and a step of forming a plurality of p type column regions in a partial region of the n type epitaxial layer sandwiched between the n type column regions adjacent to each other in the cell region. The method further includes a step of forming a plurality of p type column regions in an n type epitaxial layer in a peripheral region while separating them from each other and forming a plurality of n type column regions comprised of a partial region of the n type epitaxial layer sandwiched between the p type column regions adjacent to each other in the peripheral region. Charge balance is kept in each of the cell region and the peripheral region by regulating the impurity concentration, width, and pitch of each of the n type column regions in the cell region, the p type column regions in the cell region, and the p type column regions in the peripheral region.

According to the embodiments, a semiconductor device having a power semiconductor element can have improved reliability.

BRIEF DESCRIPTION OF THE DRAWINGS

FIG. 4 is a cross-sectional view showing a manufacturing step of the semiconductor device according to First Embodiment;

FIG. 5 is a cross-sectional view showing a manufacturing step of the semiconductor device following that of FIG. 4;

FIG. 6 is a cross-sectional view showing a manufacturing step of the semiconductor device following that of FIG. 5;

FIG. 7 is a cross-sectional view showing a manufacturing step of the semiconductor device following that of FIG. 6;

FIG. 33 includes a graph showing the charge balance of the breakdown voltage (BVdss) of pn junction in a semiconductor device, a schematic view showing a total electric charge distribution of a pn junction portion; and a schematic view showing a field intensity of the pn junction portion, in which FIG. 33A shows a field intensity and the like when the total electric charge (Qp) of p type column regions and the total electric charge (Qn) of n type column regions are substantially the same (Qp≈Qn); FIG. 33B (b) shows a field intensity and the like when the total electric charge (Qp) of p type column regions is larger than the total electric charge (Qn) of n type column regions (Qp>Qn); and FIG. 33C shows a field intensity and the like when the total electric charge (Qp) of p type column regions is smaller than the total electric charge (Qn) of n type column regions (Qp<Qn);

FIG. 35 includes a schematic view showing a total electric charge distribution of a pn junction portion in the semiconductor device according to Third Embodiment and a schematic view showing a field intensity of the pn junction portion, in which

DETAILED DESCRIPTION

Figure 1:
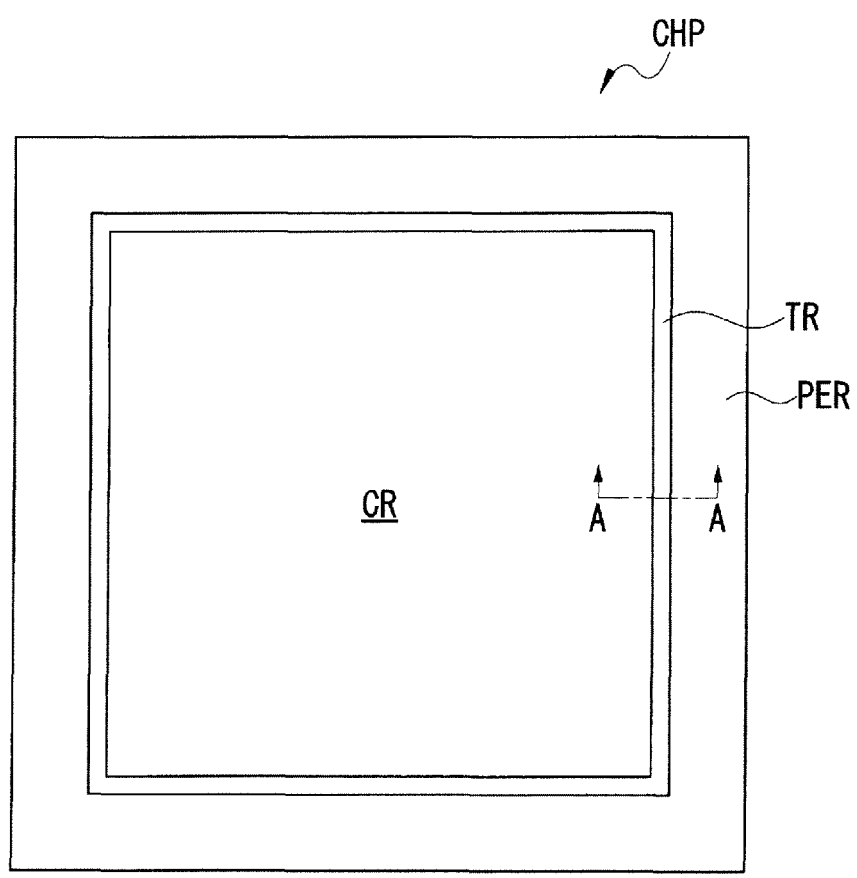
FIG. 1 is a schematic view showing the plane constitution of a semiconductor chip according to First Embodiment.

In the following embodiments, a description may be made after divided in a plurality of sections or embodiments if necessary for the sake of convenience. These sections or embodiments are not independent from each other unless otherwise particularly specified, but one of them may be a modification example, details, complementary description, or the like of a part or whole of the other one.

In the following embodiments, when a reference is made to the number or the like (including the number, value, amount, range, or the like) of components, the number is not limited to a specific number but may be more or less than the specific number, unless otherwise specifically indicated or principally apparent that the number is limited to the specific number.

Further, in the following embodiments, it is needless to say that constituent components (including constituent steps or the like) are not always essential unless otherwise specifically indicated or principally apparent that they are essential.

It is needless to say that the terms "comprises A", "is comprised of A", "has A", "includes A" and any variations thereof are not intended to exclude another component unless otherwise specifically indicated that it comprises, is comprised of, has, or includes only the component. Similarly, in the following embodiments, when a reference is made to the shape, positional relationship, or the like of the constituent components, that substantially approximate or similar to it is also embraced unless otherwise specifically indicated or principally apparent that it is not. This also applies to the above-described value and range.

In the drawings used in the following embodiments, even a plan view is sometimes hatched to facilitate understanding of it. In all the drawings for describing the following embodiments, members of a like function will be identified by like reference numerals and overlapping descriptions will be omitted. Embodiments will hereinafter be described in detail referring to drawings.

(Problem of Power Semiconductor Element)

For example, power semiconductor elements typified by power MOSFET and IGBT (insulated gate bipolar transistor) are used as a load drive switch element. When a load contains inductance, back electromotive force due to this inductance occurs and a voltage resulting from this back electromotive force is applied to a power semiconductor element when the power semiconductor element is turned OFF. In this case, a voltage applied to the power semiconductor element becomes equal to or higher than a power-supply voltage. If this voltage exceeds an avalanche breakdown voltage, due to an avalanche breakdown phenomenon, an avalanche current passes through the power semiconductor element. The avalanche current exceeding avalanche resistance (allowable ampacity) of the power semiconductor element may lead to fracture of the power semiconductor element. The term "avalanche resistance" as used herein means allowable ampacity of an avalanche current that continues flowing due to an avalanche breakdown phenomenon until fracture of the element. In the power semiconductor element, regional concentration of an avalanche current is likely to cause fracture of a power semiconductor element, because the avalanche current exceeds avalanche resistance.

In order to provide a power semiconductor element having improved reliability, it is therefore necessary to find an appropriate device structure for a power semiconductor element so as to avoid regional current concentration of an avalanche current and thereby prevent an avalanche current from exceeding avalanche resistance.

For example, a semiconductor chip having a power semiconductor element therein is usually equipped with a cell region having therein the power semiconductor element and a peripheral region surrounding the outside of the cell region. With regard to an avalanche breakdown voltage, a source-drain breakdown voltage in the peripheral region is preferably higher than a source-drain breakdown voltage in the cell region in view of preventing fracture of the power semiconductor element. This is because compared with occurrence of an avalanche breakdown phenomenon in the cell region, occurrence of an avalanche breakdown phenomenon in the peripheral region is likely to cause fracture of the power semiconductor element due to regional concentration of an avalanche current (for example, concentration to the peripheral portion of the cell region) to even exceed avalanche resistance.

In the existing device structure, however, a source-drain breakdown voltage in the peripheral region is lower than a source-drain breakdown voltage in the cell region and an avalanche breakdown phenomenon inevitably occurs in the peripheral region. Even if there is no significant difference in the source-drain breakdown voltage between there regions, the peripheral region does not have a source-side contact through which an electric current generated due to an avalanche breakdown phenomenon flows so that an avalanche current intensively flows through the source-side contact in the peripheral portion of the cell region through which holes flow and there, fracture of a power semiconductor element occurs. In a power semiconductor element, in order to effectively prevent fracture of the power semiconductor element due to an avalanche breakdown phenomenon and thereby provide a more reliable semiconductor device including a power semiconductor element, it is necessary to find a method to make the source-drain breakdown voltage in the cell region lower than that in the peripheral region (a method of causing an avalanche breakdown phenomenon in the cell region first when a reverse bias is applied to between source and drain).

(Basic Concept in the Present Embodiment)

For example, in a pn junction device typified by power MOSFET, IGBT, or diode, the breakdown voltage of the device is determined by the breakdown voltage of pn junction.

The term "breakdown voltage of pn junction" means an avalanche breakdown voltage that causes an avalanche breakdown phenomenon. For example, the breakdown voltage of pn junction in a power MOSFET is defined as a voltage at which an avalanche breakdown phenomenon occurs when the voltage is applied to a drain region while grounding a gate electrode and a source region.

More specifically, an avalanche breakdown voltage is a voltage at which an avalanche breakdown phenomenon occurs when a reverse voltage (voltage to be applied in a direction of enhancing a potential barrier formed in the junction) is applied to pn junction and an avalanche breakdown phenomenon is a phenomenon that occurs by the following mechanism. Described specifically, when a reverse voltage is applied to pn junction, electrons and holes accelerated in a high electric field collide with crystal lattices in a depletion layer formed in the pn junction. Then, a covalent bond that connects between the crystal lattices is broken and new electron-hole pairs are generated (impact ionization). These new electron-hole pairs obtain energy in a high electric field, collide with crystal lattices, and generate new electron-hole pairs further. Due to growth of such a doubling phenomenon, a high current flows through the depletion layer. This phenomenon is called "avalanche breakdown phenomenon".

Such a breakdown voltage of pn junction is approximated, for example, by the following formula (1).

$$V_B \approx 60 \times (Eg/1.1)^{3/2} \times (N_B/10^{16})^{-3/4} \qquad (1)$$

wherein, $V_B$ means the breakdown voltage of pn junction, Eg means a band gap, and $N_B$ means a background concentration (impurity concentration of a lower one of the pn junction). This formula (1) reveals that the breakdown voltage of pn junction is proportional to the 3/2-th power of the band gap and at the same time, inversely proportional to the 3/4-th power of the background concentration.

In the present embodiment, therefore, attraction is paid to the background concentration having a influence on the breakdown voltage of pn junction. As is apparent from the formula (1), the lower the background concentration, the higher the breakdown voltage of pn junction. In other words, reduction in the background concentration is necessary for improving the breakdown voltage of pn junction.

As described above, from the standpoint of improving the reliability of a power semiconductor element, occurrence of an avalanche breakdown phenomenon not in the peripheral region but in the cell region is desirable. This means that from the standpoint of preventing the fracture of a power semiconductor element due to an avalanche breakdown phenomenon, it is desired to make a source-drain breakdown voltage in the cell region lower than a source-drain breakdown voltage in the peripheral region.

In the present embodiment, therefore, in order to make the source-drain breakdown voltage in the cell region lower than the source-drain breakdown voltage in the peripheral region, an attention is paid to the relationship represented by the formula (1) between the breakdown voltage of pn junction and the background concentration and the background concentration in the cell region is made higher than the background concentration in the peripheral region. Then, the avalanche breakdown voltage in the cell region becomes lower than the avalanche breakdown voltage in the peripheral region. Prior to occurrence of an avalanche breakdown phenomenon in the peripheral region, therefore, an avalanche breakdown phenomenon occurs in the cell region. This means that according to the basic concept of the present embodiment, an avalanche breakdown phenomenon can be caused in the cell region so that fracture of a power semiconductor element due to the avalanche breakdown phenomenon can be prevented effectively and thereby, a semiconductor device including a power semiconductor element can have improved reliability.

The present embodiment uses a method of embodying the above-mentioned basic concept.

(First Embodiment) <Constitution of Semiconductor Device>

In First Embodiment, a power MOSFET will be described as an example of a power semiconductor element. FIG. 1 is a view schematically showing the plane constitution of a semiconductor chip which is a constituent component of a semiconductor device (power MOSFET) according to First Embodiment.

As shown in FIG. 1, a semiconductor chip CHP according to First Embodiment has, for example, a rectangular shape and has a cell region CR, a transition region TR, and a peripheral region PER. The cell region CR is surrounded, at the outside thereof, by the transition region TR and the transition region TR is surrounded by the peripheral region PER. In other words, the cell region CR lies in the inside region surrounded by the peripheral region PER via the transition region TR.

The cell region CR has, for example, a plurality of power MOSFETs functioning as a switch element. The peripheral region PER, on the other hand, has a peripheral structure typified by a babel structure having an obliquely etched periphery, a diffused ring structure, a field ring structure, or a field plate structure. These peripheral structures are formed based on the design concept that makes use of electric field concentration for suppressing an avalanche breakdown phenomenon.

As described above, the semiconductor chip CHP of First Embodiment has, in the inside region including a center region, a plurality of power MOSFETs and has, in the outside region surrounding the inside region, a peripheral structure which is an electric field relax structure.

Figure 2:
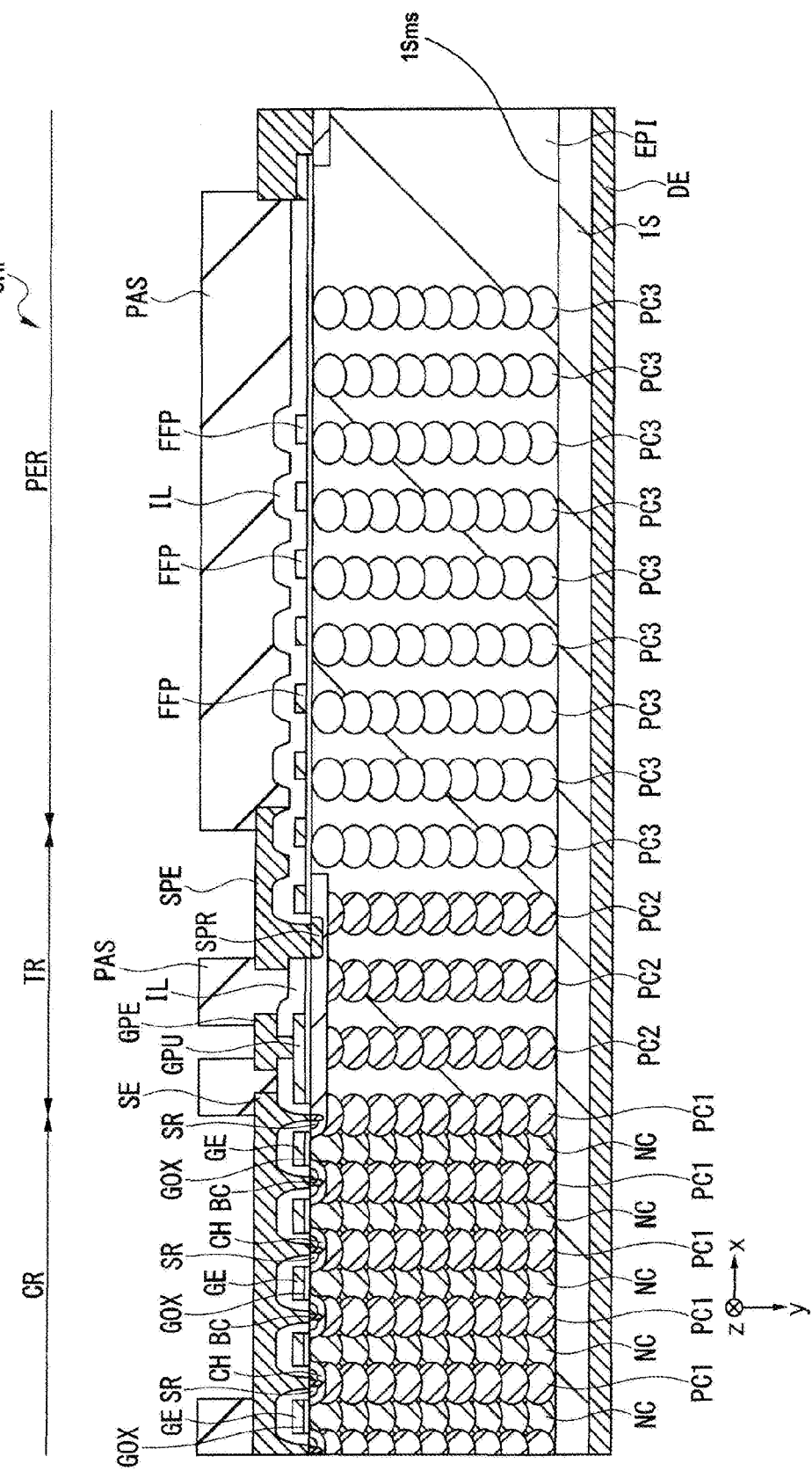
FIG. 2 is a cross-sectional view (cross-sectional view taken along a line A-A of FIG. 1) showing the constitution of a semiconductor device according to First Embodiment.

FIG. 2 is a cross-sectional view taken along a line A-A of FIG. 1. As shown in FIG. 2, the semiconductor chip CHP has the cell region CR, the transition region TR, and the peripheral region PER. The structure of each of the cell region CR, the transition region TR, and the peripheral region PER is designed so as to satisfy the following relationship: (breakdown voltage of pn junction of the cell region CR)>(breakdown voltage of pn junction of the transition region TR)>(breakdown voltage of pn junction of the peripheral region PER). The respective structures of the cell region CR, the transition region TR, and the peripheral region PER will next be described.

(1) Structure of Cell Region CR

As shown in FIG. 2, the cell region CR has a so-called superjunction structure in which a plurality of first p type column regions PC1 and a plurality of n type column regions NC are alternately arranged in a direction x in an epitaxial layer EPI on the main surface of a semiconductor substrate 1S. A drain electrode DE is provided on the semiconductor substrate 1S opposite the epitaxial layer EPI. The cell region CR in First Embodiment is designed so that the width (size in the direction x), the length (size in a direction z), and the depth (size in a direction y) of the first p type column regions PC1 become equal to the width (size in the direction x), the length (size in the direction z), and the depth (size in the direction y) of the n type column regions NC, respectively. In First Embodiment, therefore, shown is an example of the cell region CR in which a width ratio of the first p type column regions PC1 and the n type column regions NC is 1:1.

The cell region will hereinafter be described in detail. A semiconductor substrate 1S made of, for example, silicon containing an n type impurity such as phosphorus (P) or arsenic (As) has, on the main surface thereof, an epitaxial layer EPI. This epitaxial layer EPI is comprised of a semiconductor layer composed mainly of, for example, silicon introduced with an n type impurity such as phosphorus (P) or arsenic (As). The epitaxial layer EPI has an n type impurity concentration (Nep) of, for example, $2.4 \times 10^{15}/cm^3$ which is lower than that of the semiconductor substrate 1S.

The epitaxial layer EP1 has therein the plurality of n type column regions NC separated from each other in the direction x. These n type column regions NC each have, for example, a columnar shape and are comprised of a semiconductor region introduced with an n type impurity such as phosphorus (P) or arsenic (As). The n type impurity concentration (Nc) of the n type column regions NC is higher than the n type impurity concentration (Nep) of the epitaxial layer EPI and is, for example, $3.0 \times 10^{15}/cm^3$. These n type column regions NC and the semiconductor substrate 1S include a drain region of the power MOSFET.

Further, the epitaxial layer EPI has, in a partial region thereof sandwiched between the n type column regions NC adjacent to each other, the first p type column regions PC1. These first p type column regions PC1 each have, for example, a columnar shape and are comprised of a semiconductor region introduced with a p type impurity such as boron (B). The first p type column regions PC1 have a p type impurity concentration (Np1) of, for example, $3.0 \times 10^{15}/cm^3$.

The epitaxial layer EPI having therein the superjunction structure has, on the upper surface thereof, an element portion.

In the element portion, the epitaxial layer EPI has, on the upper surface thereof, a channel region CH contiguous to the first p type column regions PC1 and this channel region CH embraces a source region SR. The channel region CH is comprised of a semiconductor region introduced, for example, with a p type impurity such as boron (B), while the source region SR is comprised of a semiconductor region introduced, for example, with an n type impurity such as phosphorus (P) or arsenic (As). The source region SR has, at a center portion thereof, a body contact region BC extending from the upper surface of the epitaxial layer EPI and reaching the channel region CH. This body contact region BC is comprised of a semiconductor region introduced, for example, with a p type impurity such as boron (B) and the impurity concentration of the body contact region BC is higher than that of the channel region CH.

Further, a region sandwiched between the channel regions CH adjacent to each other has thereon a gate insulating film GOX and this gate insulating film GOX has thereon a gate electrode GE. The gate insulating film GOX is made of, for example, a silicon oxide film. The gate insulating film is however not limited to it and it may be made of a high dielectric constant film having a dielectric constant higher than that of a silicon oxide film. The gate electrode GE is made of, for example, a polycrystalline silicon film. The gate electrode GE is formed in alignment with the source region SR. The gate electrode GE has, on the upper surface and sidewalls on both sides thereof, covered with an interlayer insulating film IL made of, for example, a silicon oxide film.

The interlayer insulating film IL covering a plurality of the gate electrodes GE has thereover a source electrode SE comprised of a barrier conductor film made of a titanium tungsten film and an aluminum film. The source electrode SE is therefore electrically coupled to the source region SR and at the same time, electrically coupled to the channel region CH via the body contact region BC.

The body contact region BC has a function of securing an ohmic contact with the source electrode SE and due to the presence of this body contact region BC, the source region SR and the channel region CH are electrically coupled to each other at the same potential.

This makes it possible to suppress the on-operation of a parasitic npn bipolar transistor using the source region SR as an emitter region, the channel region CH as a base region, and the n type column region NC as a collector region. The fact that the source region SR and the channel region CH are electrically coupled to each other at the same potential means that no potential difference occurs between the emitter region and the base region of the parasitic npn bipolar transistor and this enables suppression of the on-operation of the parasitic npn bipolar transistor.

The source electrode SE is partially covered with a surface protective film PAS made of, for example, a silicon oxide film and a partial region of the source electrode SE is exposed from the surface protective film PAS. The semiconductor substrate 1S has, on the back surface thereof (surface on the side opposite to the main surface having thereon the epitaxial layer EPI), a drain electrode DE made of a metal film.

The cell region CR thus has a plurality of the power MOSFETs.

(2) Structure of Transition Region TR

As shown in FIG. 2, the transistor region TR has a so-called superjunction structure in which a plurality of second p type column region PC2 and a plurality of n type column regions comprised of the epitaxial layer EPI have been alternately arranged in the direction x. In the transition region TR in First Embodiment, the width (size in the direction x) of the second p type column regions PC2 is different from the width (size in the direction x) of the n type column regions comprised of the epitaxial layer EPI. The length (size in the direction z) and the depth (size in the direction y) of the second p type column regions PC2 are however designed to become equal to the length (size in the direction z) and the depth (size in the direction y) of the n type column regions comprised of the epitaxial layer EPI, respectively.

The transition region will hereinafter be described in detail. In the transition region TR as well as in the cell region CR, the semiconductor substrate 1S has, on the main surface thereof, the epitaxial layer EPI. In the epitaxial layer EPI, a plurality of the second p type column regions PC2 is separated from each other in the direction x. The second p type column regions PC2 each have, for example, a columnar shape and are comprised of a semiconductor region introduced, for example, with a p type impurity such as boron (B). The second p type column regions PC2 have a p type impurity concentration (Np2) of, for example, $3.0 \times 10^{15}/cm^3$. A partial region of the epitaxial layer EPI sandwiched between the second p type column regions PC2 adjacent to each other becomes the n type column region.

Further, the channel region CH formed in the epitaxial layer EPI has thereon, via the gate insulating film GOX, a gate lead portion GPU made of a polycrystalline silicon film which is the same layer as that of the gate electrode GE formed in the cell region CR. This gate lead portion GPU is covered, at the upper surface and sidewalls on both sides thereof, with an interlayer insulating film IL and this interlayer insulating film IL has partially an opening portion that exposes therefrom a portion of the upper surface of the gate lead portion GPU.

This interlayer insulating film IL including the opening portion has thereon a gate lead electrode GPE comprised of, for example, a barrier conductor film made of a titanium tungsten film and an aluminum film. The gate lead portion GPU is electrically coupled to a plurality of the gate electrodes GE and a gate voltage applied to the gate lead electrode GPE is applied to each of the gate electrodes GE via the gate lead portion GPU.

Further, the epitaxial layer EPI has, on the upper surface thereof, a channel region CH extending from the cell region CR and this channel region CH embraces therein a source lead region SPR. The epitaxial layer EPI has, on the upper surface thereof, an interlayer insulating film IL so as to cover therewith the upper portion of the channel region CH. This interlayer insulating film IL has an opening portion so as to expose therefrom the source lead region SPR. A source lead electrode SPE comprised of, for example, a barrier conductor film made of a titanium tungsten film and an aluminum film fills this opening portion and at the same time, lies on the interlayer insulating IL.

Also in the transition region TR, a surface protective film PAS made of, for example, a silicon oxide film partially covers the gate lead electrode GPE and the source lead electrode SPE. A partial region of the gate lead electrode GPE and a partial region of the source lead electrode SPE are exposed from the surface protective film PAS.

As described above, the transition region TR has a transition structure.

(3) Structure of Peripheral Region PER

As shown in FIG. 2, the peripheral region PER has a so-called superjunction structure in which a plurality of third p type column regions PC3 and a plurality of n type column regions comprised of the epitaxial layer EPI have been alternately arranged in the direction x. The peripheral region PER in First Embodiment is designed so that the width (size in the direction x), the length (size in the direction z), and the depth (size in the direction y) of the third p type column region PC3 become equal to the width (size in the direction x), the length (size in the direction z), and the depth (size in the direction y) of the n type column region comprised of the epitaxial layer EPI, respectively. In First Embodiment, therefore, shown is an example of the peripheral region PER in which a width ratio of the third p type column regions PC3 and the n type column regions comprised of the epitaxial layer EPI is 1:1.

The peripheral region will hereinafter be described in detail. In the peripheral region PER as well as in the cell region CR, the semiconductor substrate 1S has, on the main surface thereof, an epitaxial layer EPI. The epitaxial layer EPI has therein a plurality of third p type column regions PC3 separated from each other in the direction x. These third p type column regions PC3 each have, for example, a columnar shape and are comprised of a semiconductor region introduced with a p type impurity such as boron (B). The p type impurity concentration (Np3) of the third p type column regions PC3 is lower than the p type impurity concentration (Np2) of the second p type column regions PC2 in the transition region TR and is, for example, $2.4 \times 10^{15}/cm^3$. A partial region of the epitaxial layer EPI sandwiched between the third p type column regions PC3 adjacent to each other becomes an n type column region.

The epitaxial layer EPI has, on the upper surface thereof, a plurality of electrodes (dummy electrodes) FFP comprised of a polycrystalline silicon film which is the same layer as that of the gate electrode GE formed in the cell region CR. An interlayer insulating film IL extends over the upper surface of the epitaxial layer EPI so as to cover the upper surface and both sidewalls of the electrodes (dummy electrodes) FFP.

Also the peripheral region PER has a surface protective film PAS made of, for example, a silicon oxide film.

As described above, the peripheral region PER has a peripheral structure.

<Advantage of Superjunction Structure>

As described above, the power MOSFET according to First Embodiment has a superjunction structure. Such a power MOSFET having a superjunction structure can provide the advantage as follows.

In the typical power MOSFET, a breakdown voltage is secured by decreasing the impurity concentration of the epitaxial layer EPI and thereby extending a depletion layer formed in the epitaxial layer EPI when the power MOSFET is in an off state. To achieve a high breakdown voltage, the epitaxial layer EPI having a low impurity concentration needs to be thickened. When the epitaxial layer having a low impurity concentration becomes thick, on the other hand, the on-resistance of the power MOSFET increases. This means that in the power MOSFET, improvement in breakdown voltage and reduction in on-resistance are in a trade-off relationship.

In this respect, in the power MOSFET having a superjunction structure according to First Embodiment, the epitaxial layer EPI has a superjunction structure comprised of regularly arranged first p type column regions PC1 and n type column regions NC. In this power MOSFET having a superjunction structure, a depletion layer extends also in a horizontal direction from the pn junction formed in a boundary region between the first p type column regions PC1 and the n type column regions NC in an off state. In the power MOSFET having a superjunction structure, therefore, even when the impurity concentration of the n type column regions NC, which are current paths, is increased, depletion layers extending in the inside direction of the n type column regions NC sandwiched between two boundary regions are coupled to each other to facilitate depletion of the entirety of the n type column regions NC. The entirety of the n type column regions NC is depleted in an off state so that a breakdown voltage can be secured. In other words, in the power MOSFET having a superjunction structure, the entirety of the n type column regions NC can be depleted even while increasing the impurity concentration of the n type column regions NC which are current paths. As a result, the power MOSFET having a superjunction structure is advantageous that it can have reduced on-resistance while securing a high breakdown voltage.

<Characteristics and Advantage in First Embodiment>

(1) Breakdown Voltage of Pn Junction

In the semiconductor device of First Embodiment, the n type impurity concentration (Nn) of the n type column regions NC in the cell region CR is made higher than the n type impurity concentration (Nep) of the epitaxial layer EPI in the peripheral region PER. More specifically, in First Embodiment, the n type impurity concentration (Nn) of the n type column regions NC in the cell region CR is set at $3.0 \times 10^{15}/cm^3$ and the n type impurity concentration (Nep) of the epitaxial layer EPI in the peripheral region PER is set at $2.4 \times 10^{15}/cm^3$. The background concentration of a pn junction portion (a junction portion between the first p type column regions PC1 and the n type column regions NC) in the cell region CR is thus made higher than the background concentration of a pn junction portion (a junction portion between the third p type column regions PC3 and the epitaxial layer EPI) in the peripheral region PER. As a result, an avalanche breakdown voltage of the cell region CR becomes lower than an avalanche breakdown voltage in the peripheral region PER in consideration of the following formula (1) showing the relationship between an avalanche breakdown voltage (breakdown voltage of pn junction) and a band gap.

Therefore, when a voltage equal to or higher than a power supply voltage is applied to the power MOSFET due to an influence of inductance present in the load, an avalanche breakdown phenomenon can be caused in the cell region without causing an avalanche breakdown phenomenon in the peripheral region. In other words, in the power MOSFET according to First Embodiment, an avalanche breakdown phenomenon can be caused in the cell region CR in which regional concentration of an avalanche current is more unlikely to occur than in the peripheral region PER. This means that prior to occurrence of an avalanche breakdown phenomenon in the peripheral region PER which is likely to exceed avalanche resistance of the power MOSFET, an avalanche breakdown phenomenon can be caused in the cell region CR which is more unlikely to exceed the avalanche resistance of the power MOSFET than the peripheral region PER. This is due to a difference in the structure between the cell region CR having, at high density, source-side contacts through which an avalanche current flows and the peripheral region having no source-side contacts. As a result, even when a voltage exceeding a power supply voltage is applied to the power MOSFET to cause an avalanche breakdown phenomenon, a situation leading to fracture of the power MOSFET can be avoided. The semiconductor device including a power MOSFET according to First Embodiment therefore can have improved reliability.

Figure 3A:
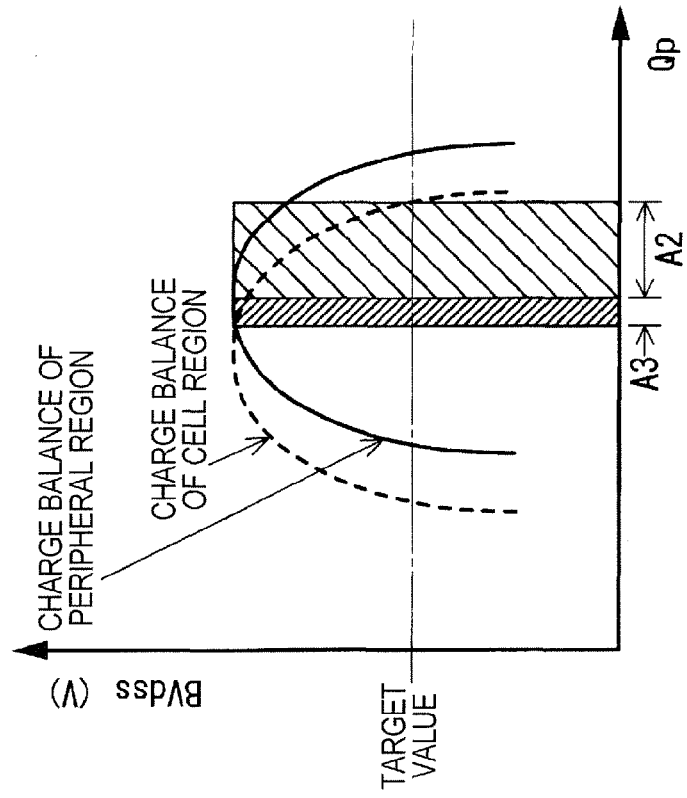
FIG. 3A is a graph showing the charge balance of the breakdown voltage (BVdss) of pn junction in the semiconductor device according to First Embodiment.

FIG. 3A is a graph showing a charge balance of breakdown voltage (BVdss) of pn junction in the semiconductor device according to First Embodiment. This graph shows a charge balance in the cell region and the peripheral region.

In First Embodiment, the n type impurity concentration (Nn) of the n type column regions NC in the cell region CR is made higher than the n type impurity concentration (Nep) of the n type column regions comprised of the epitaxial layer EPI in the peripheral region PER. As shown in FIG. 3A, therefore, the breakdown voltage (BVdss) of the pn junction in the cell region CR becomes lower than the breakdown voltage (BVdss) of pn junction in the peripheral region PER.

A lowering degree (curvature of the curve of the charge balance) of the breakdown voltage (BVdss) of pn junction in the cell region becomes smaller than a lowering degree of the breakdown voltage (BVdss) of the pn junction in the peripheral region PER. As a result, the charge balance in the cell region does not overlap with the charge balance in the peripheral region PER. In one semiconductor chip CHP, the breakdown voltage of the semiconductor chip CHP is therefore determined by the charge balance in the cell region CR.

(2) Charge Balance in Each Region

In the superjunction structure, loss of charge balance between the total electric charge of the p type column regions constituting the pn junction portion and the total electric charge of the n type column regions leads to drastic reduction in the breakdown voltage of pn junction. It is therefore desired to set the total electric charge of the p type column regions and the total electric charge of the n type column regions equal to each other in each of the cell region CR, the transition region TR, and the peripheral region PER.

In consideration of a process margin during manufacture of a semiconductor device, it is actually difficult to set the total electric charge of the p type column regions and the total electric charge of the n type column regions equal to each other. In the superjunction structure, therefore, the p type column regions and the n type column regions are formed so as to make the total electric charge (Qp) of the p type column regions equal to the total electric charge (Qn) of the n type column regions (Qp=Qn) or to make the total electric charge (Qp) of the p type column regions larger than the total electric charge (Qn) of the n type column regions (Qp>Qn). More specifically, since it is actually difficult to make the total electric charge (Qp) of the p type column regions exactly equal to the total electric charge (Qn) of the n type column regions (Qp=Qn), the total electric charge (Qp) of the p type column regions and the total electric charge (Qn) of the n type column regions are made substantially equal to each other (Qp≈Qn). The term "Qp≈Qn" to be used when the total electric charge (Qp) of the p type column regions and the total electric charge (Qn) of the n type column regions are made substantially equal to each other means that a difference between the total electric charge (Qp) of the p type column regions and the total electric charge (Qn) of the n type column regions is within ±10% of the total electric charge (Qp) of the p type column regions.

In First Embodiment, in the cell region CR, each total electric charge is set so as to make the total electric charge (CQp) of the first p type column regions PC1 substantially equal to the total electric charge (CQn) of the n type column regions NC (CQp≈CQn) or larger than the total electric charge (CQn) of the n type column regions NC (CQp>CQn). In the transition region TR, each total electric charge is set so as to make the total electric charge (TQp) of the second p type column regions PC2 substantially equal to the total electric charge (TQn) of the n type column regions comprised of the epitaxial layer EPI (TQp≈TQn) or larger than the total electric charge (TQn) of the n type column regions comprised of the epitaxial layer EPI (TQp>TQn). In the peripheral region PER, each total electric charge is set so as to make the total electric charge (PEQp) of the third p type column regions PC3 substantially equal to the total electric charge (PEQn) of the n type column regions comprised of the epitaxial layer EPI (PEQp≈PEQn) or larger than the total electric charge (PEQn) of the n type column regions comprised of the epitaxial layer EPI (PEQp>PEQn).

This makes it possible to take an ideal charge balance in each of the cell region CR, the transition region TR, and the peripheral region PER.

Further, in First Embodiment, each total electric charge is set so as to make the total electric charge (CQp) of the first p type column regions PC1 and the total electric charge (CQn) of the n type column regions NC in the cell region CR larger than the total electric charge (TQp) of the second p type column regions PC2 and the total electric charge (TQn) of the n type column regions comprised of the epitaxial layer EPI in the transition region TR, respectively. In addition, each total electric charge is set so as to make the total electric charge (TQp) of the second p type column regions PC2 and the total electric charge (TQn) of the n type column regions comprised of the epitaxial layer EPI in the transition region TR larger than the total electric charge (PEQp) of the third p type column regions PC3 and the total electric charge (PEQn) of the n type column regions comprised of the epitaxial layer EPI in the peripheral region PER, respectively. In short, in the cell region CR, the transition region TR, and the peripheral region PER, each total electric charge is set so as to satisfy the following formula (2):

$$CQp>TQp>PEQp, \quad CQn>TQn>PEQn \qquad (2),$$

while taking a charge balance in each of the cell region CR, the transition region TR, and the peripheral region PER.

In First Embodiment, as described referring to FIG. 3A, in one semiconductor chip CHP, the breakdown voltage of the semiconductor chip CHP is determined by the charge balance in the cell region CR. The process condition is therefore determined so that in the cell region CR, the total electric charge (CQp) of the first p type column regions PC1 becomes equal to the total electric charge (CQn) of the n type column regions NC (CQp=CQn) or larger than the total electric charge (CQn) of the n type column regions NC (CQp>CQn) and at the same time, the breakdown voltage of pn junction becomes equal to or larger than a target value.

When the relationship of the formula (2) is satisfied, in an ideal range of the total electric charges (range of (CQp=CQn) and (CQp>CQn)) in the cell region CR, the total electric charges in the transition region TR also satisfy (TQp=TQn) and (TQp>TQn) and at the same time, the breakdown voltage of pn junction in the cell region CR is always lower than that of pn junction in the transition region TR. In addition, in the ideal range of the total electric charges (range of (CQp=CQn) and (CQp>CQn)) in the cell region CR, the total electric charges in the peripheral region PER also satisfy (PEQp=PEQn) and (PEQp>PEQn) and at the same time, the breakdown voltage of pn junction in the cell region CR is always lower than that of pn junction in the peripheral region PER.

This means that when the relationship of the formula (2) is satisfied, an ideal charge balance of the transition region TR and an ideal charge balance of the peripheral region PER can be included in an area (Area A1 shown in FIG. 3A) where total electric charges determined by the charge balance of the cell region CR fall within the following ranges: (CQp=CQn) and (CQp>CQn) and the breakdown voltage of pn junction equal to or larger than the target value can be obtained. In other words, in this area (Area A1 shown in FIG. 3A), the total electric charges satisfy (TQp=TQn) and (TQp>TQn) also in the transition region TR; the total electric charges satisfy (PEQp=PEQn) and (PEQp>PEQn) also in the peripheral region PER; and the breakdown voltage of pn junction in the cell region CR can always be made lower than the breakdown voltage of pn junction in the transition region TR and the peripheral region PER.

Figure 3B:
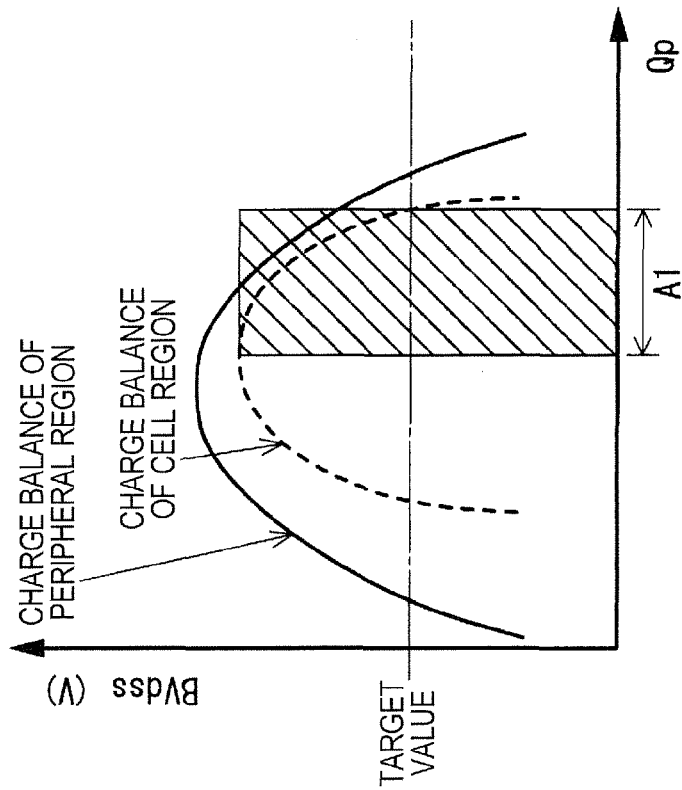
FIG. 3B is a graph showing the charge balance of the breakdown voltage (BVdss) of pn junction in a semiconductor device studied by the present inventors as a comparative example when the peak of the breakdown voltage (BVdss) of pn junction in the charge balance of a cell region and the peak of the breakdown voltage (BVdss) of pn junction in the charge balance of a peripheral region are shifted.

FIG. 3B is a graph showing the charge balance of the breakdown voltage (BVdss) of pn junction in a semiconductor device studied by the present inventors as a comparative example when the peak of the breakdown voltage (BVdss) of pn junction in the charge balance in a cell region and the peak of the breakdown voltage (BVdss) of pn junction in the charge balance in a peripheral region are shifted.

Even by shifting the breakdown voltage (BVdss) of pn junction in the charge balance in the cell region CR and the breakdown voltage (BVdss) of pn junction in the charge balance in the peripheral region PER, the breakdown voltage (BVdss) of pn junction in the cell region CR can be made lower than the breakdown voltage (BVdss) of pn junction in the peripheral region PER. A range (PEQn>PEQp, Area A3 shown in FIG. 3B) in the peripheral region PER in which the total electric charge (PEQn) of the n type column regions becomes larger than the total electric charge (PEQp) of the third p type column regions PC3 cannot however be used. A process margin (area shown by A2 in FIG. 3B) during manufacture of the semiconductor device of Comparative Example therefore becomes smaller than the process margin (area shown by A1 in FIG. 3A) during manufacture of the semiconductor device of First Embodiment.

The semiconductor device of First Embodiment can be manufactured with a wider process margin and is therefore advantageous, compared with the semiconductor device of Comparative Example.

Next, the structure of the p type column regions and n type column regions in each of the cell region CR, the transition region TR, and the peripheral region PER will be described in detail.

(2-1) Cell Region

The cell region CR, as shown in FIG. 2, has therein a plurality of first p type column regions PC1 and a plurality of n type column regions NC arranged alternately in the epitaxial layer EPI on the main surface of the semiconductor substrate 1S. The total electric charge (CQp) of the first p type column regions PC1 is represented by the following formula:

$$CQp = Np1 \times \{CRWp \times Dp \times Tp\} \quad (3)$$

wherein, Np1 represents the p type impurity concentration of the first p type column regions PC1, and CRWp, Dp, and Tp represent the width, length, and depth of the region, respectively.

The total electric charge (CQn) of the n type column region NC is represented by the following formula:

$$CQn = Nn \times \{CRWn \times Dn \times Tn\} \quad (4)$$

wherein, Nn represents the n type impurity concentration of the n type column regions NC, and CRWn, Dn, and Tn represent the width, length, and depth of the region, respectively.

The width CRWp, the length Dp, and the depth Tp of the first p type column regions PC1 are equal to the width CRWn, the length Dn, and the depth Tn of the n type column regions NC, respectively and the p type impurity concentration (Np1) of the first p type column regions PC1 is equal to the n type impurity concentration (Nn) of the n type column regions NC. In the power MOSFET according to First Embodiment, the p type impurity concentration (NP1) of the first p type column regions PC1 and the n type impurity concentration (Nn) of the n type column regions NC are, for example, $3.0 \times 10^{15}/cm^3$.

In the cell region CR, therefore, the total electric charge (CQp) of the first p type column regions PC1 becomes equal to the total electric charge (CQn) of the n type column regions NC (CQp=CQn) so that a charge balance can be kept.

(2-2) Transition Region

In the transition region TR, as shown in FIG. 2, the epitaxial layer EPI on the main surface of the semiconductor substrate has a plurality of second p type column regions PC2 separated from each other. The n type impurity concentration of the epitaxial layer EPI is lower than that of the n type column regions NC in the cell region CR and is, for example, $2.4 \times 10^{15}/cm^3$.

The total electric charge (TQp) of the second p type column regions PC2 is represented by the following formula:

$$TQp = Np2 \times \{TWp \times Dp \times Tp\} \quad (5)$$

wherein, Np2 represents the p type impurity concentration of the second p type column regions PC2, and TWp, Dp, and Tp represent the width, length, and depth of the regions, respectively. Although the p type impurity concentration (Np2) of the second p type column regions PC2 in the transition region TR is equal to the p type impurity concentration (Np1) of the first p type column regions PC1 in the cell region CR (Np2=Np1), the width (TWp) of the second p type column regions PC is smaller than the width (CRWp) of the first p type column regions PC1 in the cell region CR (TWp<CRWp). The total electric charge (TQp) of the second p type column regions PC2 in the transition region TR therefore becomes smaller than the total electric charge (CQp) of the first p type column regions PC1 in the cell region (TQp<CQp).

The total electric charge (TQn) of the n type column regions comprised of the epitaxial layer EPI is represented by the following formula:

$$TQn = Nep \times \{TWn \times Dp \times Tp\} \quad (6)$$

wherein, Nep represents the n type impurity concentration of the n type column regions comprised of the epitaxial layer EPI and TWn, Dp, and Tp represent the width, length, and depth of the regions, respectively. The n type impurity concentration (Nep) of the epitaxial layer EPI in the transition region TR is lower than the n type impurity concentration (Nn) of the n type column regions NC in the cell region CR (Nep<Nn). The total electric charge (TQn) of the n type column regions comprised of the epitaxial layer EPI in the transition region TR becomes smaller than the total electric charge (CQn) of the n type column regions NC in the cell region CR (TQn<CQn) even when the width (CRWn) of the n type column regions NC in the cell region CR is equal to the width (TWn) of the n type column regions comprised of the epitaxial layer EPI in the transition region TR.

Therefore, the total electric charge (TQp) of the second p type column regions PC2 and the total electric charge (TQn) of the n type column regions comprised of the epitaxial layer EPI in the transition region TR become smaller than the total electric charge (CQp) of the first p type column regions PC1 and the total electric charge (CQn) of the n type column regions NC in the cell region CR, respectively (TQp<CQp, TQn<CQn). By regulating the width (TWp) and the pitch of the second p type column regions PC2, the total electric charge (TQp) of the second p type column regions PC2 becomes equal to the total electric charge (TQn) of the n type column regions comprised of the epitaxial layer EPI (TQp=TQn) in the transition region TR, making it possible to keep a charge balance.

In the above description, the p type impurity concentration of the second p type column regions PC2 in the transition region TR is made equal to the p type impurity concentration of the first p type column regions PC1 in the cell region CR and the width (TWp) of the second p type column regions PC2 in the transition region TR is made smaller than the width (CRWp) of the first p type column regions PC1 in the cell region CR. The total electric charge (TQp) of the second p type column regions PC2 in the transition region TR is thereby made smaller than the total electric charge (CQp) of the first p type column regions PC1 in the cell region CR. There is however another example.

For example, the width (TWp) of the second p type column regions PC2 in the transition region TR may be made equal to the width (CRWp) of the first p type column regions PC1 in the cell region CR and the p type impurity concentration of the second p type column regions PC2 in the transition region TR may be made lower than the p type impurity concentration of the first p type column regions PC1 in the cell region. This makes it possible to make the total electric charge (TQp) of the second p type column regions PC2 in the transition region TR smaller than the total electric charge (CQp) of the first p type column regions PC1 in the cell region.

(2-3) Peripheral Region

In the peripheral region, as shown in FIG. 2, the epitaxial layer EPI on the main surface of the semiconductor substrate 1S has a plurality of the third p type column regions PC3 separated from each other. The n type impurity concentration of the epitaxial layer EPI is lower than the n type impurity concentration of the n type impurity regions in the cell region CR and is, for example, $2.4 \times 10^{15}/cm^3$.

The total electric charge (PEQp) of the third p type column regions PC3 is represented by the following formula:

$$PEQp = Np3 \times \{PEWp \times Dp \times Tp\} \quad (7)$$

wherein, Np3 represents the p type impurity concentration of the third p type column regions PC3 and PEWp, Dp, and Tp represent the width, length, and depth of these regions, respectively. The p type impurity concentration (Np3) of the third p type column regions PC3 in the peripheral region PER is lower than the p type impurity concentration (Np2) of the second p type column regions PC2 in the transition region TR (Np3<Np2). Even when the width (TWn) of the n type column regions comprised of the epitaxial layer EPI in the transition region TR is equal to the width (PEWn) of the n type column regions comprised of the epitaxial layer EPI in the peripheral region PER, the total electric charge (PEQp) of the third p type column regions PC3 in the peripheral region PER becomes smaller than the total electric charge (TQp) of the second p type column regions PC2 in the transition region TR (PEQp<TQp).

The total electric charge (PEQn) of the n type column regions comprised of the epitaxial layer EPI is represented by the following formula:

$$PEQn = Nep \times \{PEWn \times Dp \times Tp\} \quad (8)$$

wherein, Nep represents the n type impurity concentration of the n type column regions comprised of the epitaxial layer EPI and PEWn, Dp, and Tp represent the width, length, and depth of these regions, respectively. The width (PEWn) of the n type column regions comprised of the epitaxial layer EPI in the peripheral region PER is made smaller than the width (TWn) of the n type column regions comprised of the epitaxial layer EPI in the transition region TR (PEWn<TWn). The total electric charge (PEQn) of the n type column regions comprised of the epitaxial layer EPI in the peripheral region PER thereby becomes smaller than the total electric charge (TQn) of the n type column regions comprised of the epitaxial layer EPI in the transition region TR (PEQn<TQn).

The total electric charge (PEQp) of the third p type column regions PC3 and the total electric charge (PEQn) of the n type column regions comprised of the epitaxial layer EPI in the peripheral region PER therefore become smaller than the total electric charge (TQp) of the second p type column regions PC2 and the total electric charge (TQn) of the n type column regions comprised of the epitaxial layer EPI in the transition region TR, respectively (PEQp<TQp, PEQn<TQn). In the peripheral region PER, the total electric charge (PEQp) of the third p type column regions PC3 becomes equal to the total electric charge (PEQn) of the n type column regions comprised of the epitaxial layer EPI (PEQn=PEQp) by regulating the p type impurity concentration (Np3), width (PEWp), and pitch of the third p type column regions PC3, making it possible to keep a charge balance.

In the above description, the p type impurity concentration (Np3) of the third p type column regions PC3 in the peripheral region PER is made lower than the p type impurity concentration (Np1) of the first p type column regions PC1 in the cell region CR and the p type impurity concentration (Np2) of the second p type column regions PC2 in the transition region TR. The total electric charge (PEQp) of the third p type column regions PC3 in the peripheral region PER is thereby made smaller than the total electric charge (CQp) of the first p type column regions PC1 in the cell region CR and the total electric charge (TQp) of the second column regions PC2 in the transition region TR. There is however another example.

For example, the p type impurity concentration (Np3) of the third p type column region PC3 in the peripheral region PER may be made equal to the p type impurity concentration (Np2) of the second p type column regions PC2 in the transition region TR and the width (PEWp) and pitch of the third p type column regions PC3 in the peripheral region PER may be made smaller than the width (TWp) and pitch of the second p type column regions PC2 in the transition region TR, respectively. This makes it possible to make the total electric charge (PEQp) of the third p type column regions PC3 in the peripheral region PER smaller than the total electric charge (CQp) of the first p type column regions PC1 in the cell region CR and the total electric charge (TQp) of the second p type column regions PC2 in the transition region TR.

(3) Summary of Characteristics and Advantage

The semiconductor device according to First Embodiment is characterized in that the n type impurity concentration (Nn) of the n type column regions NC in the cel region CR is made higher than the n type impurity concentration (Nep) of the n type column regions comprised of the epitaxial layer EPI in the peripheral region PER; and that charge balance is kept in each of the cell region CR, the transition region TR, and the peripheral region PER. Further, it is characterized in that, as shown in the formula (2), each total electric charge is set so as to make the total electric charges (CQp, CQn) in the cell region larger than the total electric charges (TQp, TQn) in the transition region TR and make the total electric charges (TQp, TQn) in the transition region TR larger than the total electric charges (PEQp, PEQn) in the peripheral region PER.

By making the n type impurity concentration (Nn) of the n type column regions NC in the cell region CR higher than the n type impurity concentration (Nep) of the n type column regions comprised of the epitaxial layer EPI in the peripheral region PER, the breakdown voltage of pn junction in the cell region CR becomes lower than the breakdown voltage of pn junction in the peripheral region PER so that an avalanche breakdown phenomenon can be caused in the cell region CR. Prior to occurrence of an avalanche breakdown phenomenon in the peripheral region PER which is likely to exceed the avalanche resistance of the power MOSFET, an avalanche breakdown phenomenon can be caused in the cell region CR which is unlikely to exceed the avalanche resistance of the power MOSFET. As a result, even when a voltage exceeding the power supply voltage is applied to the power MOSFET to cause an avalanche breakdown phenomenon, a situation causing the fraction of the power MOSFET is avoidable.

A charge balance is kept in each of the cell region CR, the transition region TR, and the peripheral region PER, total electric charges (CQp, CQn) in the cell region CR are made larger than the total electric charges (TQp, TQn) in the transition region TR, and total electric charges (TQp, TQn)

in the transition region TR are made larger than total electric charges (PEQp, PEQn) in the peripheral region PER. In the cell region CR, an area having total electric charges within the following ranges: (CQp=CQn) and (CQp>CQn) and providing a breakdown voltage of pn junction equal to or more than a target value can be used as a process margin during manufacture of a semiconductor device. In this area, the total electric charges satisfy TQp=TQn and TQp>TQn even in the transition region TR and the total electric charges satisfy PEQp=PEQn and PEQp>PEQn in the peripheral region PER and at the same time, the breakdown voltage of pn junction in the cell region CR can always be made lower than the breakdown voltage of pn junction in the transition region TR and the peripheral region PER.

Further, by setting the n type impurity concentration (Nn) of the n type column regions NC in the cell region CR high, the power MOSFET can have reduced on-resistance.

Therefore, a semiconductor device including a power MOSFET with a superjunction structure according to First Embodiment can have improved reliability.

<Method of Manufacturing Semiconductor Device>

One example of a method of manufacturing the semiconductor device (power MOSFET) according to First Embodiment will be described referring to FIGS. 4 to 18. FIGS. 4 to 18 are cross-sectional views showing manufacturing steps of the semiconductor device of First Embodiment. In First Embodiment, a manufacturing method so-called "multi epitaxial method" in which two stages of an epitaxial layer are formed will be described. In the semiconductor device shown here, the breakdown voltage of pn junction in the cell region is from 600V to 650V and the breakdown voltage of pn junction in the peripheral region is from 650V to 730V. This means that in the semiconductor device described here, the breakdown voltage of pn junction in the peripheral region is from about 50V to 80V higher than the breakdown voltage of pn junction in the cell region. The column regions formed in each of the cell region, the transition region, and the peripheral region have the same length and depth.

As shown in FIG. 4, a semiconductor substrate is having, on the main surface (surface, upper surface) thereof, a first epitaxial layer EPI1 comprised of an n type semiconductor layer is provided. The semiconductor substrate 1S is formed, for example, by introducing an n type impurity such as phosphorus (P) or arsenic (As) into single crystal silicon. The epitaxial layer EPI1 has an n type impurity concentration of, for example, about $2.4 \times 10^{15}/cm^3$ and the epitaxial layer EPI1 has a thickness of, for example, from about 22 μm to 25 μm.

Next, as shown in FIG. 5, a patterned resist film FR1 is formed on the epitaxial layer EPI1. The resist film FR1 is formed so as to expose n type column formation regions in a cell region CR and cover the upper surface of the epitaxial layer EPI1 in the other regions including a transition region TR and a peripheral region PER.

By introducing, for example, an n type impurity such as phosphorus (P) or arsenic (As) into the epitaxial layer EPI1 in the cell region CR through ion implantation with the patterned resist film FR1 as a mask, a plurality of n type column regions NC is formed while being separated from each other.

The plurality of n type column regions NC is formed in a substantially columnar shape extending from the lower surface to the upper surface of the epitaxial layer EPI1 by carrying out ion implantation a plurality of times at varied implantation energies. The n type impurity concentration of the n type column regions NC is, for example, about $3.0 \times 10^{15}/cm^3$.

Next, as shown in FIG. 6, after removal of the resist film FR1, a patterned resist film FR2 is formed on the epitaxial layer EPI1. The resist film FR2 is formed so as to expose first p type column formation regions in the cell region CR and second p type column formation regions in the transition region TR and cover the upper surface of the epitaxial layer EPI1 in the other regions including the peripheral region PER.

By introducing, for example, a p type impurity such as boron (B) into the epitaxial layer EPI1 in the cell region CR and the transition region TR through ion implantation with the patterned resist film FR2 as a mask, a plurality of first p type column regions PC1 is formed in the cell region CR while being separated from each other and a plurality of second p type column regions PC2 is formed in the transition region TR while being separated from each other. In the transition region TR, a partial region of the epitaxial layer EPI1 sandwiched between second p type column regions PC2 adjacent to each other becomes an n type column region.

The first p type column regions PC1 in the cell region CR and the second p type column regions PC2 in the transition region TR are formed in a substantially columnar shape extending from the lower surface to the upper surface of the epitaxial layer EPI1, for example, by carrying out ion implantation a plurality of times at varied implantation energies.

The p type impurity concentration, width, and pitch of the first p type column regions PC1 in the cell region CR are set so as to keep a charge balance in the cell region CR. As the semiconductor device according to First Embodiment, shown is an example in which the width of the first p type column regions PC1 and the width of the n type column regions NC in the cell region R are set at 1:1. In this case, the p type impurity concentration of the first p type column regions PC1 is set so as to make the total electric charge (CQp) of the first p type column regions PC1 equal to the total electric charge (CQn) of the n type column regions NC (CQp=CQn). Therefore, the p type impurity concentration of the first p type column regions PC1 is equal to the n type impurity concentration of the n type column regions NC and is, for example, about $3.0 \times 10^{15}/cm^3$.

Similarly, the p type impurity concentration, width, and pitch of the second p type column regions PC2 in the transition region TR are set so as to keep a charge balance in the transition region GR. Further, the total electric charge (TQp) of the second p type column regions PC2 in the transition region TR needs to be set smaller than the total electric charge (CQp) of the first p type column regions PC1 in the cell region CR (CQp>TQp). Further, the total electric charge (TQn) of the n type column regions comprised of the epitaxial layer EPI1 in the transition region TR needs to be set smaller than the total electric charge (CQn) of the n type column regions NC in the cell region CR (CQn>TQn).

Since the second p type column regions PC2 in the transition region TR and the first p type column regions PC1 in the cell region CR are formed in the same step, the width of the second p type column regions PC2 is made smaller than that of the first p type column regions PC1. Further, in the transition region TR, the partial regions of the epitaxial layer EPI1 become n type column regions so that the width of the n type column regions comprised of the epitaxial layer EPI1 (meaning the pitch of the second p type column regions PC2) is adjusted so as to make the total electric charge (TQp) of the second p type column regions PC2 equal to the total electric charge (TQn) of the n type column regions comprised of the epitaxial layer EPI1 (TQp=TQn).

Although the width of the second p type column regions PC2 in the transition region TR is made smaller than that of the first p type column regions PC1 in the cell region CR, width setting is not limited to it. For example, the width of the second p type column regions PC2 in the transition region TR may be made equal to the width of the first p type column regions PC1 in the cell region CR and the p type impurity concentration of the second p type column regions PC2 in the transition region TR may be made lower than the p type impurity concentration of the first p type column regions PC1 in the cell region CR.

Next, as shown in FIG. 7, after removal of the resist film FR2, a patterned resist film FR3 is formed on the epitaxial layer EPI1. The resist film FR3 is formed so as to expose third p type column formation regions in the peripheral region PER and to cover the upper surface of the epitaxial layer EPI1 in the other regions including the cell region CR and the transition region TR.

By introducing, for example, a p type impurity such as boron (B) into the epitaxial layer EPI1 in the peripheral region PER through ion implantation with the patterned resist film FR3 as a mask, a plurality of third p type column regions PC3 is formed while being separated from each other. In the peripheral region PER, partial regions of the epitaxial layer EPI1 sandwiched between the third p type column regions PC3 adjacent to each other become n type column regions.

The third p type column regions PC3 in the peripheral region PER are each formed in a substantially columnar shape extending from the lower surface to the upper surface of the epitaxial layer EPI1 by carrying out ion implantation a plurality of times at varied implantation energies.

The p type impurity concentration, width, and pitch of the third p type column regions PC3 in the peripheral region PER are set so as to keep a charge balance. As the semiconductor device according to First Embodiment, shown is an example in which the width of the third p type column regions PC3 and the width of the n type column regions comprised of the epitaxial layer EPI1 in the peripheral region PER are set at 1:1. In this case, the p type impurity concentration of the third p type column regions PC3 is set so as to make the total electric charge (PEQp) of the third p type column regions PC3 equal to the total electric charge (PEQn) of the n type column regions comprised of the epitaxial layer EPI1 (PEQp=PEQn). Therefore, the p type impurity concentration of the third p type column regions PC3 is equal to the n type impurity concentration of the epitaxial layer EPI1 and is, for example, about $2.4 \times 10^{15}/cm^3$.

Further, the total electric charge (PEQp) of the third p type column regions PC3 in the peripheral region PER needs to be set smaller than the total electric charge (TQp) of the second p type column regions PC2 in the transition region TR (TQp>PEQp). The total electric charge (PEQn) of the n type column regions comprised of the epitaxial layer EPI1 in the peripheral region PER needs to be set smaller than the total electric charge (TQn) of the n type column regions comprised of the epitaxial layer EPI1 in the transition region TR (TQn>PEQn).

Since the n type column regions in the peripheral region PER and those in the transition region TR are each comprised of the same epitaxial layer EPI1, the width of the n type column regions comprised of the epitaxial layer EPI1 in the peripheral region PER is made smaller than the width of the n type column regions comprised of the epitaxial layer EPI1 in the transition region TR. Further, since the third p type column regions PC3 in the peripheral region PER and the second p type column regions PC2 in the transition region TR are formed by respectively different steps, the p type impurity concentration of the third p type column regions PC3 in the peripheral region PER is made lower than the p type impurity concentration of the second p type column regions PC2 in the transition region TR.

Here, the p type impurity concentration of the third p type column regions PC3 in the peripheral region PER is set lower than the p type impurity concentration of the second p type column regions PC2 in the transition region TR, but the concentration setting is not limited to it. For example, while setting the p type impurity concentration of the third p type column regions PC3 in the peripheral region PER equal to that of the second p type column regions PC2 in the transition region TR, the width of the third p type column regions PC3 in the peripheral region PER may be made smaller than the width of the second p type column regions PC2 in the transition region TR.

Figure 8:
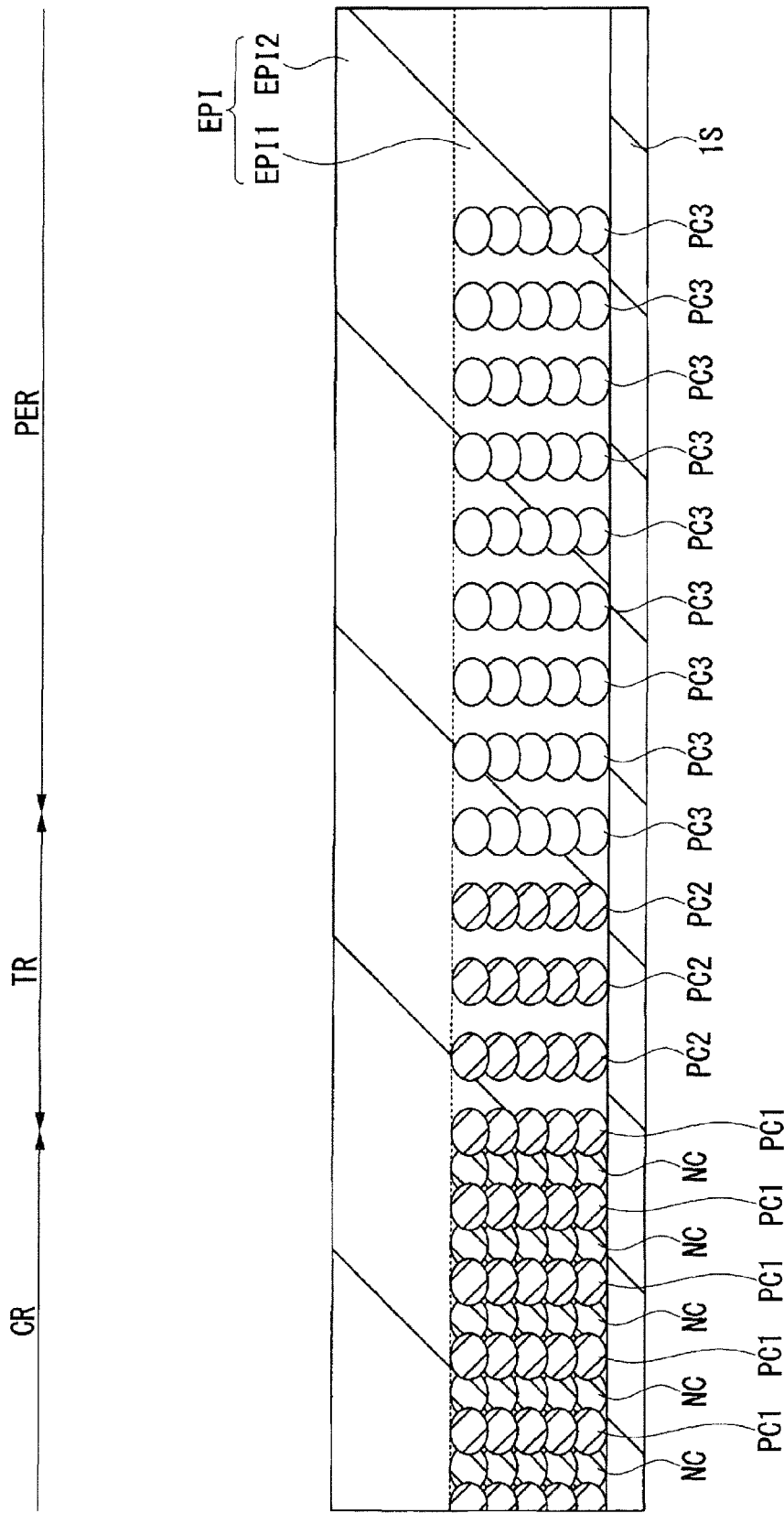
FIG. 8 is a cross-sectional view showing a manufacturing step of the semiconductor device following that of FIG. 7.

As shown in FIG. 8, a second epitaxial layer EPI2 is formed on the first epitaxial layer EPI1. The impurity concentration of the epitaxial layer EPI2 is, for example, about $2.4 \times 10^{15}/cm^3$ and the thickness of the epitaxial layer EPI2 is, for example, from about 22 μm to 25 μm.

Figure 9:
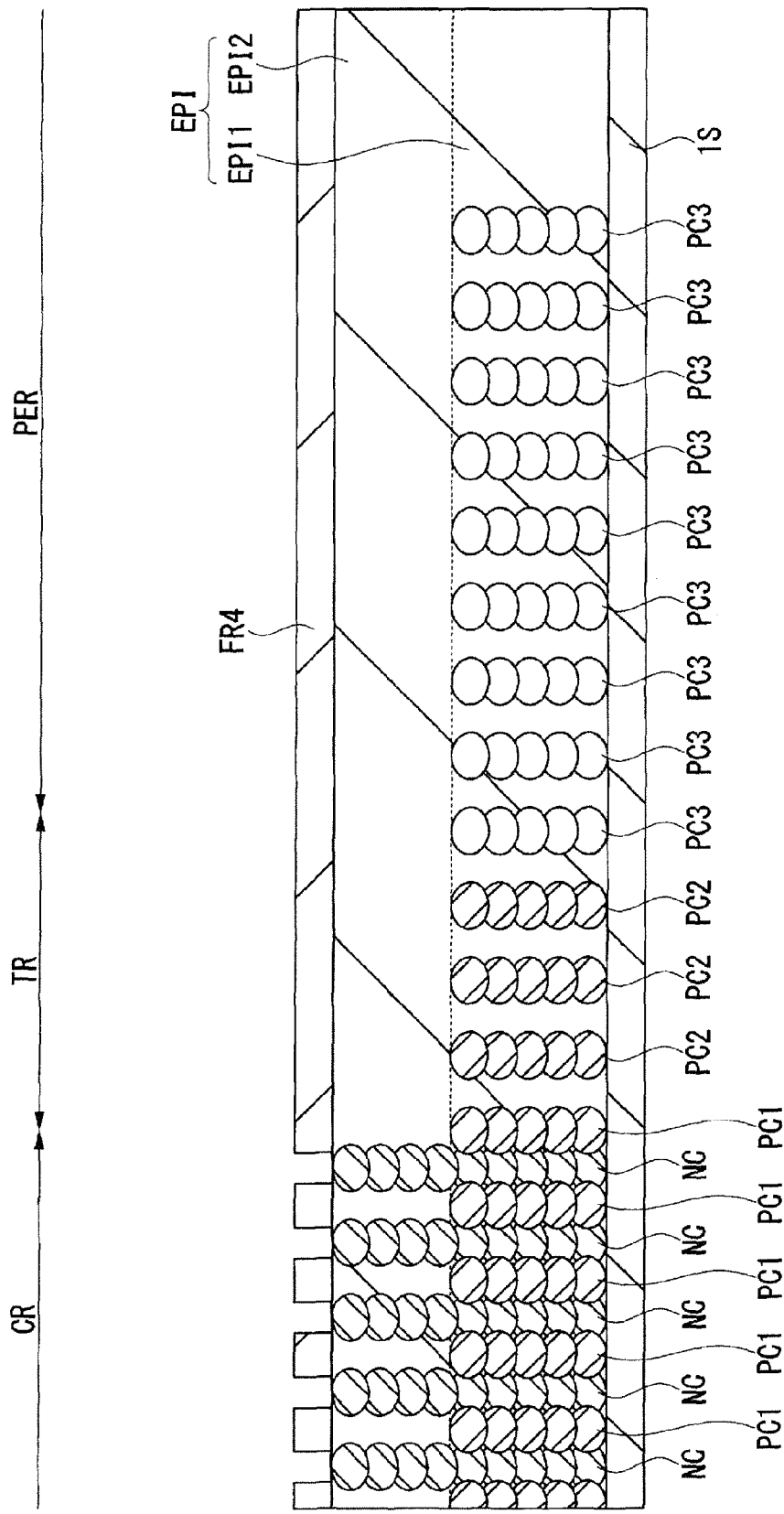
FIG. 9 is a cross-sectional view showing a manufacturing step of the semiconductor device following that of FIG. 8.

Next, as shown in FIG. 9 (similar to the step described above referring to FIG. 5), a patterned resist film FR4 is formed on the epitaxial layer EPI2. Through ion implantation with this resist film FR4 as a mask, for example, an n type impurity such as phosphorus (P) or arsenic (As) is introduced into the epitaxial layer EPI2 in the cell region CR. A plurality of n type column regions NC to be electrically coupled to the plurality of n type column regions NC formed in the epitaxial layer EPI1, respectively, is formed in the epitaxial layer EPI2, while being separated from each other. The n type impurity concentration of the n type column regions NC is, for example, about $3.0 \times 10^{15}/cm^3$.

Figure 10:
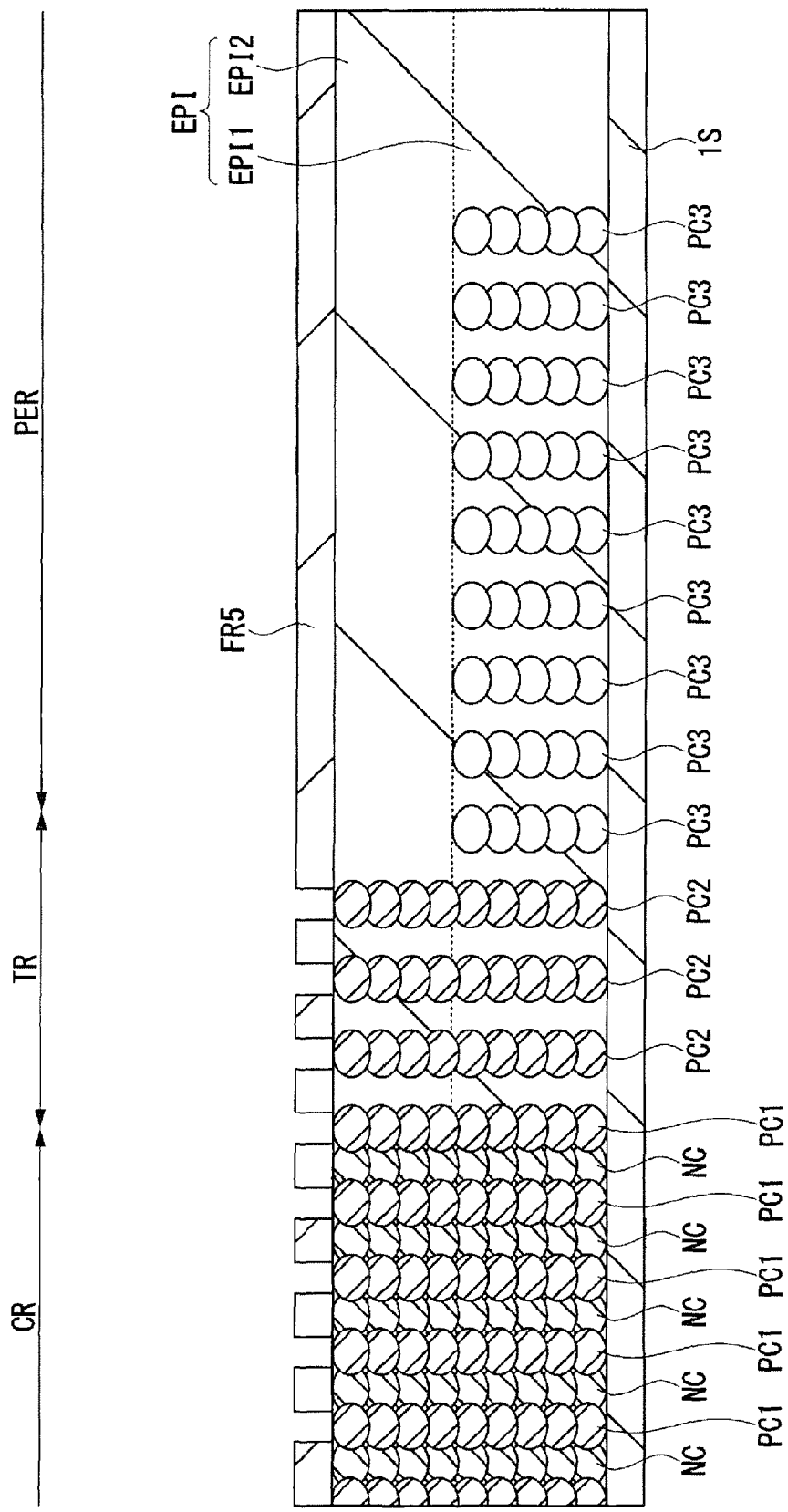
FIG. 10 is a cross-sectional view showing a manufacturing step of the semiconductor device following that of FIG. 9.

Next, as shown in FIG. 10 (similar to the step described above referring to FIG. 6), after removal of the resist film FR4, a patterned resist film FR5 is formed on the epitaxial layer EPI2. Through ion implantation with this resist film FR5 as a mask, for example, a p type impurity such as boron (B) is introduced into the epitaxial layer EPI2 in the cell region CR and the transition region TR. In the cell region CR, a plurality of first p type column regions PC1 to be electrically coupled to the plurality of first p type column regions PC1 formed in the epitaxial layer EPI1, respectively, are thereby formed in the epitaxial layer EPI2, while being separated from each other. In the transition region TR, a plurality of second p type column regions PC2 to be electrically coupled to the plurality of second p type column regions PC2 formed in the epitaxial layer EPI1, respectively, is formed in the epitaxial layer EPI2, while being separated from each other. The p type impurity concentration of the first p type column regions PC1 and the second p type column regions PC2 are, for example, about $3.0 \times 10^{15}/cm^3$. The first p type column regions PC1 and the second p type column regions PC2 are formed so as to keep a charge balance in each of the cell region CR and the transition region TR.

As a result, according to First Embodiment, a superjunction structure having alternately arranged first p type column regions PC1 and n type column regions NC is formed in the cell region CR, while a superjunction structure having alternately arranged second p type column regions PC2 and n type column regions comprised of the epitaxial layer EPI1 or EPI2 is formed in the transition region TR.

Figure 11:
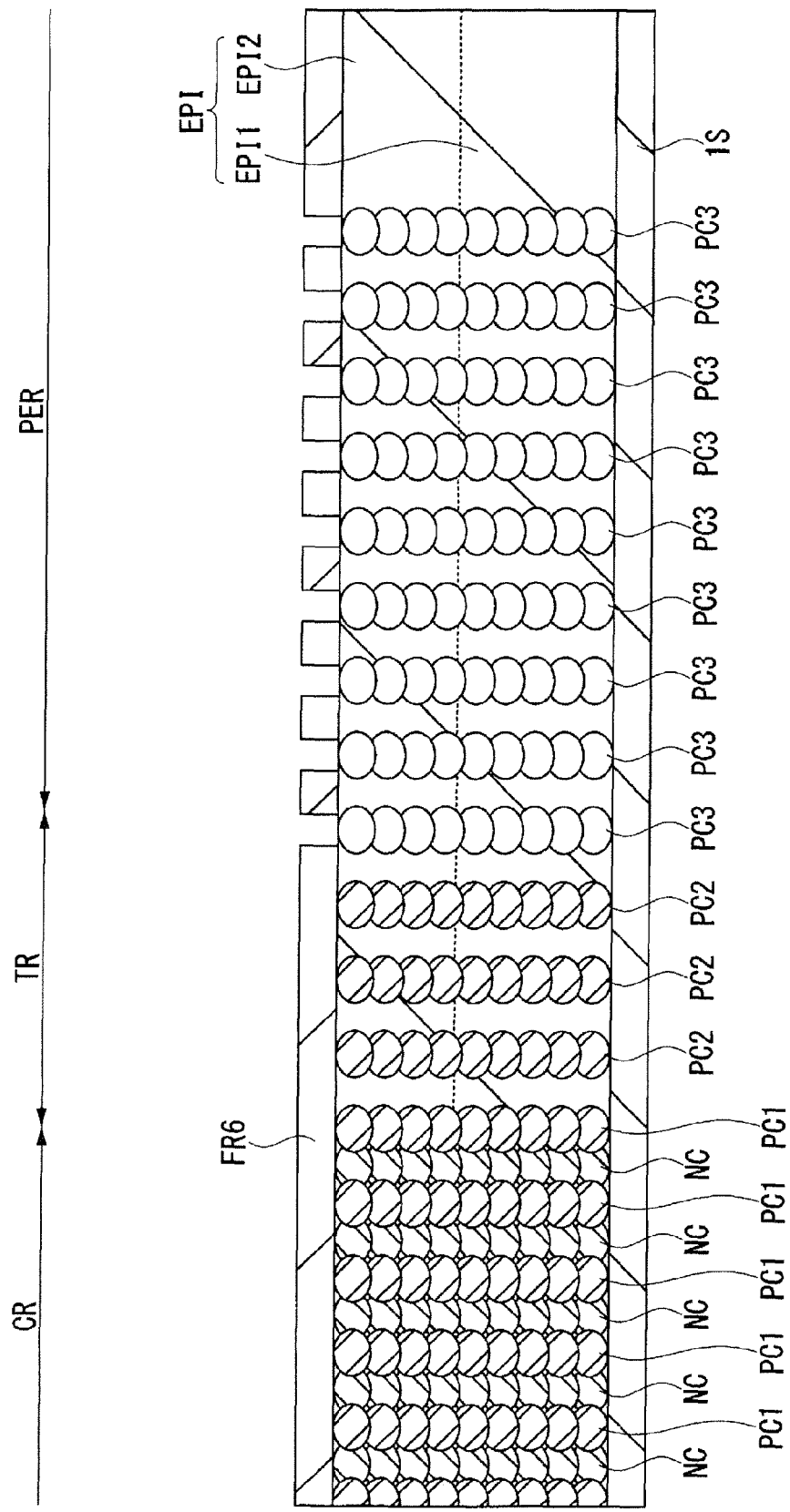
FIG. 11 is a cross-sectional view showing a manufacturing step of the semiconductor device following that of FIG. 10.

Next, as shown in FIG. 11 (similar to the step described above referring to FIG. 7), after removal of the resist film FR5, a patterned resist film FR6 is formed on the epitaxial layer EPI2. Through ion implantation with this resist film FR6 as a mask, for example, a p type impurity such as boron (B) is introduced into the epitaxial layer EPI2 in the peripheral region PER. In the peripheral region PER, a plurality of third p type column regions PC3 to be electrically coupled to the plurality of third p type column regions PC3 formed in the epitaxial layer EPI1, respectively, is formed in the epitaxial layer EPI2, while being separated from each other. The impurity concentration of the third p type column regions PC3 is, for example, about $2.4 \times 10^{15}/cm^3$, and the third p type column regions PC3 are formed so as to keep a charge balance in the peripheral region PER.

As a result, according to First Embodiment, a superjunction structure having alternately arranged third p type column regions PC3 and n type column regions NC comprised of the epitaxial layer EPI1 or EPI2 is formed in the peripheral region PER.

In First Embodiment, "multi-epitaxial method" in which two epitaxial layers EPI1 and EPI2 are formed separately has been described, but the number of the layers is not limited to it. For example, in devices with a source/drain breakdown voltage (BVdss) of 600V, the epitaxial layer is comprised of from six to seven layers.

In First Embodiment, the epitaxial layers EPI1 and EPI2 each have a thickness of from 22 μm to 25 μm, but their thicknesses depend on the design of a cell pitch. When ion implantation is performed at a high energy, ion distribution usually widens in a direction x (cell pitch), a direction y (depth), and a direction z (length). Even when a mask with a reduced width is used in photolithography, the p type column region has inevitably an increased width. In order to reduce the cell pitch to decrease the on-resistance, a narrow cell pitch can be maintained by decreasing the implantation energy while decreasing the thickness of each of the epitaxial layers EPI1 and EPI2 to from about 3 μm to 5 μm. In order to secure a breakdown voltage, however, it is necessary to form the epitaxial layer EPI from three or more layers and increase the number of ion implantation times. Further, the total thickness of the epitaxial layer EPI comprised of three or more layers needs to be set at, for example, from about 40 μm to 50 μm in First Embodiment. This thickness is necessary for securing a breakdown voltage.

As described above, according to First Embodiment, a superjunction structure can be formed in the epitaxial layers EPI1 and EPI2 by the "multi-epitaxial method".

A step of forming an element portion on the upper surface of the epitaxial layers EPI1 and EPI2 having a superjunction structure therein will next be described.

Figure 12:
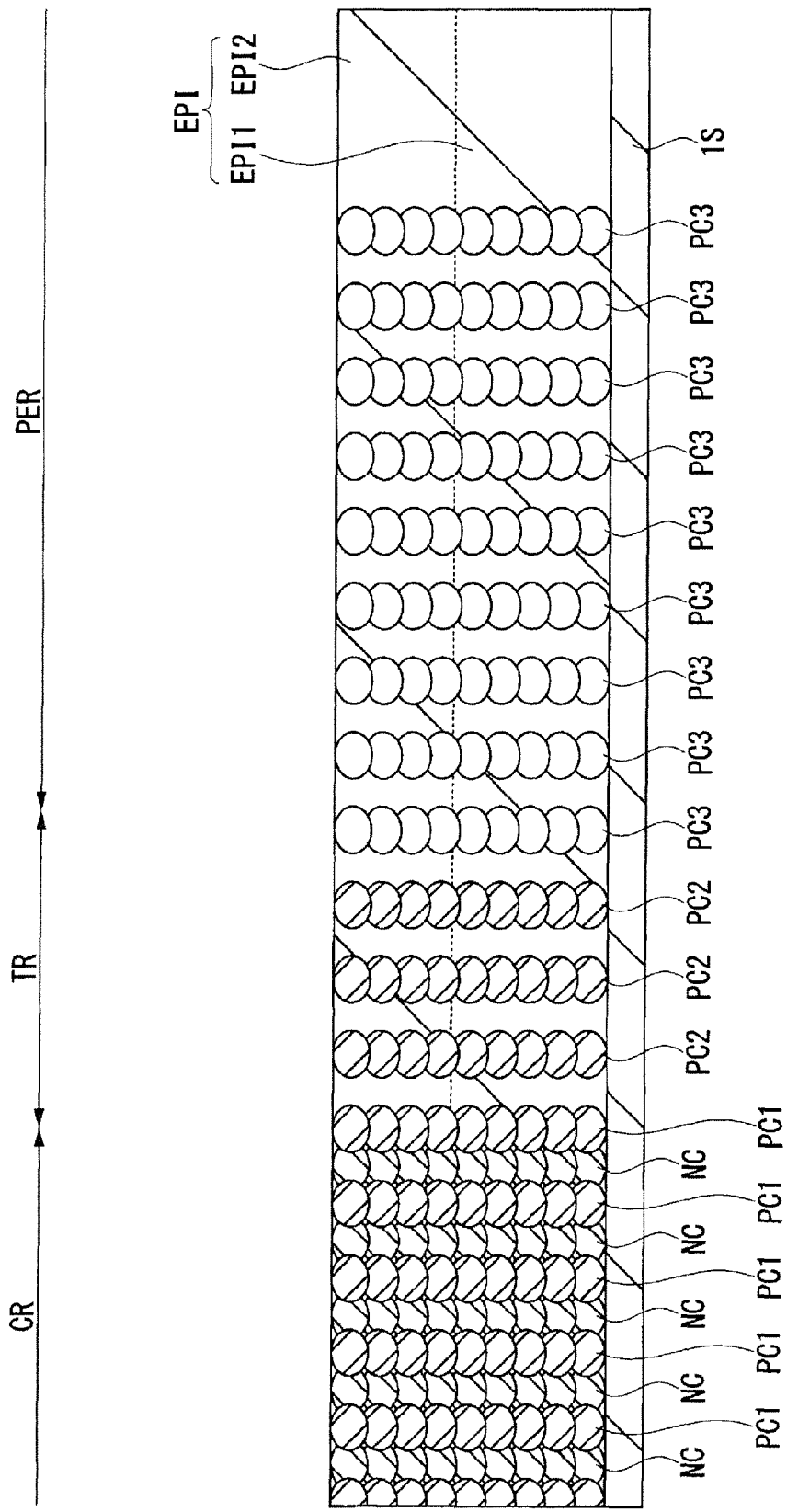
FIG. 12 is a cross-sectional view showing a manufacturing step of the semiconductor device following that of FIG. 11.

First, as shown in FIG. 12, the upper surface of the epitaxial layer EPI2 is planarized.

Figure 13:
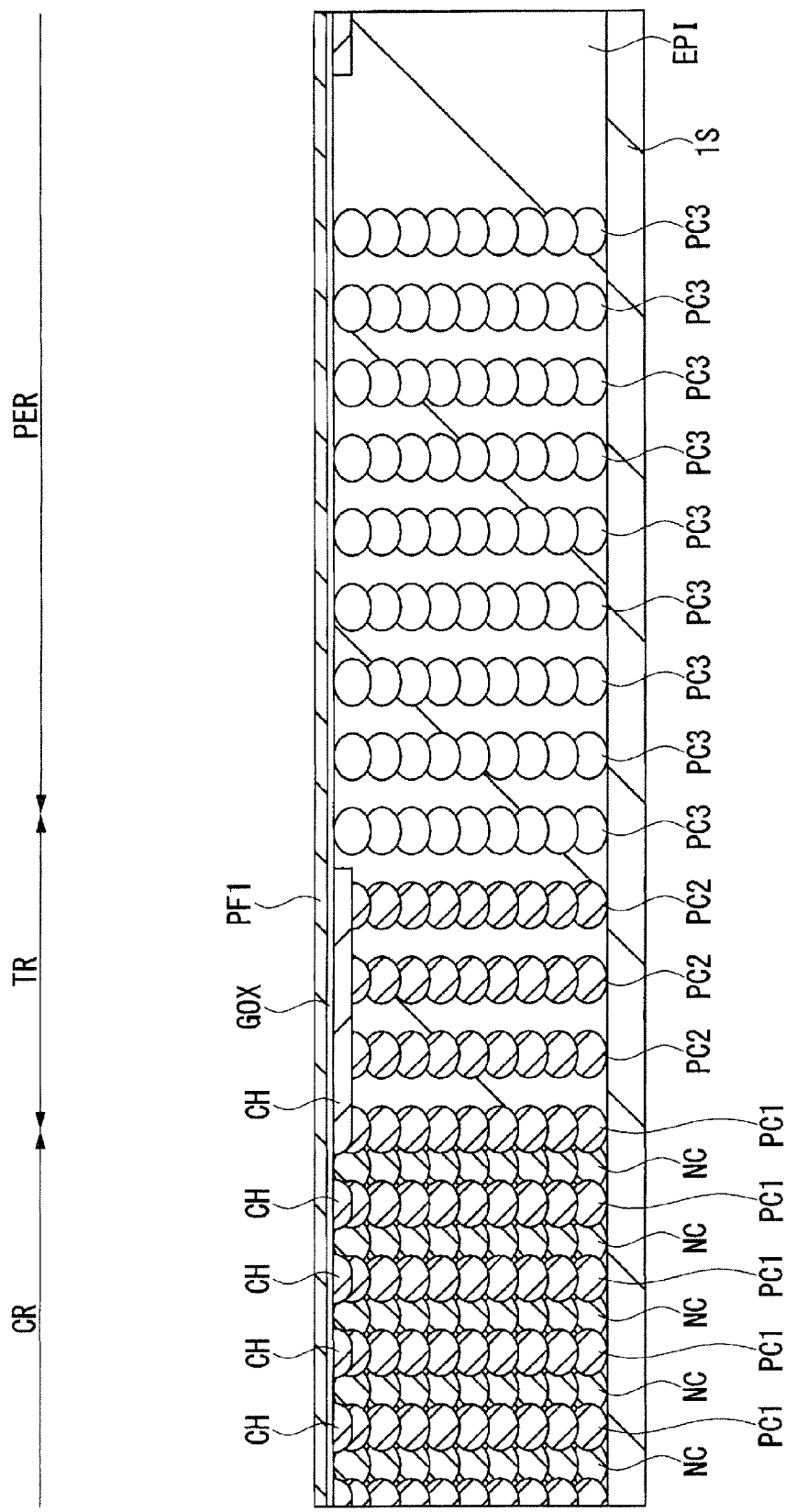
FIG. 13 is a cross-sectional view showing a manufacturing step of the semiconductor device following that of FIG. 12.

Next, as shown in FIG. 13, by photolithography and ion implantation, a channel region CH is formed in the cell region CR and the transition region TR. This channel region CH is a p type semiconductor region formed by introducing, for example, a p type impurity such as boron (B) into the epitaxial layer EPI2. Then, a gate insulating film GOX is formed on the upper surface of the epitaxial layer EPI2, followed by the formation of a conductor film PF1 on the gate insulating film GOX. The gate insulating film GOX is made of, for example, a silicon oxide film and is formed, for example, by thermal oxidation. The gate insulating film GOX is however not limited to a silicon oxide film, but it may be a high dielectric constant film typified by a hafnium oxide film and having a dielectric constant higher than that of a silicon oxide film. The conductor film PF1 to be formed on the gate insulating film GOX is made of, for example, a polycrystalline silicon film and is formed, for example, by CVD (chemical vapor deposition).

Figure 14:
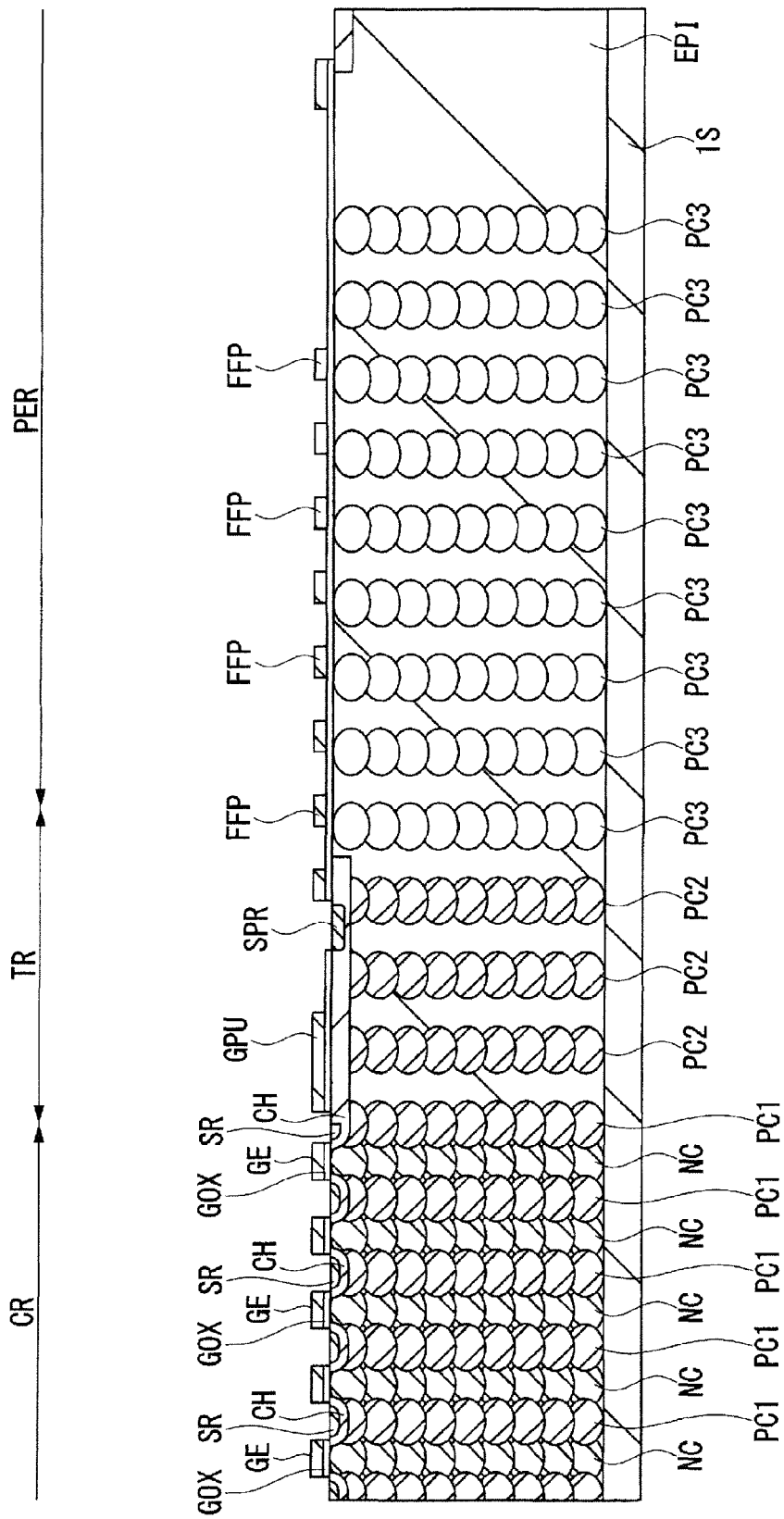
FIG. 14 is a cross-sectional view showing a manufacturing step of the semiconductor device following that of FIG. 13.

As shown in FIG. 14, by photolithography and etching, the conductor film PF1 is then patterned. A plurality of gate electrodes GE is thereby formed in the cell region CR, a gate lead portion GPU is formed in the transition region TR, and a plurality of electrodes (dummy electrodes) FFP is formed in the peripheral region PER. The gate lead portion GPU is electrically coupled to the gate electrodes GE.

Next, by photolithography and ion implantation, a plurality of source regions SR in alignment with the gate electrodes GE is formed in the cell region CR and a source lead region SPR is formed in the transition region TR. The source regions SR and the source lead region SPR are n type semiconductor regions formed by introducing, for example, an n type impurity such as phosphorus (P) or arsenic (As) into the epitaxial layer EPI2. The source regions SR formed in the cell region CR are electrically coupled to the source lead region SPR formed in the transition region TR.

Figure 15:
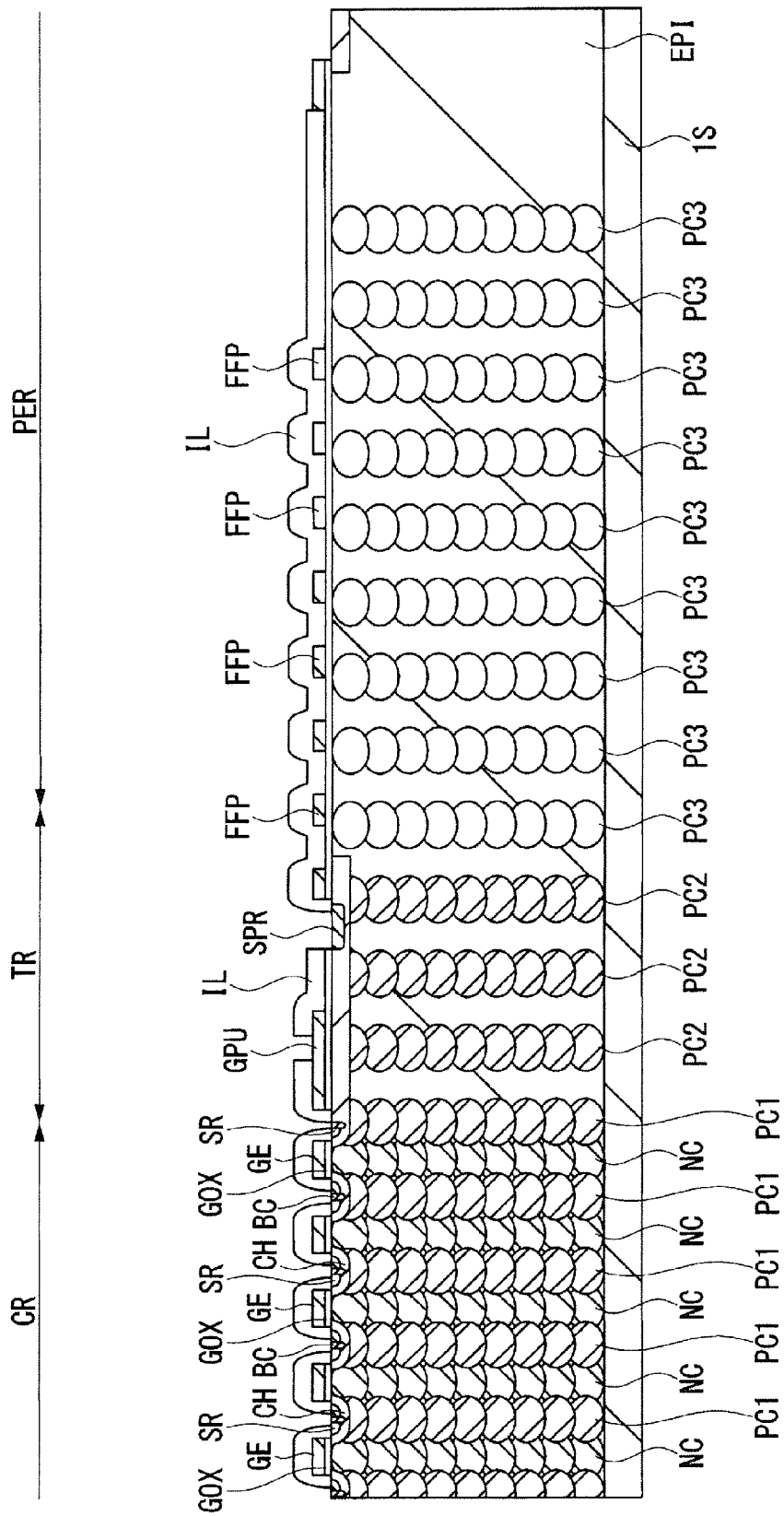
FIG. 15 is a cross-sectional view showing a manufacturing step of the semiconductor device following that of FIG. 14.

Next, as shown in FIG. 15, an interlayer insulating film IL covering therewith the gate electrodes GE, the gate lead portion GPU, and the electrodes (dummy electrodes) FFP is formed on the epitaxial layer EPI2. This interlayer insulating film IL is made of, for example, a silicon oxide film and is formed, for example, by CVD.

Next, by photolithography and etching, an opening portion having a bottom reaching the source region SR is formed in the interlayer insulating film IL between the gate electrodes GE adjacent to each other in the cell region CR. At the same time, an opening portion exposing a portion of the gate lead portion GPU of the transition region TR therefrom is formed. In the transition region TR, the source lead region SPR is exposed by forming an opening portion in the interlayer insulating film IL.

Next, by photolithography and ion implantation, a body contact region BC having a bottom reaching the channel region CH is formed at the center portion of each of the source regions SR in the cell region CR. This body contact region BC is a p type semiconductor region formed by introducing, for example, a p type impurity such as boron (B) into the epitaxial layer EPI2 and it is formed so as to make the impurity concentration of the body contact region BC higher than the impurity concentration of the channel region CH.

Figure 16:
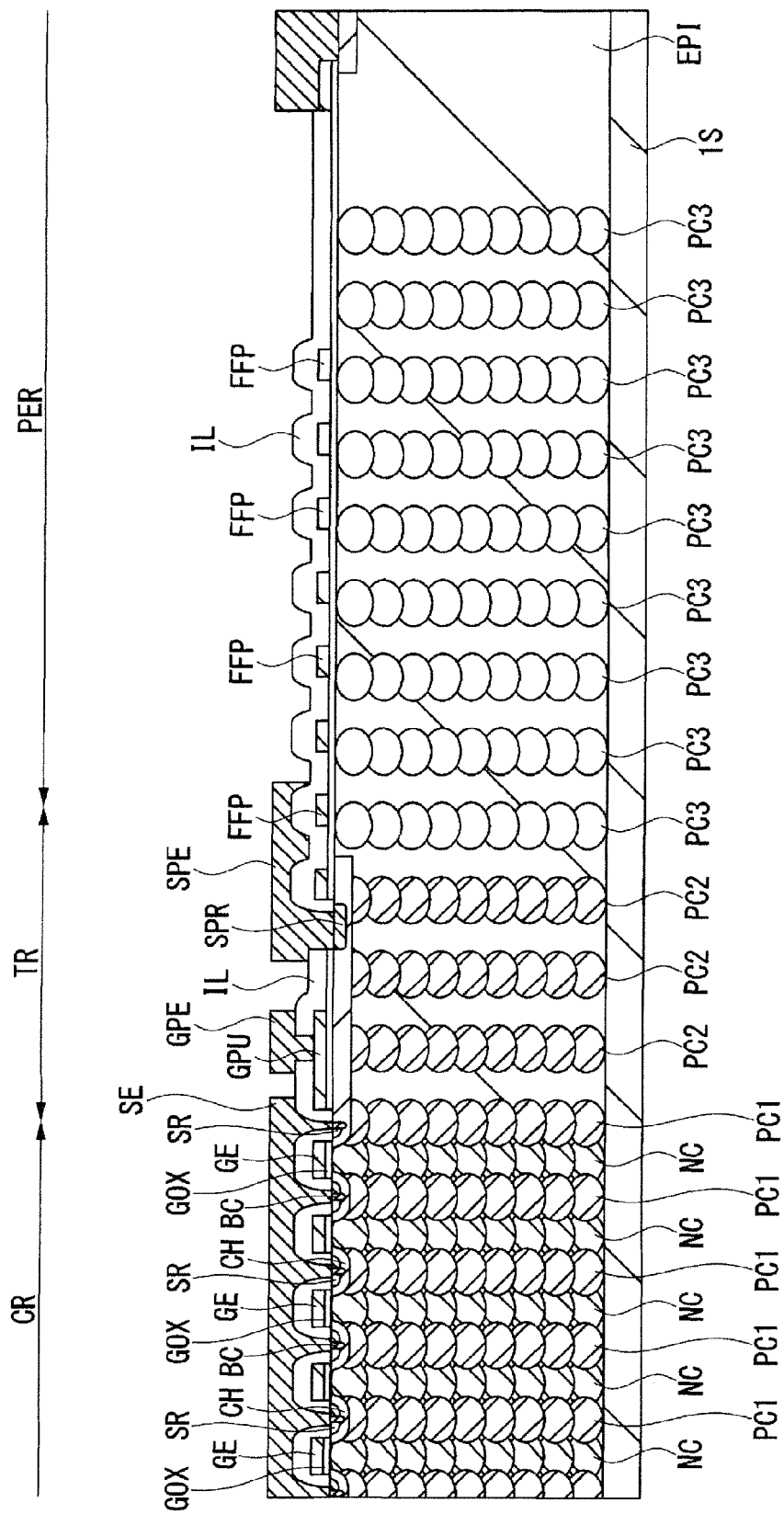
FIG. 16 is a cross-sectional view showing a manufacturing step of the semiconductor device following that of FIG. 15.

Next, as shown in FIG. 16, a metal film is formed on the interlayer insulating film IL including the opening portion exposing the source region SR therefrom, the opening portion exposing the gate lead portion GPU therefrom, and the opening portion exposing the source lead region SPR therefrom. This metal film is made of a stacked film of, for example, a titanium tungsten film and an aluminum film and is formed, for example, by sputtering.

Then, by photolithography and etching, the metal film is patterned. A source electrode SE to be electrically coupled to the source region SR and the body contact region BC is thereby formed in the cell region CR. In the transition region TR, a gate lead electrode GEP to be electrically coupled to the gate lead portion GPU and a source lead electrode SPE to be electrically coupled to the source lead region SPR are formed.

Figure 17:
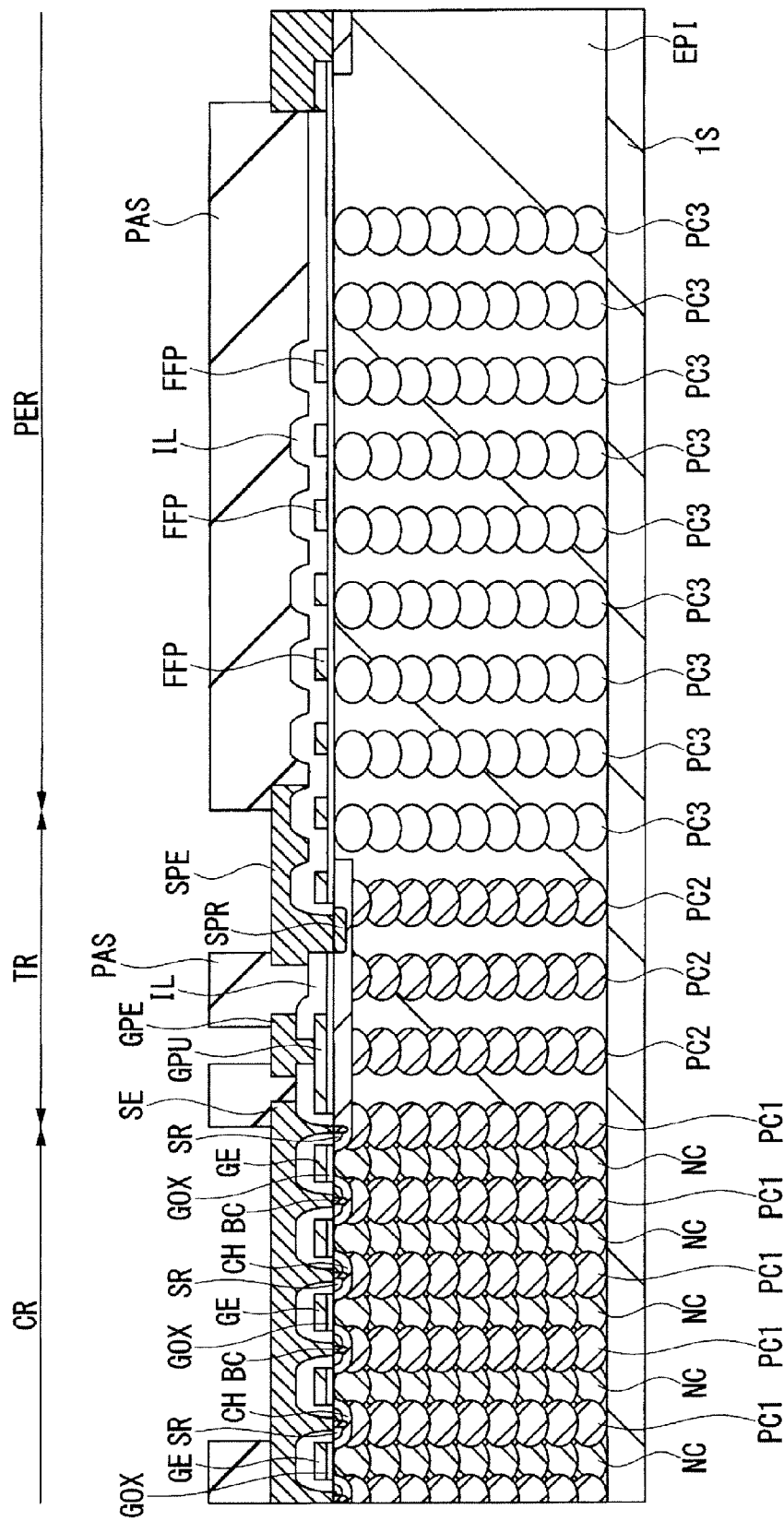
FIG. 17 is a cross-sectional view showing a manufacturing step of the semiconductor device following that of FIG. 16.

Next, as shown in FIG. 17, a surface protective film PAS is formed so as to cover the source electrode SE, the gate lead electrode GPE, and the source lead electrode SPE. By photolithography and etching, the surface protective film PAS is patterned to expose a partial region of the source electrode SE, a partial region of the gate lead electrode GPE, and a partial region of the source lead electrode SPE from the surface protective film PAS. The regions exposed from the surface protective film PAS can be functioned as an external coupling region.

Figure 18:
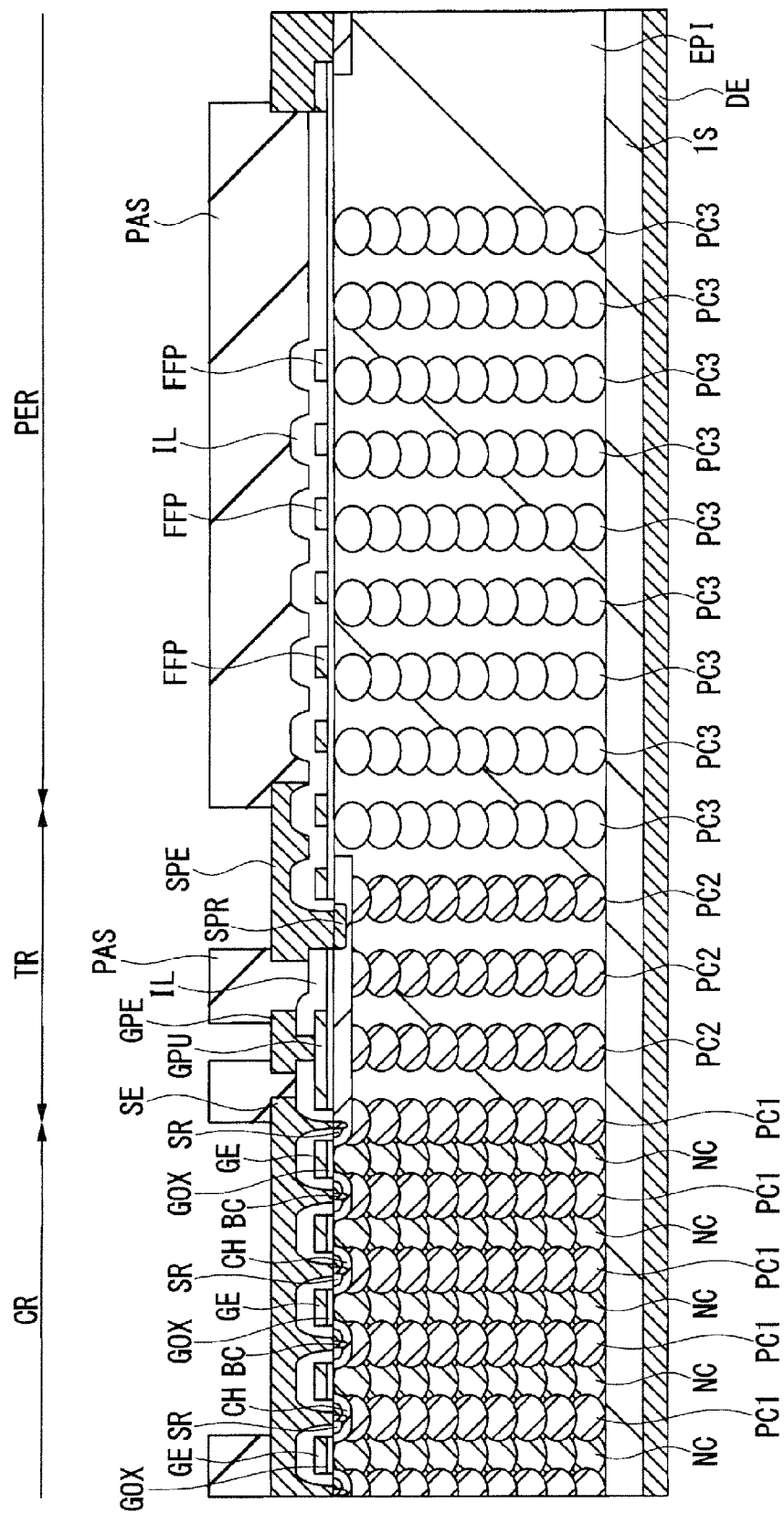
FIG. 18 is a cross-sectional view showing a manufacturing step of the semiconductor device following that of FIG. 17.

Next, as shown in FIG. 18, the semiconductor substrate 1S is polished from the back surface, that is, a surface of the semiconductor substrate 1S on the side opposite to the main surface to thin the semiconductor substrate 1S. A metal film which will be a drain electrode DE is formed by sputtering or vapor deposition on the back surface of the semiconductor substrate 1S. As described above, a semiconductor device having a power MOSFET with a superjunction structure according to First Embodiment can be manufactured.

(Second Embodiment)

In First Embodiment, an application example of a novel technical concept to a power MOSFET with a superjunction structure formed by the "multi-epitaxial method" has been described. In Second Embodiment, on the other hand, an application example of a novel technical concept to a power MOSFET with a superjunction structure to be formed by "trench fill method" will be described.

<Constitution of Semiconductor Device>

Figure 19:
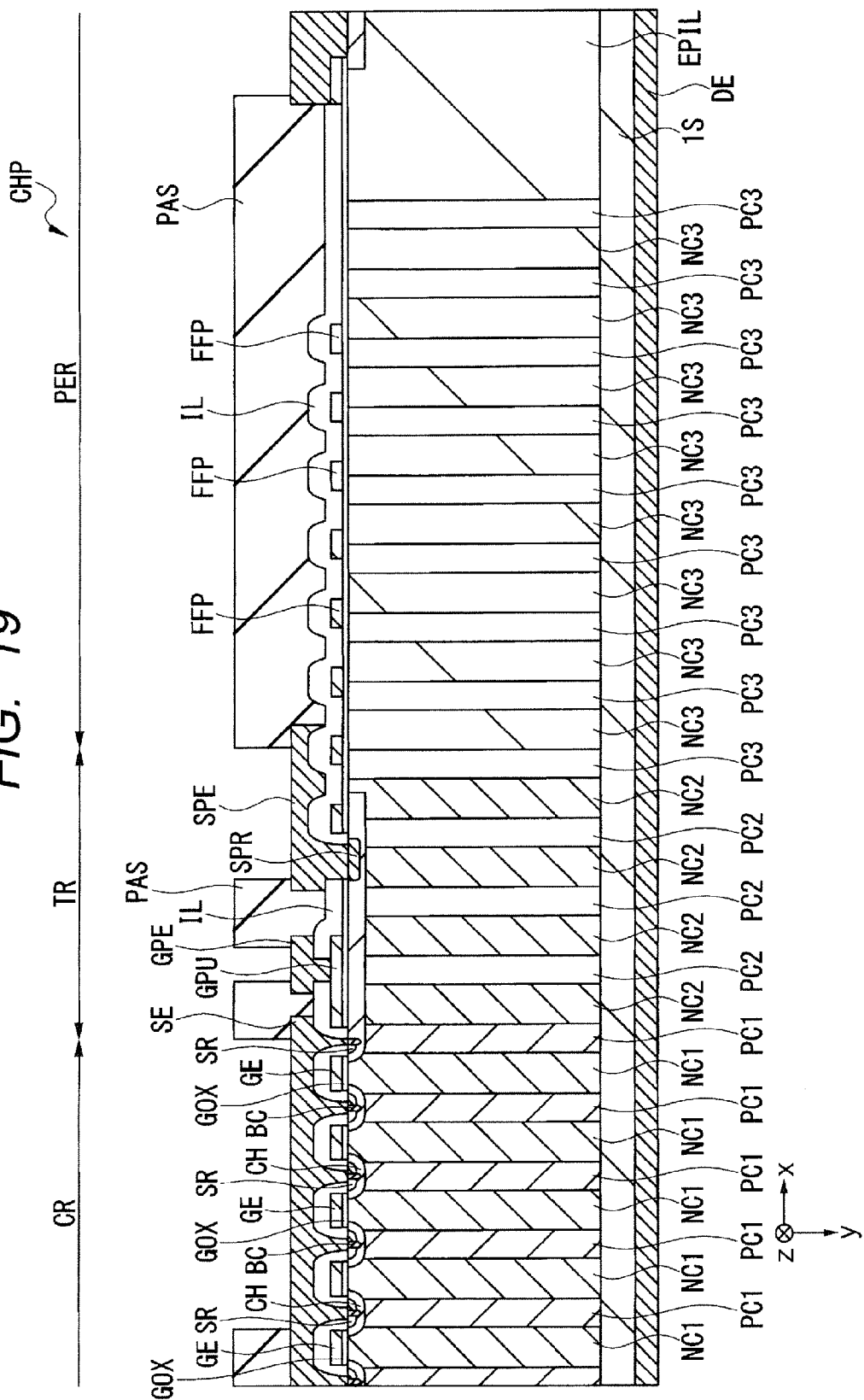
FIG. 19 is a cross-sectional view showing the constitution of a semiconductor device according to Second Embodiment.

FIG. 19 is a cross-sectional view showing the constitution of a semiconductor device (power MOSFET) according to Second Embodiment. The power MOSFET according to Second Embodiment shown in FIG. 19 has an almost similar constitution to that of the power MOSFET of First Embodiment shown in FIG. 2 so that mainly a difference between them will hereinafter be described.

In the semiconductor device according to Second Embodiment, a plurality of first p type column regions PC1 in the cell region CR, a plurality of second p type column regions PC2 in the transition region TR, and a plurality of third p type column regions PC3 in the peripheral region PER are formed by filling a trench with a p type semiconductor film. This is a difference from the semiconductor device (refer to FIG. 2) according to First Embodiment obtained by forming the first p type column regions PC1, the second p type column regions PC2, the third p type column regions PC3, and the n type column regions NC by ion implantation. The functions themselves of the first p type column regions PC1, the second p type column regions PC2, and the third p type column regions PC3 are however similar to those of the semiconductor device of First Embodiment.

Also the semiconductor device according to Second Embodiment is characterized in that the n type impurity concentration (Nn) of first n type column regions NC1 in the cell region CR is made higher than the n type impurity concentration (Nep) of third n type column regions NC3 in the peripheral region PER; and that a charge balance is kept in each of the cell region CR, the transition region TR, and the peripheral region PER. Further, it is characterized in that each total electric charge is set so that total electric charges (CQp, CQn) in the cell region CR exceed total electric charges (TQp, TQn) in the transition region TR and total electric charges (TQp, TQn) in the transition region TR exceed total electric charges (PEQp, PEQn) in the peripheral region PER.

In short, as in First Embodiment, a semiconductor device including a power MOSFET with a superjunction structure according to Second Embodiment can have improved reliability.

<Method of Manufacturing Semiconductor Device>

One example of a method of manufacturing the semiconductor device (power MOSFET) according to Second Embodiment will next be described referring to FIGS. 20 to 32. FIGS. 20 to 32 are cross-sectional views showing manufacturing steps of the semiconductor device according to Second Embodiment. In Second Embodiment, a manufacturing method so-called "trench fill method" will be described. In the semiconductor device exemplified herein, the breakdown voltage of pn junction in the cell region is from 600V to 650V and the breakdown voltage of pn junction in the peripheral region is from 700V to 750V. This means that in this semiconductor device, the breakdown voltage of pn junction in the peripheral region is higher by about from 50V to 150V than the breakdown voltage of pn junction in the cell region. Column regions formed in the cell region, the transition region, and the peripheral region have the same length and same depth.

Figure 20:
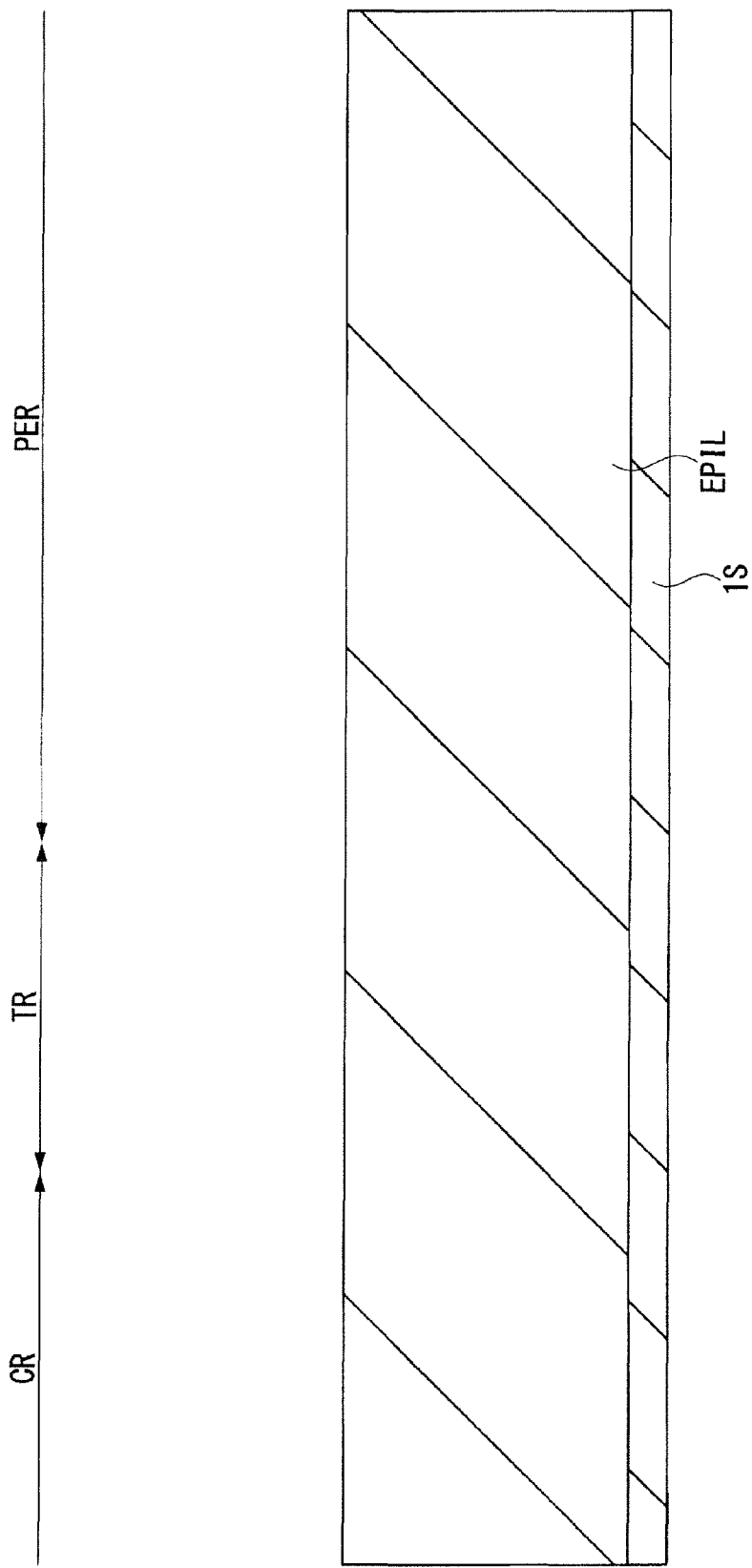
FIG. 20 is a cross-sectional view showing a manufacturing step of the semiconductor device according to Second Embodiment.

First, as shown in FIG. 20, a semiconductor substrate 1S having, on the main surface (surface, upper surface), an epitaxial layer EPIL made of an n type semiconductor layer and having a low impurity concentration is provided. This semiconductor substrate 1S is formed by introducing, for example, an n type impurity such as phosphorus (P) or arsenic (As) into single crystal silicon. The epitaxial layer EPIL has an n type impurity concentration of, for example, about $2.4 \times 10^{15}/cm^3$ and the epitaxial layer EPIL has a thickness of, for example, from about 40 μm to 50 μm.

Figure 21:
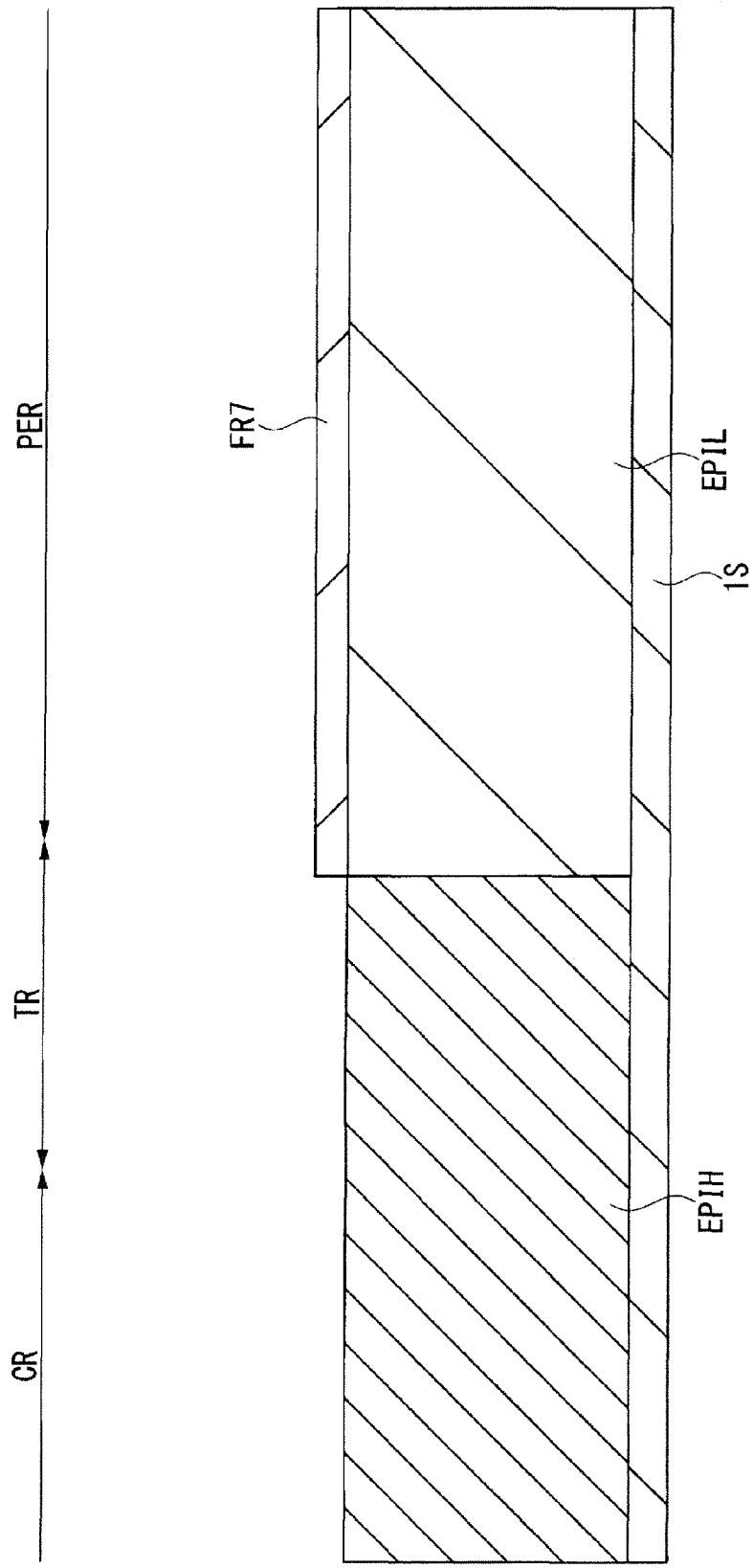
FIG. 21 is a cross-sectional view showing a manufacturing step of the semiconductor device following that of FIG. 20.

Next, as shown in FIG. 21, a patterned resist film FR7 is formed on the epitaxial layer EPIL. The resist film FR7 is formed so as to cover the upper surface of the epitaxial layer EPIL in the peripheral region PER.

By ion implantation with the patterned resist film FR7 as a mask, for example, an n type impurity such as phosphorus (P) is introduced into the epitaxial layer EPIL in the cell region CR and the transition region TR. Then, annealing is performed to diffuse the n type impurity introduced into the epitaxial layer EPIL to form an epitaxial layer EPIH having a high impurity concentration in the cell region CR and the transition region TR. The epitaxial layer EPIH has an n type impurity concentration of, for example, about $3.0 \times 10^{15}/cm^3$.

Figure 22:
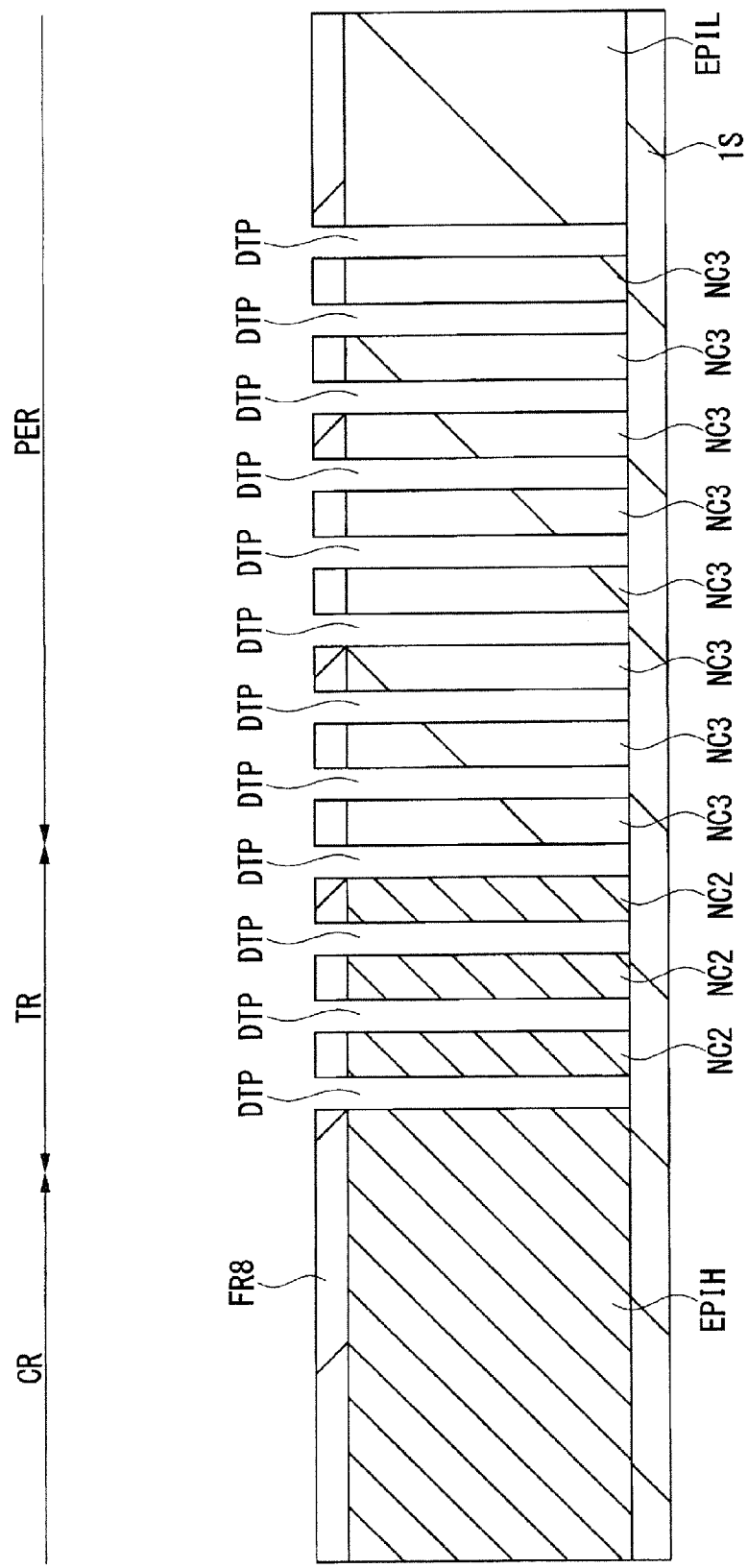
FIG. 22 is a cross-sectional view showing a manufacturing step of the semiconductor device following that of FIG. 21.

Next, as shown in FIG. 22, after removal of the resist film FR7, a patterned resist film FR8 is formed on the epitaxial layers EPIH and EPIL. The resist film FR8 is formed so as to expose a second p type column formation region in the transition region TR and a third p type column formation region in the peripheral region PER and cover the upper surface of the epitaxial layers EPIH and EPIL in the other regions including the cell region CR.

By etching with the patterned resist film FR8 as a mask, a plurality of trenches DTP is formed in the epitaxial layer EPIH in the transition region TR and the epitaxial layer EPIL in the peripheral region PER. The trenches DTP have a taper angle of, for example, from about 88.0 degrees to 90 degrees.

At this time, partial regions of the epitaxial layer EPIH sandwiched between the trenches DTP adjacent to each other become second n type column regions NC2 in the transition region TR, while partial regions of the epitaxial layer EPIL sandwiched between the trenches DTP adjacent to each other become third n type column regions NC3 in the peripheral region PER.

Figure 23:
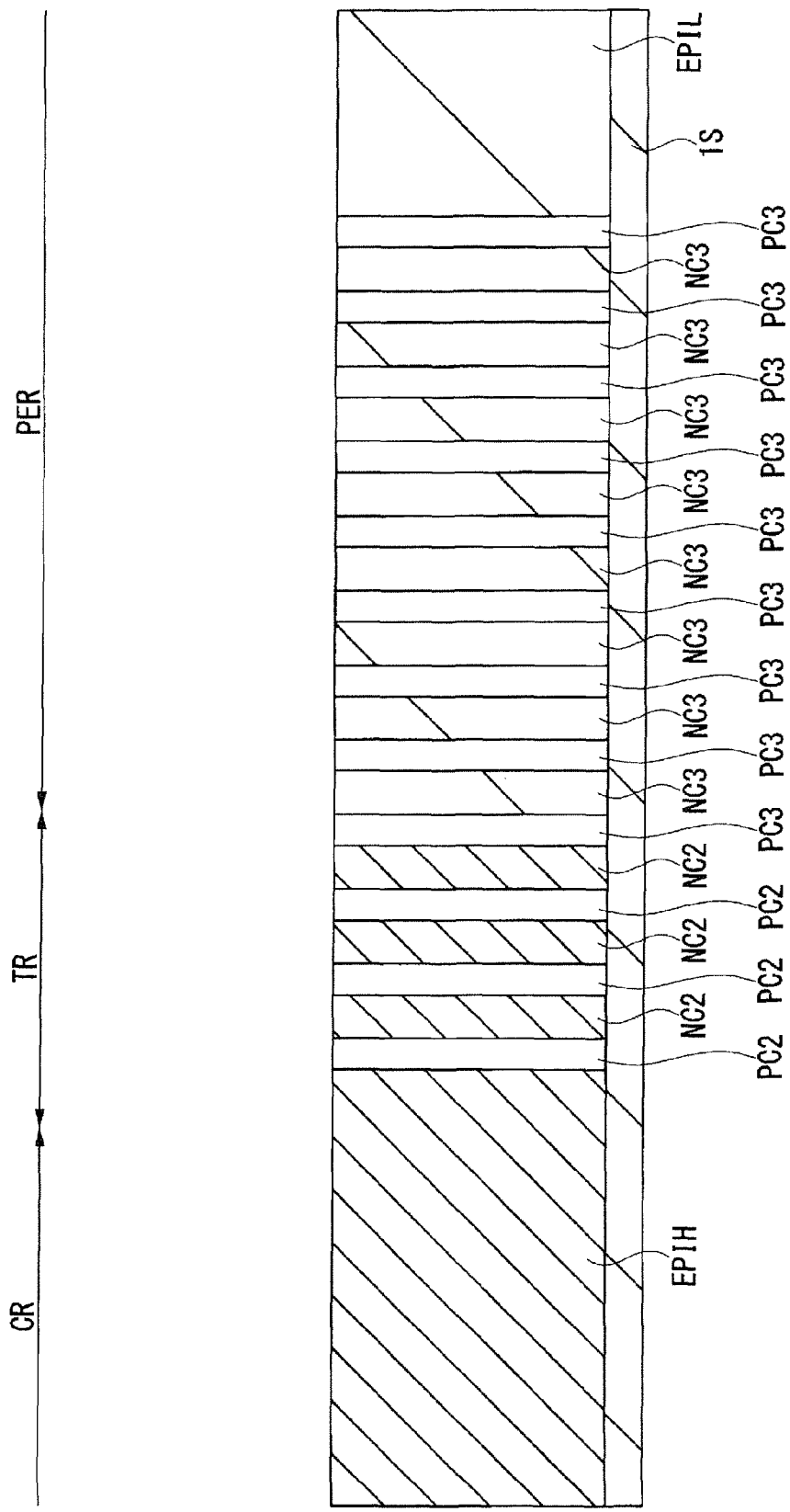
FIG. 23 is a cross-sectional view showing a manufacturing step of the semiconductor device following that of FIG. 22.

Next, as shown in FIG. 23, the resist film FR8 is removed. Then, by trench-fill epitaxial growth, second p type column regions PC2 comprised of a p type semiconductor region are formed in the trench DTP formed in the epitaxial layer EPIH in the transition region TR, while third p type column regions PC3 comprised of a p type semiconductor region are formed in the trench DTP formed in the epitaxial layer EPIL in the peripheral region PER.

The p type impurity concentration, width, and pitch of the third p type column regions PC3 in the peripheral region PER are set to keep a charge balance in the peripheral region PER. As the semiconductor device according to Second Embodiment, shown is an example in which the width of the third p type column regions PC3 and the width of the third n type column regions NC3 in the peripheral region PER are set at 1:1. In this case, the p type impurity concentration of the third p type column regions PC3 is set so as to make the total electric charge (PEQp) of the third p type column regions PC3 equal to the total electric charge (PEQn) of the third n type column region NC3 (PEQp=PEQn). The p type impurity concentration of the third p type column regions PC3 is therefore equal to the n type impurity concentration of the epitaxial layer EPIL constituting the third n type column region NC3 and is, for example, about $2.4 \times 10^{15}/\text{cm}^3$.

Similarly, the p type impurity concentration, width, and pitch of the second p type column regions PC2 in the transition region TR are set to keep a charge balance in the transition region TR. The n type impurity concentration of the second n type column regions NC2 in the transition region TR is, for example, about $3.0 \times 10^{15}/\text{cm}^3$. Since the second p type column regions PC2 and the third p type column regions PC3 are formed by the same step, the p type impurity concentration of the second p type column regions PC2 is, for example, about $2.4 \times 10^{15}/\text{cm}^3$. For example, by making the width of the second p type column regions PC2 larger than the width of the second n type column regions NC2, the total electric charge (TQp) of the second p type column regions PC2 can be made equal to the total electric charge (TQn) of the second n type column regions NC2 (TQp=TQn).

Further, the total electric charge (TQp) of the second p type column regions PC2 in the transition region TR needs to be set larger than the total electric charge (PEQp) of the third p type column regions PC3 in the peripheral region PER (TQp>PEQp). Still further, the total electric charge (TQn) of the n type column regions comprised of the epitaxial layer EPIH in the transition region TR needs to be set larger than the total electric charge (PEQn) of the n type column regions comprised of the epitaxial layer EPIL in the peripheral region PER (TQn>PEQn).

The above setting (TQp>PEQp, TQn>PEQn) can however be achieved by making the n type impurity concentration of the second n type column regions NC2 in the transition region TR higher than the n type impurity concentration of the third n type column regions NC3 in the peripheral region PER and making the width of the second p type column regions PC2 in the transition region TR larger than the width of the third p type column regions PC3 in the peripheral region PER.

As a result, according to Second Embodiment, there are formed a superjunction structure having alternately arranged second p type column regions PC2 and second n type column regions NC2 in the transition region TR and a superjunction structure having alternately arranged third p type column regions PC3 and third n type column regions NC3 in the peripheral region PER.

Figure 24:
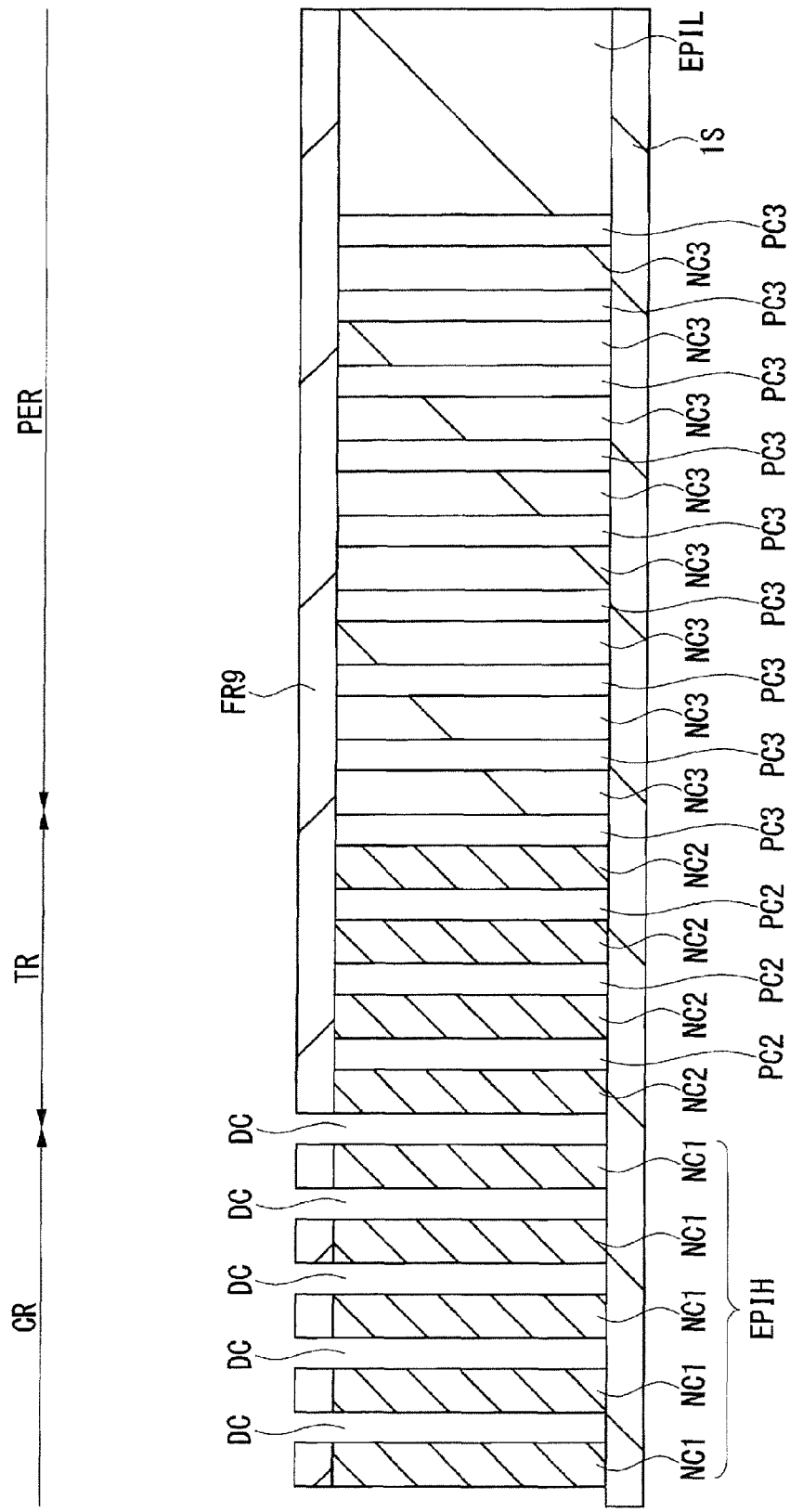
FIG. 24 is a cross-sectional view showing a manufacturing step of the semiconductor device following that of FIG. 23.

Next, as shown in FIG. 24, a patterned resist film FR9 is formed on the epitaxial layers EPIH and EPIL. The resist film FR9 is formed so as to expose the first p type column formation regions in the cell region CR therefrom and cover the upper surface of the epitaxial layers EPIH and EPIL in the other regions including the transition region TR and the peripheral region PER.

By etching with the patterned resist film FR9 as a mask, a plurality of trenches DC is formed in the epitaxial layer EPIH in the cell region CR. The trenches DC have a taper angle of, for example, from about 88.0 degrees to 90 degrees.

In the cell region CR, partial regions of the epitaxial layer EPIH sandwiched between the trenches adjacent to each other become first n type column regions NC1.

Figure 25:
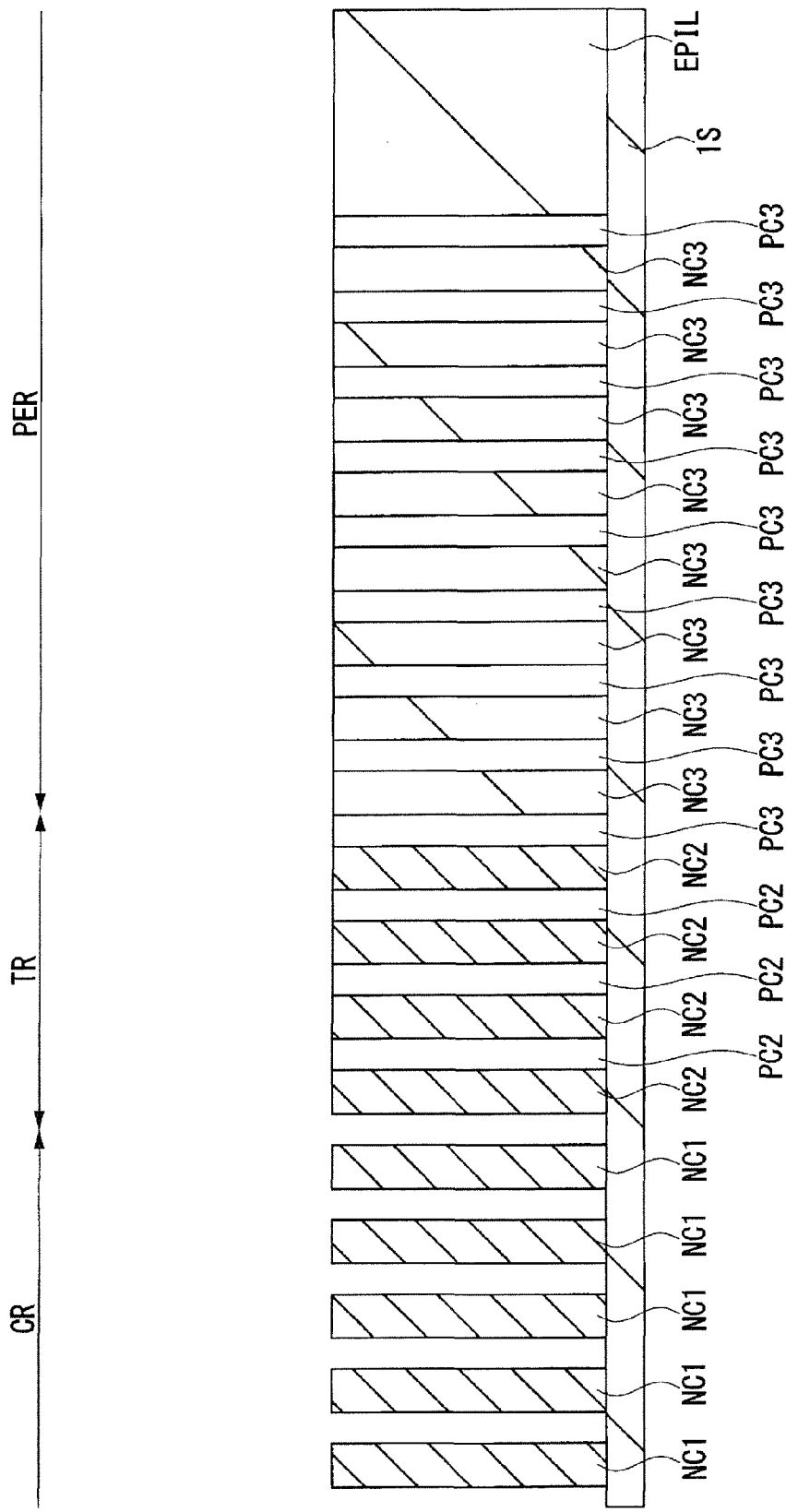
FIG. 25 is a cross-sectional view showing a manufacturing step of the semiconductor device following that of FIG. 24.

Next, as shown in FIG. 25, the resist film FR9 is removed.

Figure 26:
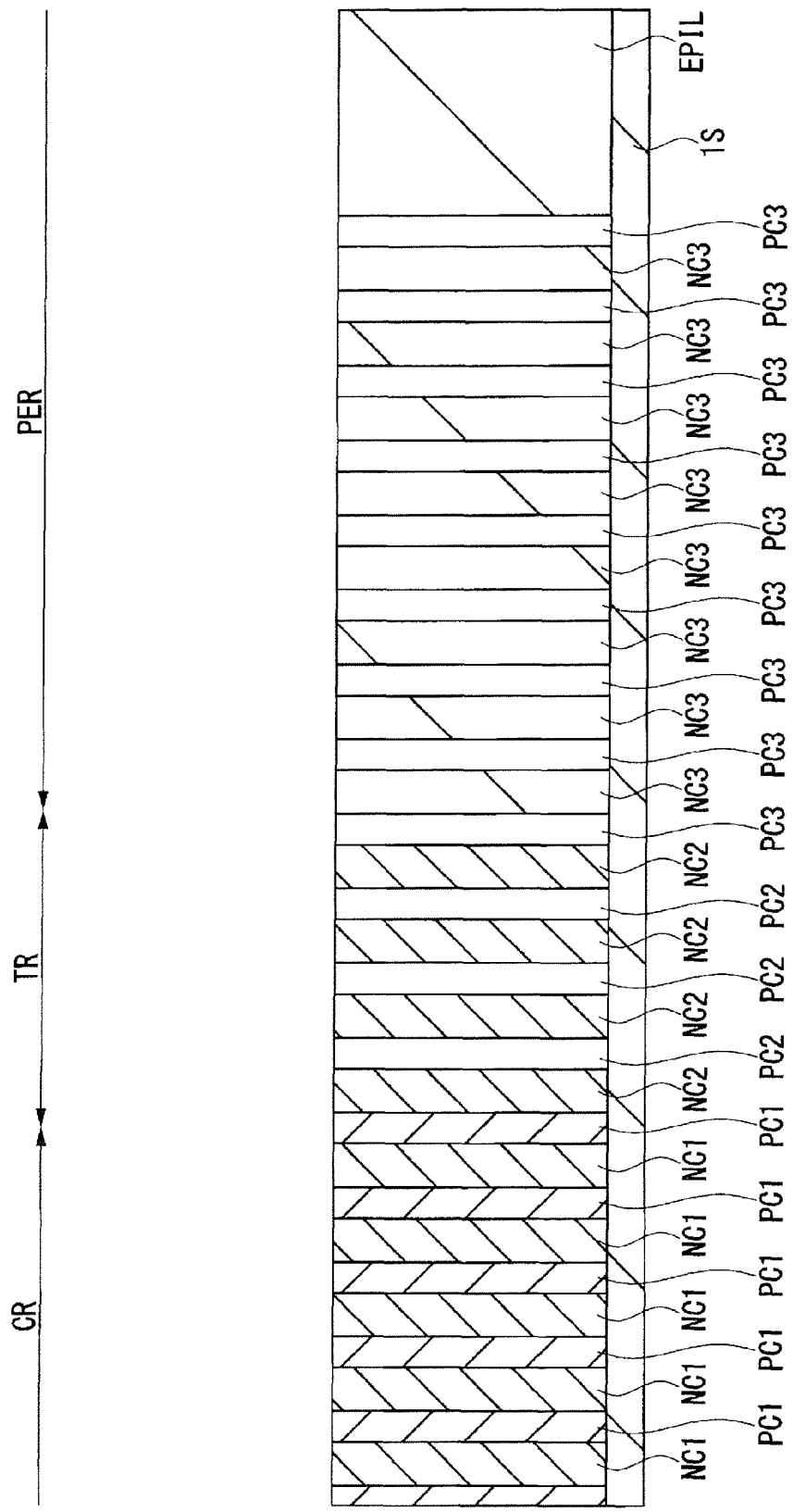
FIG. 26 is a cross-sectional view showing a manufacturing step of the semiconductor device following that of FIG. 25.

Next, as shown in FIG. 26, first p type column regions PC1 comprised of a p type semiconductor region are formed in the trench DC formed in the epitaxial layer EPIH in the cell region CR, for example, by trench-fill epitaxial growth.

The p type impurity concentration, width, and pitch of the first p type column regions PC1 in the cell region CR are set to keep a charge balance in the cell region CR. As the semiconductor device according to Second Embodiment, shown is an example in which the width of the first p type column regions PC1 and the width of the first n type column regions NC1 in the cell region CR are set at 1:1. In this case, the p type impurity concentration of the first p type column region PC1 is set so as to make the total electric charge (CQp) of the first p type column regions PC1 equal to the total electric charge (CQn) of the first n type column regions NC1 (CQp=CQn).

The total electric charge (CQp) of the first p type column regions PC1 in the cell region CR needs to be set larger than the total electric charge (TQp) of the second p type column regions PC2 in the transition region TR (CQp>TQp) and the total electric charge (CQn) of the first n type column regions NC1 in the cell region CR needs to be set larger than the total electric charge (TQn) of the second n type column regions NC2 in the transition region TR (CQn>TQn).

In the semiconductor device according to Second Embodiment, therefore, since the n type impurity concentration of the first n type column regions NC1 in the cell region CR is equal to the n type impurity concentration of the second n type column regions NC2 in the transition TR, the width of the first n type column regions NC1 in the cell region CR is made larger than the width of the second n type column regions NC2 in the transition region TR. Further, the p type impurity concentration of the first p type column regions PC1 in the cell region CR is made higher than the p type impurity concentration of the second p type column regions PC2 in the transition region TR.

As a result, according to Second Embodiment, a superjunction having alternately arranged first p type column regions PC1 and first n type column regions NC1 is formed in the cell region CR.

Next, steps of forming an element portion on the upper surface of the epitaxial layers EPIH and EPIL having a superjunction structure will be described.

First, the upper surface of the epitaxial layers EPIH and EPIL is planarized.

Figure 27:
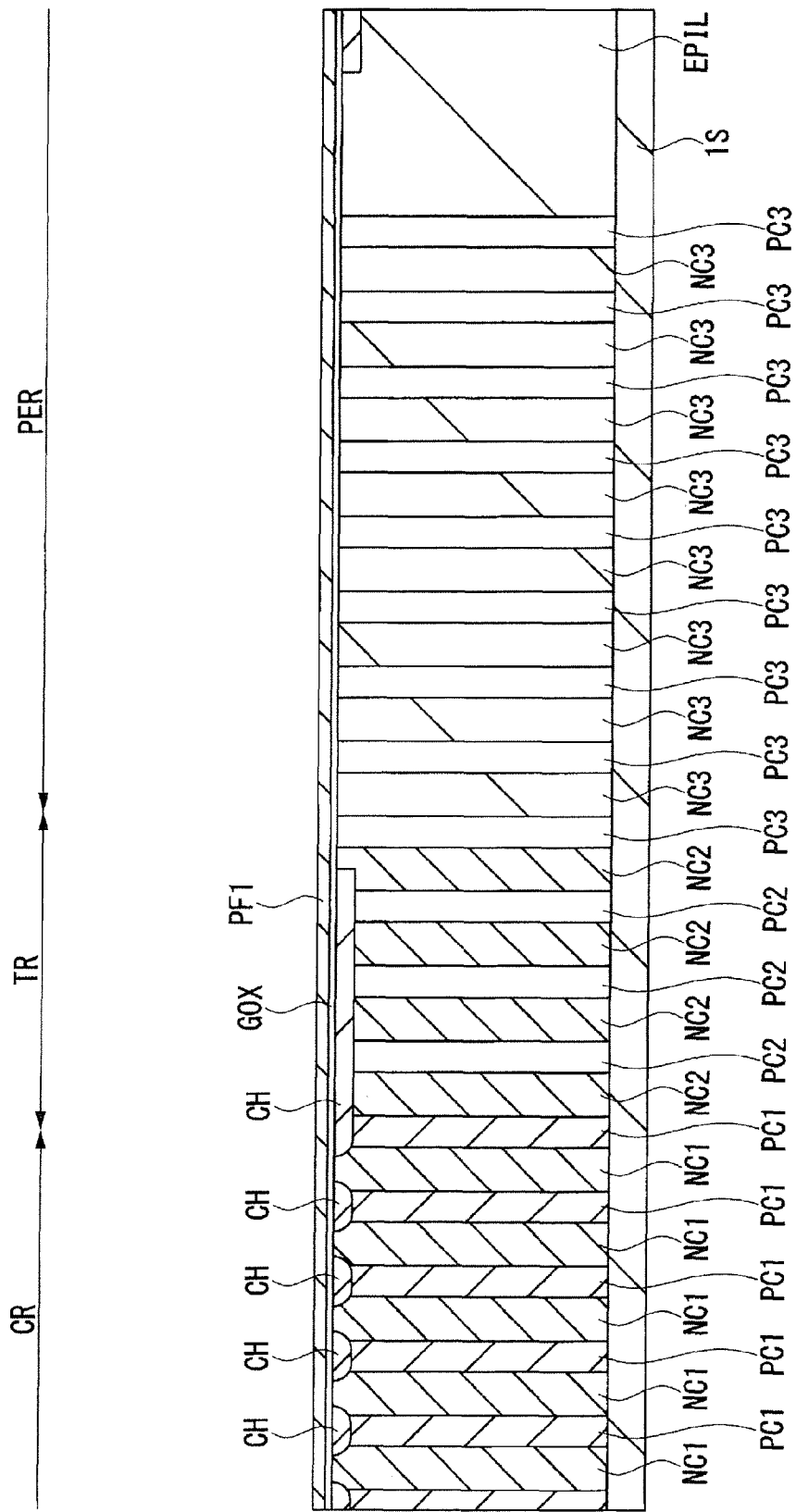
FIG. 27 is a cross-sectional view showing a manufacturing step of the semiconductor device following that of FIG. 26.

Next, as shown in FIG. 27, by photolithography and ion implantation, a channel region CH is formed in the cell region CR and the transition region TR. This channel region CH is a p type semiconductor region formed by introducing, for example, a p type impurity such as boron (B) into the epitaxial layers EPIH and EPIL. Then, a gate insulating film GOX is formed on the upper surface of the epitaxial layers EPIH and EPIL, followed by the formation of a conductor film PF1 on the gate insulating film GOX. The gate insulating film GOX is made of, for example, a silicon oxide film and is formed, for example, by thermal oxidation. The gate insulating film GOX is however not limited to a silicon oxide film and it may be a high dielectric constant film having a dielectric constant higher than that of a silicon oxide film and typified by a hafnium oxide film. The conductor film PF1 to be formed on the gate insulating film GOX is made of, for example, a polycrystalline silicon film and is formed, for example, by CVD.

Figure 28:
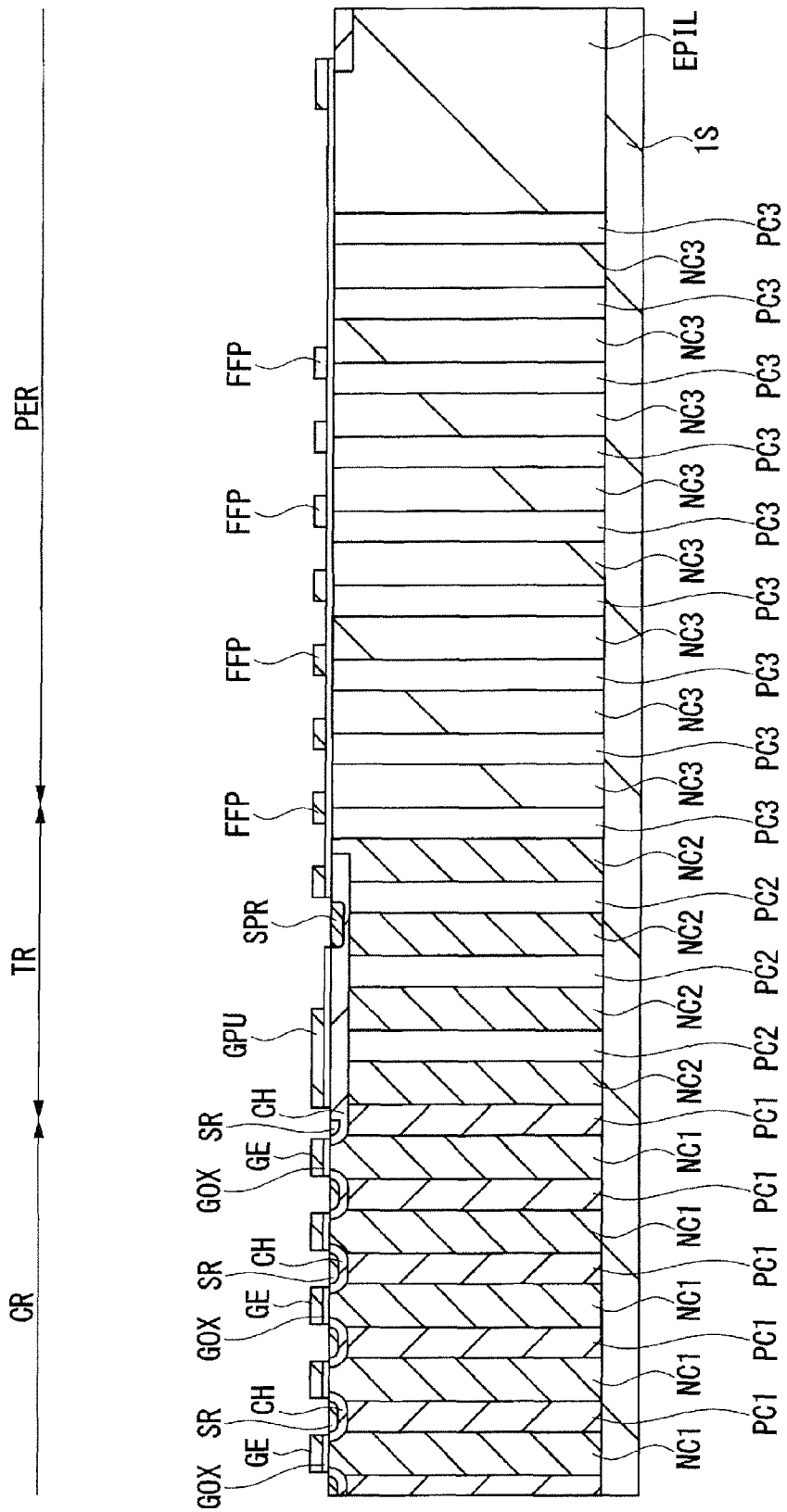
FIG. 28 is a cross-sectional view showing a manufacturing step of the semiconductor device following that of FIG. 27.

Next, as shown in FIG. 28, by photolithography and etching, the conductor film PF1 is patterned. By this patterning, a plurality of gate electrodes GE is formed in the cell region CR, a gate lead portion GPU is formed in the transition region TR, and a plurality of electrodes (dummy electrodes) FFP is formed in the peripheral region PER. The gate lead portion GPU is electrically coupled to the gate electrodes GE.

Next, by photolithography and ion implantation, a plurality of source regions SR in alignment with the gate electrodes GE is formed in the cell region CR and a source lead region SPR is formed in the transition region TR. The source regions SR and the source lead region SPR are n type semiconductor regions formed by introducing, for example, an n type impurity such as phosphorus (P) or arsenic (As) into the epitaxial layers EPIH and EPIL. The source regions SR formed in the cell region CR are electrically coupled to the source lead region SPR formed in the transition region TR.

Figure 29:
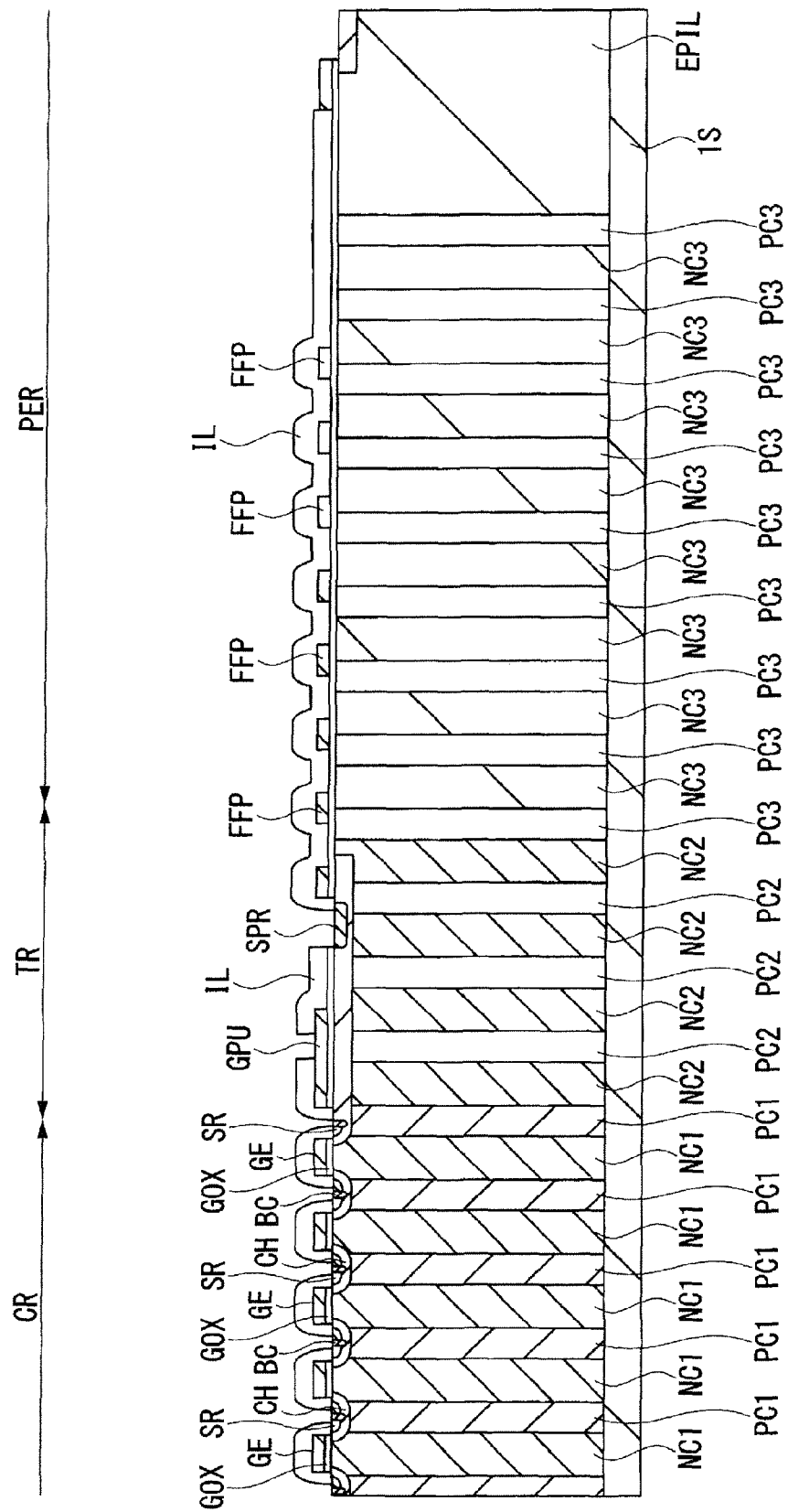
FIG. 29 is a cross-sectional view showing a manufacturing step of the semiconductor device following that of FIG. 28.

Next, as shown in FIG. 29, an interlayer insulating film IL covering therewith the gate electrodes GE, the gate lead portion GPU, and the electrodes (dummy electrodes) FFP is formed on the epitaxial layers EPIH and EPIL. This interlayer insulating film IL is made of, for example, a silicon oxide film and is formed, for example, by CVD.

Next, by photolithography and etching, an opening portion having a bottom reaching the source region SR is formed in the interlayer insulating film IL between the gate electrodes GE adjacent to each other in the cell region CR. At the same time, an opening portion exposing a portion of the gate lead portion GPU of the transition region TR therefrom is formed. In the transition region TR, the source lead region SPR is exposed by forming an opening portion in the interlayer insulating film IL.

Next, by photolithography and ion implantation, a body contact region BC having a bottom reaching the channel region CH is formed at the center portion of each of the source regions SR in the cell region CR. This body contact region BC is a p type semiconductor region formed, for example, by introducing, for example, a p type impurity such as boron (B) into the epitaxial layers EPIH and EPPIL and it is formed so as to make the impurity concentration in the body contact region BC higher than the impurity concentration in the channel region CH.

Figure 30:
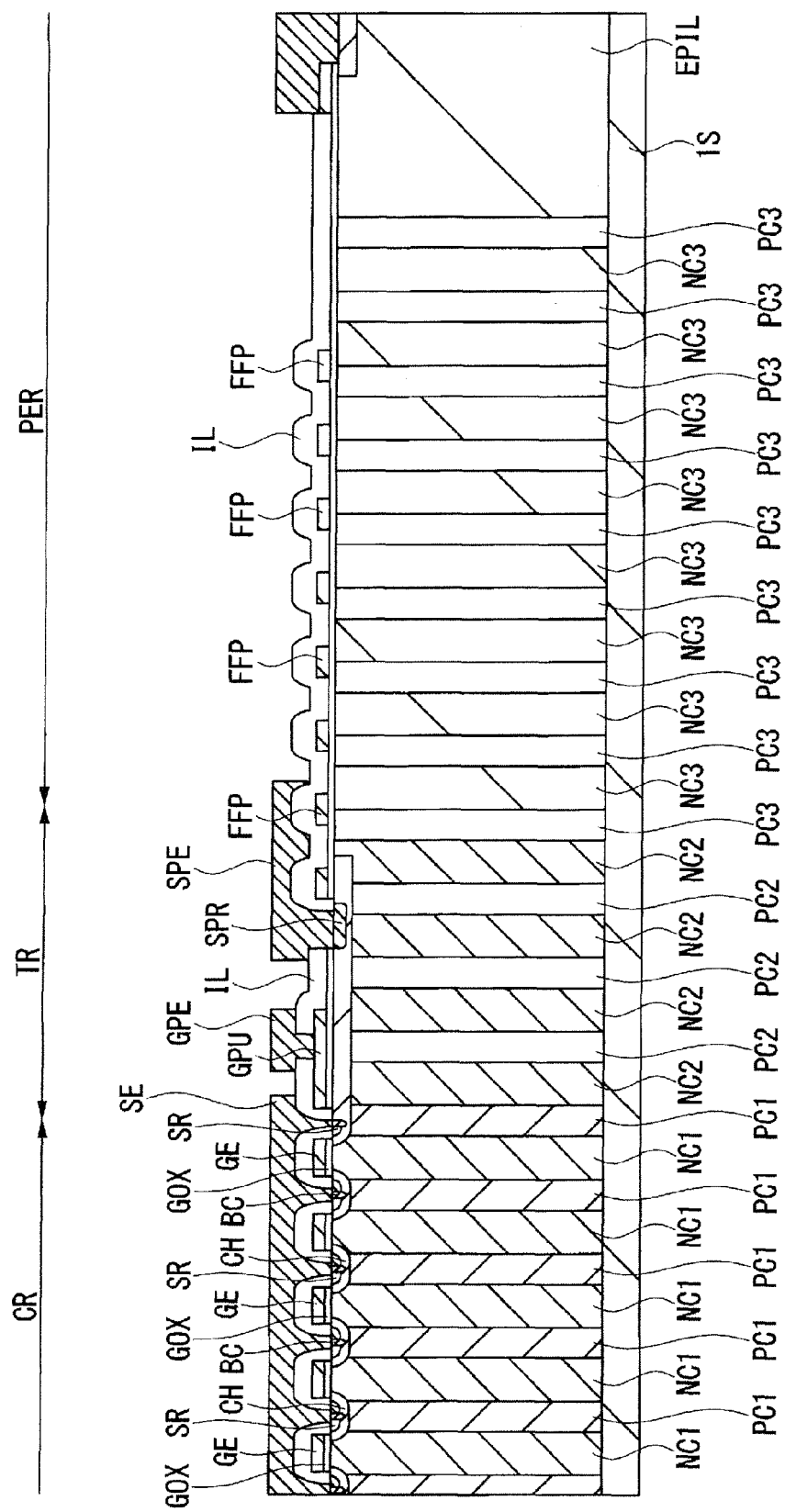
FIG. 30 is a cross-sectional view showing a manufacturing step of the semiconductor device following that of FIG. 29.

Next, as shown in FIG. 30, a metal film is formed on the interlayer insulating film IL including the opening portion exposing the source region SR therefrom, the opening portion exposing the gate lead portion GPU therefrom, and the opening portion exposing the source lead region SPR therefrom. This metal film is made of a stacked film of, for example, a titanium tungsten film and an aluminum film and is formed, for example, by sputtering.

Then, by photolithography and etching, the metal film is patterned. A source electrode SE to be electrically coupled to the source region SR and the body contact region BC is thereby formed in the cell region CR. In the transition region TR, a gate lead electrode GEP to be electrically coupled to the gate lead portion GPU and a source lead electrode SPE to be electrically coupled to the source lead region SPR are formed.

Figure 31:
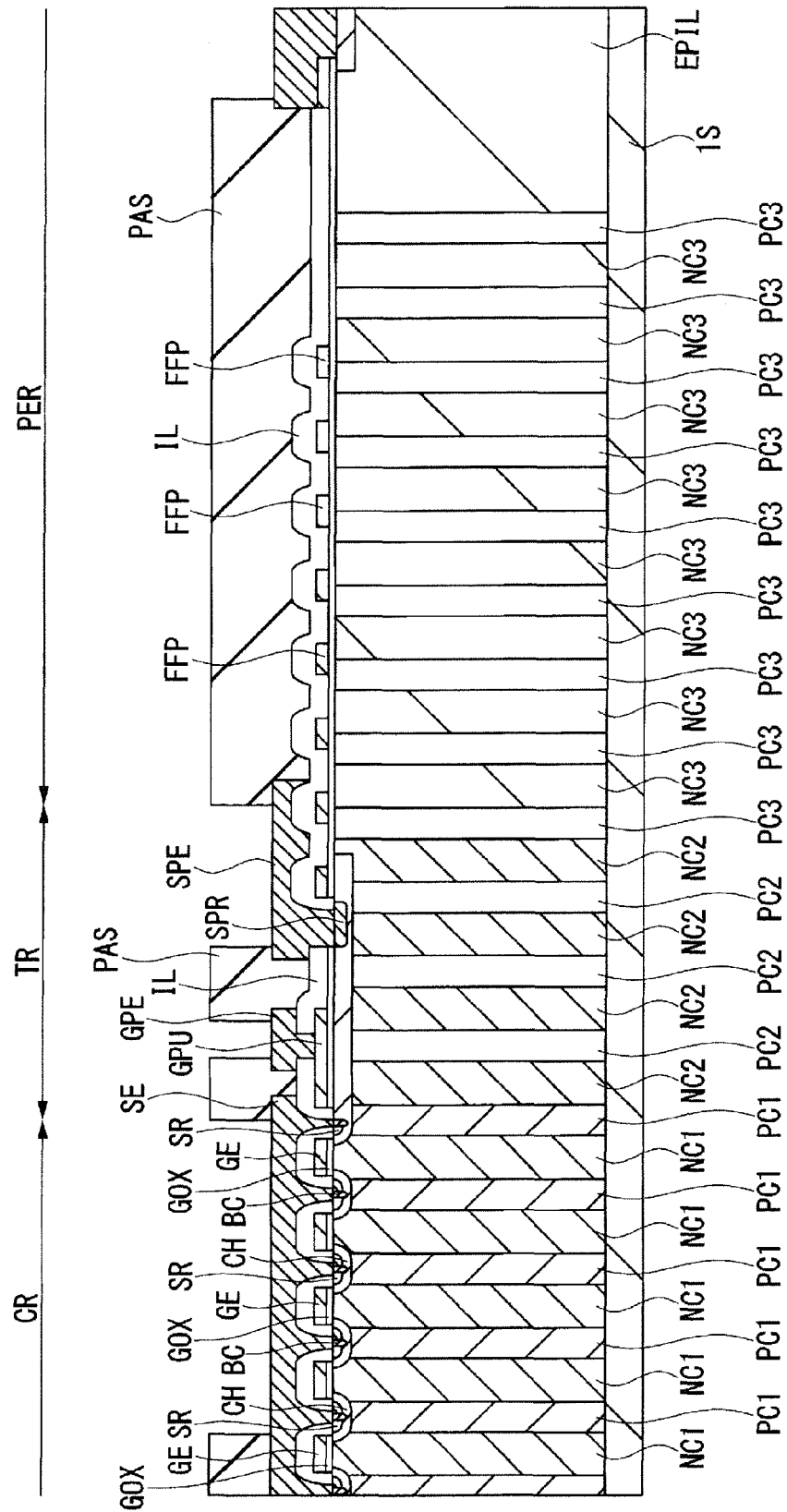
FIG. 31 is a cross-sectional view showing a manufacturing step of the semiconductor device following that of FIG. 30.

Next, as shown in FIG. 31, a surface protective film PAS is formed so as to cover the source electrode SE, the gate lead electrode GPE, and the source lead electrode SPE. By photolithography and etching, the surface protective film PAS is patterned to expose a partial region of the source electrode SE, a partial region of the gate lead electrode GPE, and a partial region of the source lead electrode SPE from the surface protective film PAS. The regions exposed from the surface protective film PAS can be functioned as an external coupling region.

Figure 32:
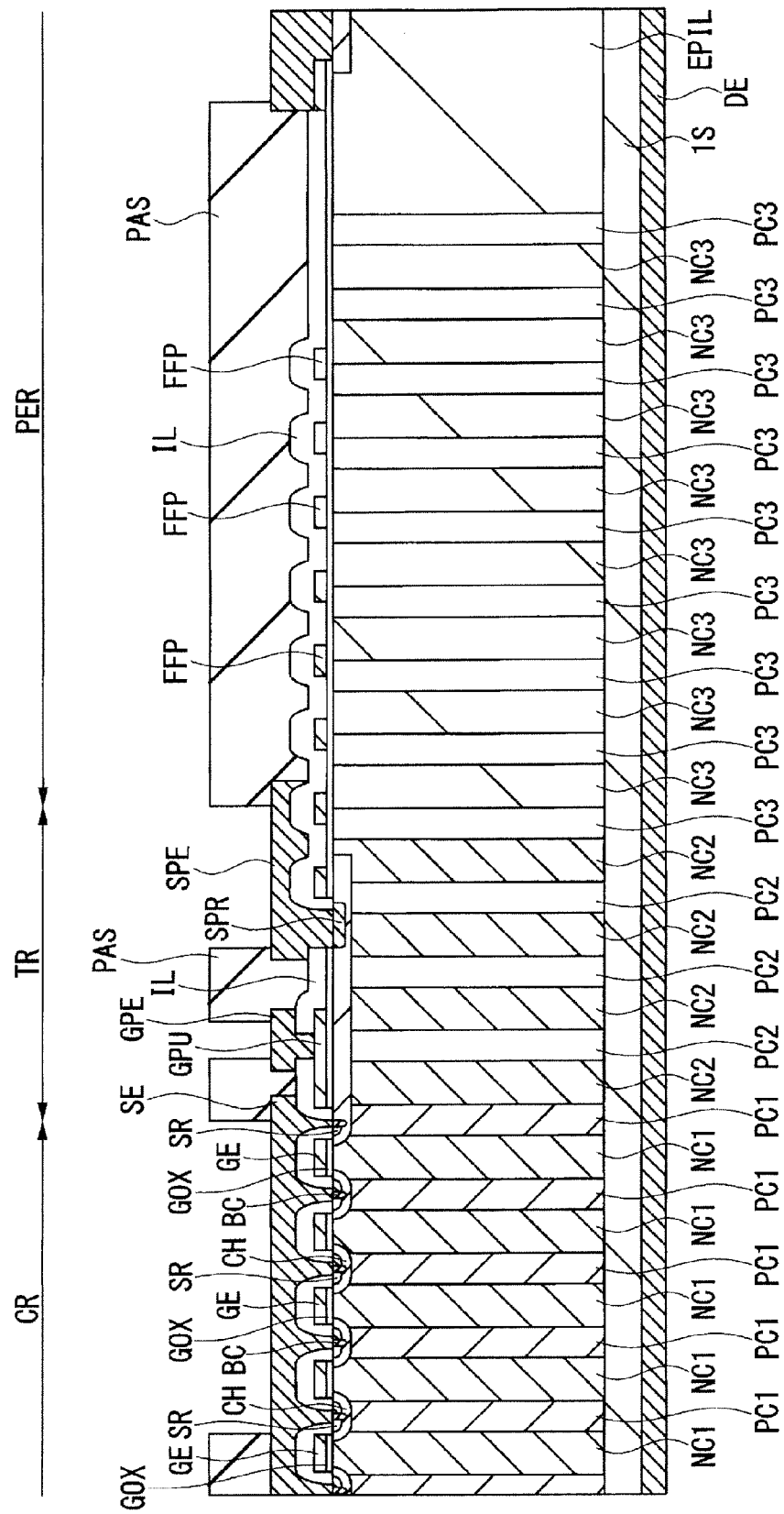
FIG. 32 is a cross-sectional view showing a manufacturing step of the semiconductor device following that of FIG. 31.

Next, as shown in FIG. 32, the semiconductor substrate 1S is polished from the back surface, that is, a surface of the semiconductor substrate 1S on the side opposite to the main surface to thin the semiconductor substrate 1S. A metal film which will be a drain electrode DE is formed by sputtering or vapor deposition on the back surface of the semiconductor substrate 1S. As described above, a semiconductor device having a power MOSFET with a superjunction structure according to Second Embodiment can be manufactured.

<Advantage of Trench Fill Method>

For example, in a superjunction structure, from the standpoint of reducing the on-resistance, narrowing a distance between the p type column regions and the n type column regions is effective, because an increase in the n type impurity concentration in the n type column regions, which are current paths, is desirable. In other words, when the n type impurity concentration of the n type column regions is increased in order to reduce the on-resistance, the extension of a depletion layer to the n type column regions becomes smaller. In order to deplete the whole n type column regions, therefore, the width of the n type column regions needs to be narrowed. It is therefore necessary to increase the n type impurity concentration of the n type column regions and reduce the on-resistance in the power MOSFET with a superjunction structure and at the same time, to narrow the distance between the p type column regions and the n type column regions in consideration of securing a breakdown voltage.

With this respect, the "multi-epitaxial method" uses ion implantation for the formation of the p type column regions. In consideration of the impurity diffusion effect, the distance between the p type column regions and the n type column regions cannot be narrowed sufficiently. In the "trench fill method", on the other hand, the p type column regions are formed by a trench fill method in which a trench formed in the epitaxial layer is filled. In the "trench fill method", the formation accuracy of the p type column regions is determined by the formation accuracy of trenches. The trenches are formed by photolithography. Since the accuracy of photolithography is higher than that of ion implantation, the "trench fill method" can form the p type column regions more accurately than the "multi-epitaxial method". This means that compared with the "multi-epitaxial method", the "trench fill method" enables narrowing of the distance between the p type column regions and the n type column regions. As a result, the "trench fill method" is superior to the "multi-epitaxial method" in that a power MOSFET having a smaller on-resistance can be manufactured. In other words, the "trench fill method" is superior to the "multi-epitaxial method" because the former method can manufacture a power MOSFET having a smaller on-resistance while securing a breakdown voltage.

The on-operation of a parasitic npn bipolar transistor can be suppressed by adding a taper angle to a trench formed in the epitaxial layer. The reason why the on-operation of a parasitic npn bipolar transistor can be suppressed will next be described referring to FIG. 33.

FIG. 33 includes a graph showing a charge balance of the breakdown voltage (BVdss) of pn junction, a schematic view showing a total electric charge distribution of a pn junction portion; and a schematic view showing a field intensity of the pn junction portion. FIG. 33A shows a field intensity and the like when the total electric charge (Qp) of the p type column regions is substantially equal to the total electric charge (Qn) of n type column regions (Qp≈Qn). FIG. 33B shows field intensity and the like when the total electric charge (Qp) of the p type column regions is larger than the total electric charge (Qn) of the n type column regions (Qp>Qn). FIG. 33C shows field intensity and the like when the total electric charge (Qp) of the p type column regions is smaller than the total electric charge (Qn) of the n type column regions (Qp<Qn).

As shown in the charge balance of FIG. 33A, when the total electric charge (Qp) of the p type column regions is substantially equal to the total electric charge (Qn) of the n type column regions (Qp≈Qn), the breakdown voltage (BVdss) of pn junction reaches the maximum value. Even when there occurs a variation of about ±10% of the total electric charge (Qp) in the total electric charge (Qp) of the p type column regions and in the total electric charge (Qn) of the n type column regions, the breakdown voltage (BVdss) of pn junction decreases only slightly.

As shown in the total electric charge distribution and field intensity in FIG. 33A, when the trench in which the p type column regions are to be formed has a taper angle and the total electric charge (Qp) of the p type column regions and the total electric charge (Qn) of the n type column regions are substantially equal to each other (Qp≈Qn), the field intensity can be allowed to reach the maximum value at an intermediate point in the depth direction of the p type column regions and the n type column regions.

As shown in the charge balance in FIG. 33B, when the total electric charge (Qp) of the p type column regions is larger than the total electric charge (Qn) of the n type column regions (Qp>Qn), the breakdown voltage (BVdss) of pn junction gradually decreases as the total electric charge (Qp) of the p type column regions exceed the total electric charge (Qn) of the n type column regions.

As shown in the total electric charge distribution and field intensity in FIG. 33B, when the trench in which the p type column regions are to be formed has a taper angle and the total electric charge (Qp) of the p type column regions is larger than the total electric charge (Qn) of the n type column regions (Qp>Qn), the field intensity reaches the maximum at a position deeper than the intermediate point in the depth direction of the p type column regions and the n type column regions. In other words, the position of the maximum field intensity when the total electric charge (Qp) of the p type column regions is larger than the total electric charge (Qn) of the n type column regions (Qp>Qn) is more distant from the upper surface of the epitaxial layer than the position of the maximum field intensity when the total electric charge (Qp) of the p type column regions is substantially equal to the total electric charge (Qn) of the n type column regions (Qp≈Qn).

An avalanche breakdown phenomenon occurs in the vicinity of this position of the maximum field intensity. Since this position of the maximum field intensity is distant from the upper surface of the epitaxial layer, an avalanche current generated here is likely to disperse in the length direction in spite of a flow to the channel region. An avalanche current density therefore decreases and the on-operation of a parasitic npn bipolar transistor using the source region as an emitter region, the channel region as a base region, and the n type column regions as a collector region can be suppressed.

On the other hand, as shown in the charge balance in FIG. 33C, when the total electric charge (Qp) of the p type column regions is smaller than the total electric charge (Qn) of the n type column regions (Qp<Qn), the breakdown voltage (BVdss) of pn junction gradually decreases as the total electric charge (Qp) of the p type column regions becomes smaller than the total electric charge (Qn) of the n type column regions.

As shown in the total electric charge distribution and field intensity in FIG. 33C, when the trench in which the p type column regions are to be formed has a taper angle and the total electric charge (Qp) of the p type column regions is smaller than the total electric charge (Qn) of the n type column regions (Qp<Qn), the field intensity reaches the maximum value at a position shallower than the intermediate point in the depth direction of the p type column regions and the n type column regions. This means that the position of the maximum field intensity when the total electric charge (Qp) of the p type column regions is smaller than the total electric charge (Qn) of the n type column regions (Qp<Qn) is more close to the upper surface of the epitaxial layer than the position of the maximum field intensity when the total electric charge (Qp) of the p type column regions is substantially equal to the total electric charge (Qn) of the n type column regions (Qp≈Qn).

An avalanche breakdown phenomenon occurs in the vicinity of this position of the maximum field intensity. Since this position of the maximum field intensity is close to the upper surface of the epitaxial layer, an avalanche current generated here flows while keeping a high avalanche current density in spite of a flow to the channel region so that the on-operation of a parasitic npn bipolar transistor using the source region as an emitter region, the channel region as a base region, and the n type column regions as a collector region is likely to occur.

In the "trench fill method", the on-operation of a parasitic npn bipolar transistor can therefore be suppressed by adding a taper angle to a trench to be formed in the epitaxial layer and making the total electric charge (Qp) of the p type column regions larger than the total electric charge (Qn) of the n type column regions (Qp>Qn).

(Third Embodiment)

In Third Embodiment, a modification example of the power MOSFET, which has a superjunction structure formed by the "multi-epitaxial method" described in First Embodiment, will be described.

As described in Second Embodiment, in the "trench fill method", the on-operation of a parasitic npn bipolar transistor can be suppressed by adding a taper angle to a trench formed in the epitaxial layer. In the "multi-epitaxial method", on the other hand, the on-operation of a parasitic npn bipolar transistor can be suppressed by providing a concentration gradient in the depth direction of the p type column regions or n type column regions and thereby placing the position of the maximum field intensity more distant from the upper surface of the epitaxial layer than the intermediate point in the depth direction.

<Constitution of Semiconductor Device>

Figure 34:
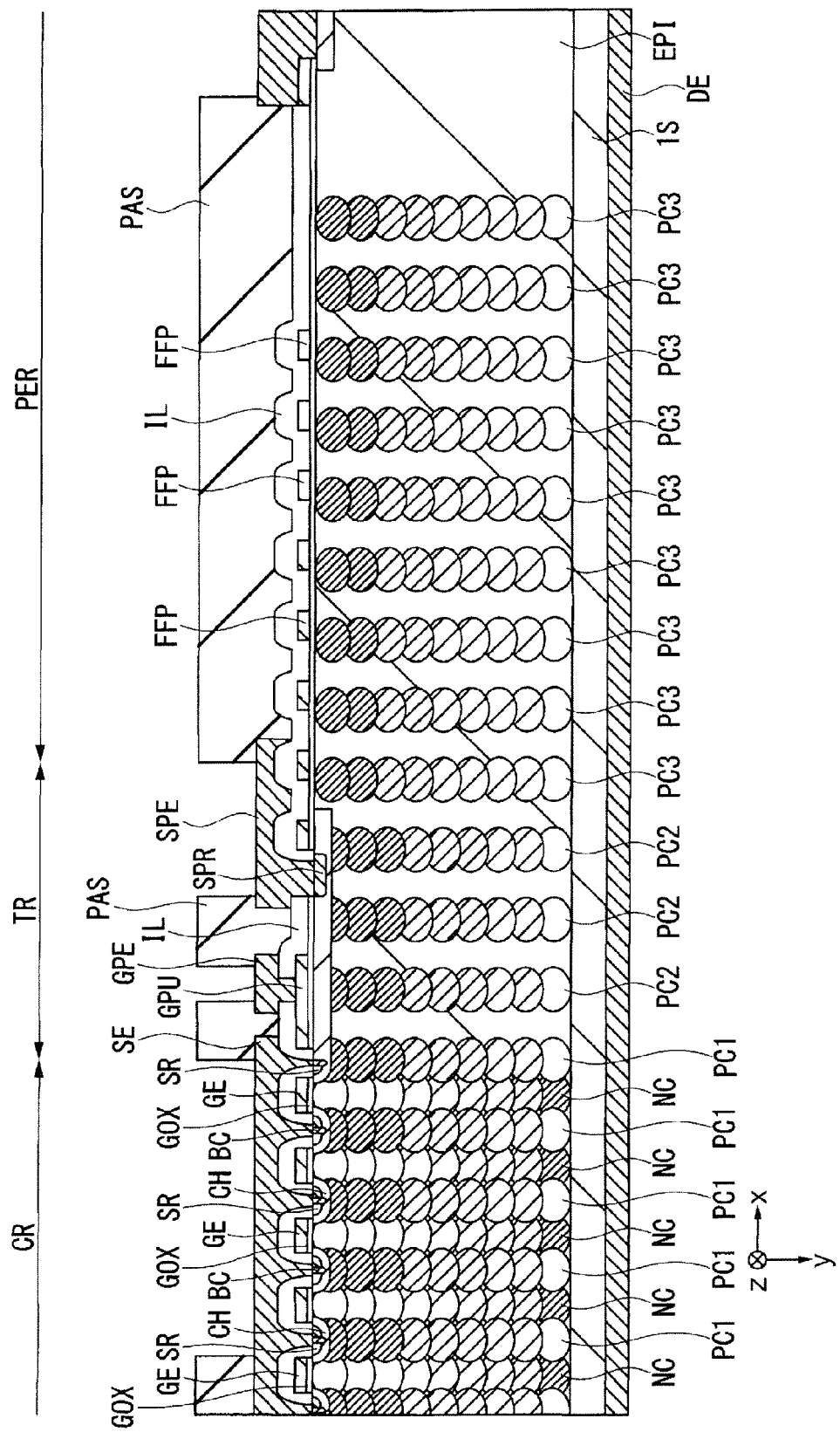
FIG. 34 is a cross-sectional view showing the constitution of a semiconductor device according to Third Embodiment.

FIG. 34 is a cross-sectional view showing the constitution of a semiconductor device (power MOSFET) according to Third Embodiment. Since the constitution of the power MOSFET according to Third Embodiment shown in FIG. 34 is substantially similar to the constitution of the power MOSFET according to First Embodiment shown in FIG. 2, a difference between them will next be described mainly.

In the semiconductor device according to Third Embodiment, a plurality of first p type column regions PC1 and a plurality of n type column regions NC formed in a cell region CR, a plurality of second p type column regions PC2 formed in a transition region TR, and a plurality of third p type column regions PC3 in a peripheral region PER are formed by the "multi-epitaxial method". In short, these column regions are formed in a substantially columnar shape extending from the lower surface to the upper surface of an epitaxial layer EPI by carrying out ion implantation a plurality of times at varied implantation energies.

In the semiconductor device according to First Embodiment, the impurity concentration of each of these column regions is made uniform in the depth direction extending from the upper surface to the lower surface of the epitaxial layer EPI. In the semiconductor device according to Third Embodiment, on the other hand, the impurity concentration of each of these column regions is made different in the depth direction extending from the upper surface to the lower surface of the epitaxial layer EPI. This concentration difference can be achieved by carrying out ion implantation at varied implantation energies and at the same time, regulating an implantation dose.

As shown in FIG. 34, in the cell region CR, the n type impurity concentration of the plurality of n type column regions NC is gradually increased and the p type impurity concentration of the plurality of first p type column regions PC1 is gradually decreased, each in the depth direction (direction y) extending from the upper surface to the lower surface of the epitaxial layer EPI. In the transition region TR, the p type impurity concentration of the plurality of second p type column regions PC2 is gradually decreased in the depth direction (direction y) extending from the upper surface to the lower surface of the epitaxial layer EPI. In the peripheral region PER, the p type impurity concentration of the plurality of third p type column regions PC3 is gradually decreased in the depth direction (direction y) extending from the upper surface to the lower surface of the epitaxial layer EPI.

FIG. 35 includes a schematic view showing, in the semiconductor device according to Third Embodiment, the total electric charge distribution of a pn junction portion and a schematic view showing a field intensity of the pn junction portion.

Figure 35C:
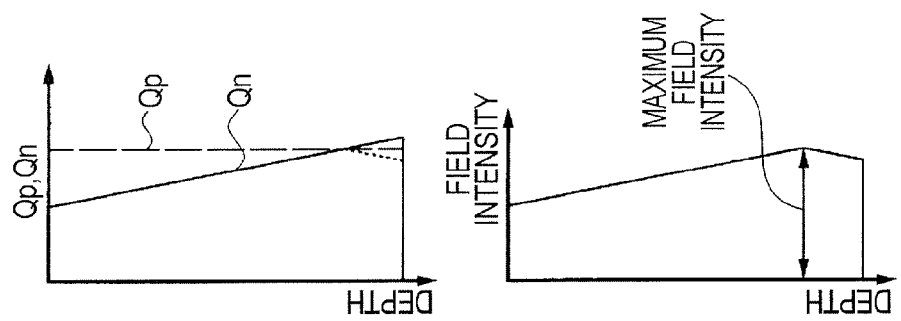
FIG. 35C is a graph showing a total electric charge distribution and field intensity when the n type impurity concentration of n type column regions gradually increases in a depth direction extending from the upper surface to the lower surface of the epitaxial layer.
Figure 35B:
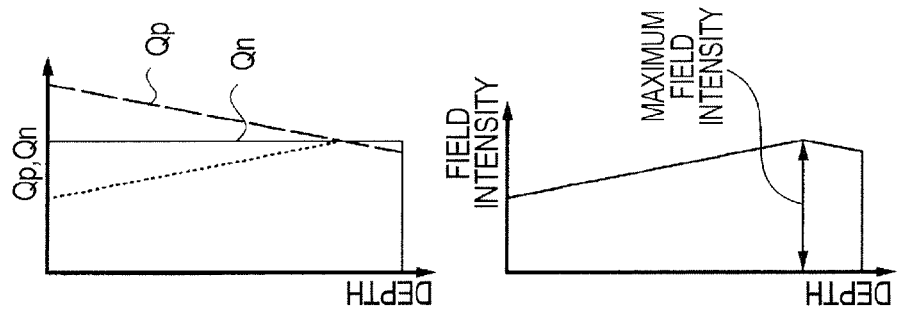
FIG. 35B is a graph showing a total electric charge distribution and field intensity when the p type impurity concentration of p type column regions gradually decreases in a depth direction extending from the upper surface to the lower surface of the epitaxial layer.
Figure 35A:
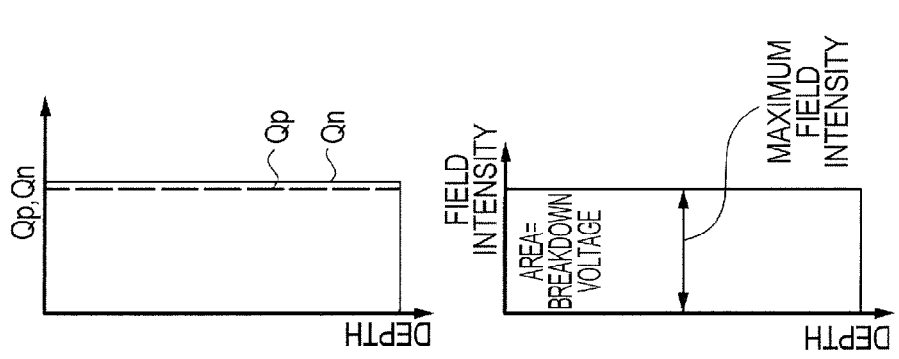
FIG. 35A is a graph showing a total electric charge distribution and field intensity when the p type impurity concentration of p type column regions and the n type impurity concentration of n type column regions are uniform in the depth direction.

FIG. 35A is a graph showing a total electric charge distribution and field intensity in the case where the p type impurity concentration of the p type column regions and the n type impurity concentration of the n type column regions are uniform in the depth direction.

In this case, the total electric charge (Qp) of the p type column regions and the total electric charge (Qn) of the n type column regions are equal to each other in the whole region in the depth direction (Qp=Qn). This means that the field intensity is uniform in the whole region in the depth direction. Occurrence positions of an avalanche breakdown phenomenon in the depth direction therefore depend on the process variation (for example, distribution of size, impurity concentration, or the like). If the field intensity reaches maximum in the vicinity of the upper surface of the epitaxial layer, the on-operation of a parasitic npn bipolar transistor occurs, which may lead to fracture of the power MOSFET.

FIG. 35B is a graph showing a total electric charge distribution and a field intensity when the n type column regions have a uniform n type impurity concentration in the depth direction and the p type impurity concentration of the p type column regions gradually decreases in the depth direction extending from the upper surface to the lower surface of the epitaxial layer.

In this case, the field intensity reaches the maximum value at a position deeper than the intermediate point in the depth direction of the p type column regions and the n type column regions. This makes it possible to increase a distance of the position of the maximum field intensity from the upper surface of the epitaxial layer and thereby suppress the on-operation of a parasitic npn bipolar transistor.

FIG. 35C is a graph showing a total electric charge distribution and field intensity when the p type column regions have a uniform p type impurity concentration in the depth direction and the n type impurity concentration of the n type column regions gradually increases in the depth direction extending from the upper surface to the lower surface of the epitaxial layer.

In this case, the field intensity reaches the maximum value at a position deeper than the intermediate point in the depth direction of the p type column regions and the n type column regions. This makes it possible to increase the distance of the position of the maximum field intensity from the upper surface of the epitaxial layer and thereby suppress the on-operation of a parasitic npn bipolar transistor.

(Fourth Embodiment)

In First Embodiment, an application example of a technical concept of making the n type impurity concentration of the n type column regions in the cell region higher than the n type impurity concentration of the epitaxial layer in the peripheral region, which is one of novel technical concepts, to a semiconductor device including a power MOSFET has been described. In Fourth Embodiment, on the other hand, an application example of the above-mentioned technical concept to a semiconductor device including IGBT (insulate gate bipolar transistor) will be described.

<Constitution of Semiconductor Device>

Figure 36:
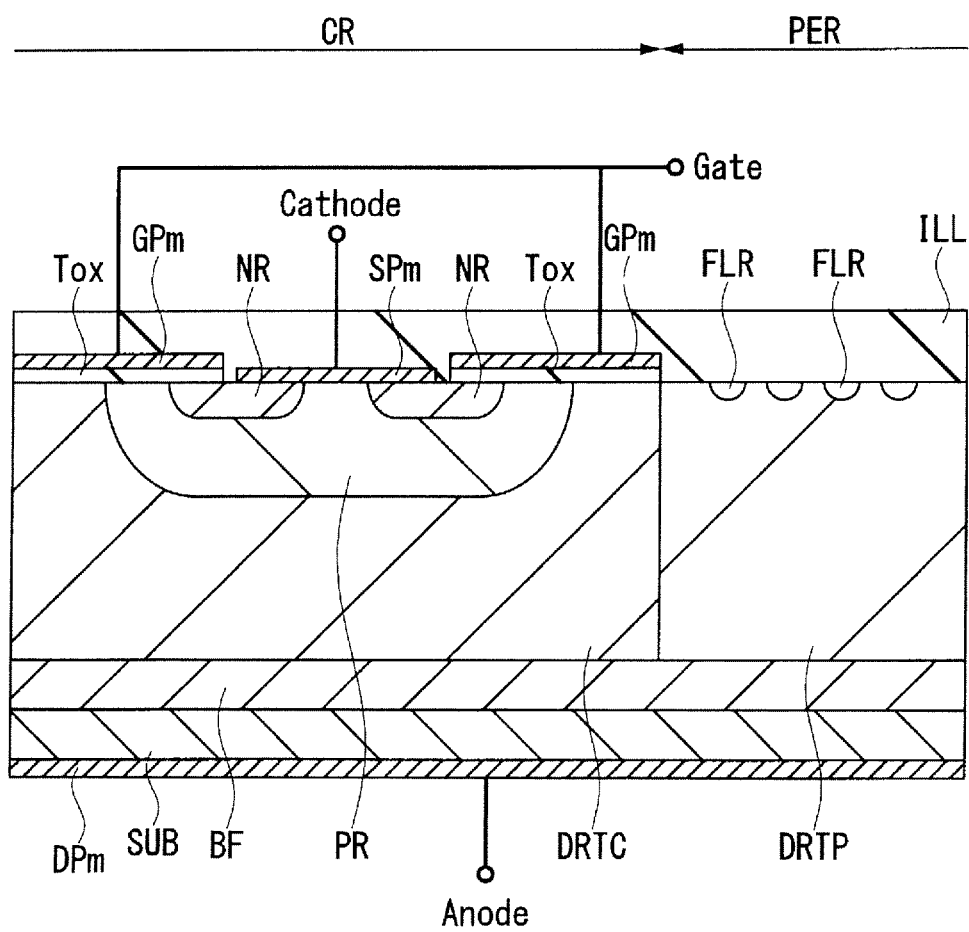
FIG. 36 is a cross-sectional view showing the constitution of a semiconductor device according to Fourth Embodiment.

FIG. 36 is a cross-sectional view showing the constitution of a semiconductor device (IGBT) according to Fourth Embodiment. The symbol "+" and "−" as used herein means a relative impurity concentration of an n conductivity type or a p conductivity type. For example, the concentration of an n type impurity is higher in the following order: "$n^-$", "n", and "$n^+$".

A $p^+$ substrate SUB made of silicon and introduced with a p type impurity has, on the main surface (surface, upper surface), an $n^+$ type buffer layer BF made of silicon and introduced with an n type impurity.

The $n^+$ type buffer layer BF has thereon an $n^+$ type drift layer DRTC and an $n^-$ type drift layer DRTP made of silicon and introduced with an n type impurity. These $n^+$ type drift layer DRTC and $n^-$ type drift layer DRTP serve to secure a breakdown voltage and have a thickness of, for example, from about 5 to 40 μm. The cell region CR has therein the $n^+$ type drift layer DRTC having a relatively high impurity concentration, while the peripheral region PER has the $n^-$ type drift layer DRTP having a relatively low impurity concentration. The n type impurity concentration of each region is set so that, for example, the n type impurity concentration of the $n^-$ type drift layer DRTP in the peripheral region PER becomes lower by from about 10 to 20% than the n type impurity concentration of the $n^+$ type drift layer DRTC in the cell region CR.

The $n^+$ type drift layer DRTC in the cell region CR has therein a p type base layer PR having a predetermined depth from the upper surface of the $n^+$ type drift layer DRTC and introduced with a p type impurity. Further, the p type base layer PR has therein an $n^+$ type source layer NR having a predetermined depth from the upper surface of the $n^+$ type drift layer DRTC, separated from the end portion of the p type base layer PR, and introduced with an n type impurity.

The n+ type source layer NR is electrically coupled to the n+ type drift layer DRTC via a channel formed in the p type base layer PR between the end portion of the p type base layer PR and the n+ type source layer NR while having a predetermined distance from the upper surface of the n+ type drift layer DRTC.

The p type base layer PR, in which the channel is formed between the end portion of the p type base layer PR and the n+ type source layer NR, has thereon a gate insulating film Tox and the gate insulating film Tox has thereon a gate electrode Gpm.

The n− type drift layer DRTP in the peripheral region PER has therein a plurality of p type field limiting rings FLR having a predetermine depth from the upper surface of the n− type drift layer DRTP and introduced with a p type impurity. The plurality of p type field limiting rings surround the cell region and they have a fixed voltage. Formation of such a plurality of p type field limiting rings FLR makes it possible to provide a semiconductor device having a high breakdown voltage, because the electric field is shared by the plurality of p type field limiting rings FLR.

Although not illustrated here, the plurality of p type field limiting rings FLR is surrounded by an n type guard ring and the voltage of it is fixed. The n type guard ring has a function of protecting an IGBT element in a semiconductor chip after a semiconductor wafer is separated into individual semiconductor chips.

Further, in the cell region CR and the peripheral region PER, the IGBT element, the p type field limiting rings FLR, and the n type guard ring are covered with an interlayer insulating film ILL. Although not illustrated here, this interlayer insulating film ILL has openings reaching the n+ type source layer NR, the gate electrode GPm, the p type field limiting rings FLR, and the like respectively. A source electrode SPm to be electrically coupled to a portion of the surface of the n+ type source layer NR and a portion of the surface of the p type base layer PR and also a drain electrode DPm to be electrically coupled to the back surface of the p+ type substrate SUB are provided.

Thus, in the semiconductor device according to Fourth Embodiment, the n type impurity concentration of the n+ type drift layer DRTC of a pn junction portion (a junction portion between the p type base layer PR and the n+ type drift layer DRTC) in the cell region CR is made higher than the n type impurity concentration of the n− type drift layer DRIP of a pn junction portion (a junction portion between the p type field limiting rings FLR and the n− type drift layer DRIP) in the peripheral region PER. As a result, then avalanche breakdown voltage in the cell region CR becomes lower than the avalanche breakdown voltage in the peripheral region PER, making it possible to cause an avalanche breakdown phenomenon in the cell region CR. It is therefore possible to cause an avalanche breakdown phenomenon in the cell region CR, which is unlikely to exceed the avalanche resistance of IGBT, before an avalanche breakdown phenomenon occurs in the peripheral region PER which is likely to exceed the avalanche resistance of IGBT. Even if a voltage exceeding a power supply voltage is applied to IGBT to cause an avalanche breakdown phenomenon, therefore, a situation leading to fracture of IGBT can be avoided. According to Fourth Embodiment, therefore, a semiconductor device including IGBT can have improved reliability.

The invention made by the present inventors has been described specifically based on some embodiments. It is needless to say that the invention is however not limited to or by these embodiments but can be changed in various ways without departing from the gist of the invention.

For example, in the above embodiments, the novel technical concept will be described using a power MOSFET or IGBT as an example of a power semiconductor element. The novel technical concept described herein can be applied not only to it, but widely to a semiconductor device including another power semiconductor, for example, diode.

The embodiment includes the following mode.

(Appendix 1)

A semiconductor device equipped with a semiconductor chip having a cell region and a peripheral region formed outside the cell region, the semiconductor chip including (a) a semiconductor substrate of a first conductivity type, (b) a buffer layer of a second conductivity type different from the first conductivity type formed on the semiconductor substrate, (c) a first drift layer of the second conductivity type formed on the buffer layer in the cell region, (d) a second drift layer of the second conductivity type formed on the buffer layer in the peripheral region, (e) a base layer of the first conductivity type formed in the first drift layer in the cell region so as to have a first distance from the upper surface of the first drift layer, (f) a source layer of the second conductivity type formed in the base layer so as to have a second distance shorter than the first distance from the upper surface of the first drift layer and be separated from the end portion of the base layer, (g) a gate insulating film formed on the base layer, and (h) a gate electrode formed on the gate insulating film, wherein the second conductivity type impurity concentration of the second drift layer in the peripheral region is lower by from 10 to 20% than the second conductivity type impurity concentration of the first drift layer in the cell region.

What is claimed is:

1. A semiconductor device equipped with a semiconductor chip having a cell region and a peripheral region formed outside the cell region, and a transition region between the cell region and the peripheral region, the semiconductor chip comprising:
   (a) a semiconductor substrate,
   (b) an epitaxial layer of a first conductivity type formed over the main surface of the semiconductor substrate,
   (c) first column regions of the first conductivity type formed in the epitaxial layer in the cell region while being separated from each other,
   (d) a plurality of second column regions of a second conductivity type, which is a conductivity type different from the first conductivity type, formed in the epitaxial layer in the cell region while being sandwiched between the first column regions adjacent to each other,
   (e) third column regions of the first conductivity type formed in the epitaxial layer in the peripheral region while being separated from each other,
   (f) a plurality of fourth column regions of the second conductivity type formed in the epitaxial layer in the peripheral region while being sandwiched between the third column regions adjacent to each other, and
   (g) an element portion formed over an upper surface of the epitaxial layer,
   (h) fifth column regions of the first conductivity type formed in the epitaxial layer in the transition region while being separated from each other, and (i) a plurality of sixth column regions of the second conductivity type formed in the epitaxial layer in the transition region while being sandwiched between the fifth column regions adjacent to each other,
   wherein a concentration of an impurity of a first conductivity type of the first column regions in the cell region is higher than a concentration of an impurity of the first conductivity type of the third column regions in the peripheral region, wherein, in the cell region, a total electric charge of the second column regions is larger than a total electric charge of the first column regions, wherein, in the peripheral region, a total electric charge of the fourth column regions is larger than a total electric charge of the third column regions, wherein, in the cell region, a concentration of an impurity of the second conductivity type in the second column regions gradually decreases in a direction extending from the upper surface to a lower surface of the epitaxial layer, wherein the concentration of the impurity of the second conductivity type in the second column regions is highest at the upper surface which is opposite the lower surface, wherein the concentration of the impurity of the first conductivity type in the first column regions is uniform from the upper surface to the lower surface, wherein a field intensity has a maximum value at a position deeper than an intermediate point in the direction from the upper surface to the lower surface of the epitaxial layer wherein a concentration of an impurity of the first conductivity type of the fifth column regions in the transition region is lower than the first conductivity type impurity concentration of the first column regions in the cell region, and wherein a concentration of an impurity of the second conductivity type of the sixth column regions in the transition region is higher than the second conductivity type impurity concentration of the fourth column regions in the peripheral region.

2. The semiconductor device according to claim 1, wherein the total electric charge of the first column regions in the cell region is larger than the total electric charge of the third column regions in the peripheral region and the total electric charge of the second column regions in the cell region is larger than the total electric charge of the fourth column regions of the peripheral region.

3. The semiconductor device according to claim 1, wherein the second column regions in the cell region each comprise a trench extending from the upper surface to the lower surface of the epitaxial layer and a semiconductor film of the second conductivity type which has filled the trench, and wherein the trench has a width gradually narrowing in a direction extending from the upper surface to the lower surface of the epitaxial layer.

4. The semiconductor device according to claim 1, wherein in the transition region, a difference between a total electric charge of the fifth column regions and a total electric charge of the sixth column regions falls within a range of ±10% of the total electric charge of the sixth column regions or the total electric charge of the sixth column regions is larger than the total electric charge of the fifth column regions.

5. The semiconductor device according to claim 4, wherein the total electric charge of the fifth column regions in the transition region is smaller than a total electric charge of the first column regions in the cell region and larger than a total electric charge of the third column regions in the peripheral region, and the total electric charge of the sixth column regions in the transition region is smaller than a total electric charge of the second column regions in the cell region and larger than a total electric charge of the fourth column regions in the peripheral region.

6. The semiconductor device according to claim 1, wherein an avalanche breakdown voltage in the cell region is lower than an avalanche breakdown voltage in the peripheral region.

7. A semiconductor device equipped with a semiconductor chip having a cell region and a peripheral region formed outside the cell region, the semiconductor chip comprising:

(a) a semiconductor substrate, (b) an epitaxial layer of a first conductivity type formed over the main surface of the semiconductor substrate, (c) first column regions of the first conductivity type formed in the epitaxial layer in the cell region while being separated from each other, (d) a plurality of second column regions of a second conductivity type, which is a conductivity type different from the first conductivity type, formed in the epitaxial layer in the cell region while being sandwiched between the first column regions adjacent to each other, (e) third column regions of the first conductivity type formed in the epitaxial layer in the peripheral region while being separated from each other, (f) a plurality of fourth column regions of the second conductivity type formed in the epitaxial layer in the peripheral region while being sandwiched between the third column regions adjacent to each other, and (g) an element portion formed over an upper surface of the epitaxial layer, wherein a concentration of an impurity of a first conductivity type of the first column regions in the cell region is higher than a concentration of an impurity of the first conductivity type of the third column regions in the peripheral region, wherein, in the cell region, a total electric charge of the second column regions is larger than a total electric charge of the first column regions, wherein, in the peripheral region, a total electric charge of the fourth column regions is larger than a total electric charge of the third column regions, wherein, in the cell region, a concentration of an impurity of the first conductivity type in the first column regions gradually increases in a direction extending from the upper surface to a lower surface of the epitaxial layer, and wherein the concentration of the impurity of the first conductivity type in the first column regions is highest at the lower surface which is opposite the upper surface, and wherein a concentration of impurity of the second conductivity type in the second column region is highest at the upper surface which is opposite the lower surface.

8. The semiconductor device according to claim 7, wherein the total electric charge of the first column regions in the cell region is larger than the total electric charge of the third column regions in the peripheral region and the total electric charge of the second column regions in the cell region is larger than the total electric charge of the fourth column regions of the peripheral region.

9. The semiconductor device according to claim 7,
wherein the second column regions in the cell region each comprise a trench extending from the upper surface to the lower surface of the epitaxial layer and a semiconductor film of the second conductivity type which has filled the trench, and
wherein the trench has a width gradually narrowing in a direction extending from the upper surface to the lower surface of the epitaxial layer.

10. The semiconductor device according to claim 7,
wherein the semiconductor chip has a transition region between the cell region and the peripheral region, and
the semiconductor chip further comprises:
(h) fifth column regions of the first conductivity type formed in the epitaxial layer in the transition region while being separated from each other, and
(i) a plurality of sixth column regions of the second conductivity type formed in the epitaxial layer in the transition region while being sandwiched between the fifth column regions adjacent to each other,
wherein a concentration of an impurity of the first conductivity type of the fifth column regions in the transition region is lower than the first conductivity type impurity concentration of the first column regions in the cell region.

11. The semiconductor device according to claim 10,
wherein in the transition region, a difference between a total electric charge of the fifth column regions and a total electric charge of the sixth column regions falls within a range of ±10% of the total electric charge of the sixth column regions or the total electric charge of the sixth column regions is larger than the total electric charge of the fifth column regions.

12. The semiconductor device according to claim 11,
wherein the total electric charge of the fifth column regions in the transition region is smaller than a total electric charge of the first column regions in the cell region and larger than a total electric charge of the third column regions in the peripheral region, and the total electric charge of the sixth column regions in the transition region is smaller than a total electric charge of the second column regions in the cell region and larger than a total electric charge of the fourth column regions in the peripheral region.

13. The semiconductor device according to claim 7,
wherein an avalanche breakdown voltage in the cell region is lower than an avalanche breakdown voltage in the peripheral region.

\* \* \* \* \*